United States Patent
Panchawagh et al.

(10) Patent No.: US 12,327,426 B2
(45) Date of Patent: Jun. 10, 2025

(54) ULTRASONIC FINGERPRINT SENSOR FOR UNDER-DISPLAY APPLICATIONS

(71) Applicant: QUALCOMM Incorporated, San Diego, CA (US)

(72) Inventors: Hrishikesh Vijaykumar Panchawagh, Cupertino, CA (US); Ila Ravindra Badge, San Jose, CA (US); Yipeng Lu, Moraga, CA (US); Kostadin Dimitrov Djordjev, Los Gatos, CA (US); Suryaprakash Ganti, Los Altos, CA (US); Chin-Jen Tseng, Fremont, CA (US); Nicholas Ian Buchan, San Jose, CA (US); Tsongming Kao, Sunnyvale, CA (US); Leonard Eugene Fennell, San Jose, CA (US); Firas Sammoura, Dublin, CA (US); Jessica Liu Strohmann, Cupertino, CA (US); David William Burns, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 18/103,060

(22) Filed: Jan. 30, 2023

(65) Prior Publication Data

US 2023/0177863 A1    Jun. 8, 2023

Related U.S. Application Data

(63) Continuation of application No. 16/006,640, filed on Jun. 12, 2018, now abandoned.
(Continued)

(51) Int. Cl.
*G06V 40/13* (2022.01)
*B06B 1/06* (2006.01)
(Continued)

(52) U.S. Cl.
CPC ........ *G06V 40/1306* (2022.01); *B06B 1/0677* (2013.01); *G01S 7/52079* (2013.01);
(Continued)

(58) Field of Classification Search
CPC ............. G01S 7/52079; G01S 15/8925; G01S 15/8913; H01L 27/3225; H01L 27/3234;
(Continued)

(56) References Cited

U.S. PATENT DOCUMENTS

| 9,323,393 B2 | 4/2016 | Djordjev et al. |
| 9,336,428 B2 | 5/2016 | Erhart |

(Continued)

FOREIGN PATENT DOCUMENTS

| CN | 105046243 A | 11/2015 |
| CN | 105094227 A | 11/2015 |

(Continued)

OTHER PUBLICATIONS

Taiwan Search Report—TW111146030—TIPO—May 24, 2023.
(Continued)

*Primary Examiner* — Daniel L Murphy
*Assistant Examiner* — Amie M Ndure
(74) *Attorney, Agent, or Firm* — QUALCOMM Incorporated

(57) ABSTRACT

Disclosed are methods, devices, apparatuses, and systems for an under-display ultrasonic fingerprint sensor. A display device may include a platen, a display underlying the platen, and an ultrasonic fingerprint sensor underlying the display, where the ultrasonic fingerprint sensor is configured to transmit and receive ultrasonic waves via an acoustic path through the platen and the display. A light-blocking layer and/or an electrical shielding layer may be provided between the ultrasonic fingerprint sensor and the display, where the light-blocking layer and/or the electrical shielding layer are
(Continued)

in the acoustic path. A mechanical stress isolation layer may be provided between the ultrasonic fingerprint sensor and the display, where the mechanical stress isolation layer is in the acoustic path.

13 Claims, 26 Drawing Sheets

Related U.S. Application Data

(60) Provisional application No. 62/525,154, filed on Jun. 26, 2017.

(51) Int. Cl.
| | | |
|---|---|---|
| *G01S 7/52* | (2006.01) | |
| *G01S 15/89* | (2006.01) | |
| *H10K 59/00* | (2023.01) | |
| *H10K 59/65* | (2023.01) | |
| *H10K 77/00* | (2023.01) | |
| *H10K 77/10* | (2023.01) | |
| *H10K 102/00* | (2023.01) | |

(52) U.S. Cl.
CPC ...... *G01S 15/8913* (2013.01); *G01S 15/8925* (2013.01); *H10K 59/00* (2023.02); *H10K 59/65* (2023.02); *H10K 77/111* (2023.02); *H10K 2102/311* (2023.02)

(58) Field of Classification Search
CPC ......... H01L 51/0097; H01L 2251/5338; H01L 27/323; H01L 2251/558; H01L 41/047; H01L 41/107; G06V 40/1306; G06V 10/17; B06B 1/0677; G06F 3/0412; G06F 21/32; Y02P 70/50; Y02E 10/549; G01N 29/22; G01N 29/2437; G02F 1/13338
See application file for complete search history.

(56) References Cited

U.S. PATENT DOCUMENTS

| | | | |
|---|---|---|---|
| 9,955,325 B2 | 4/2018 | Chrisikos et al. | |
| 9,984,270 B2 | 5/2018 | Yousefpor et al. | |
| 10,036,734 B2 | 7/2018 | Fennell et al. | |
| 10,139,479 B2 | 11/2018 | Lu et al. | |
| 10,478,858 B2 | 11/2019 | Lasiter et al. | |
| 10,891,458 B2 | 1/2021 | Seo et al. | |
| 10,929,636 B2 | 2/2021 | Lu et al. | |
| 11,126,814 B2 | 9/2021 | Lu et al. | |
| 2005/0105784 A1 | 5/2005 | Nam | |
| 2005/0183882 A1 | 8/2005 | Yun et al. | |
| 2007/0272020 A1* | 11/2007 | Schneider | G01N 29/06 73/628 |
| 2008/0224567 A1 | 9/2008 | Sugiura et al. | |
| 2010/0213607 A1 | 8/2010 | Smeys et al. | |
| 2011/0215150 A1* | 9/2011 | Schneider | G06V 40/1306 235/439 |
| 2011/0222336 A1 | 9/2011 | Kato | |
| 2012/0206585 A1 | 8/2012 | Schneider et al. | |
| 2014/0352440 A1* | 12/2014 | Fennell | H10N 30/03 29/25.35 |
| 2014/0355376 A1 | 12/2014 | Schneider et al. | |
| 2015/0016223 A1 | 1/2015 | Dickinson et al. | |
| 2015/0169136 A1* | 6/2015 | Ganti | G06F 3/0436 345/177 |
| 2015/0198699 A1 | 7/2015 | Kuo et al. | |
| 2015/0345987 A1 | 12/2015 | Hajati | |
| 2016/0042217 A1 | 2/2016 | Kim et al. | |
| 2016/0246396 A1 | 8/2016 | Dickinson et al. | |
| 2017/0061190 A1 | 3/2017 | Chen et al. | |
| 2017/0090028 A1 | 3/2017 | Djordjev et al. | |
| 2017/0110504 A1 | 4/2017 | Panchawagh et al. | |
| 2017/0124372 A1 | 5/2017 | Evans, V et al. | |
| 2017/0262692 A1* | 9/2017 | Ghavanini | G06V 40/1365 |
| 2017/0323131 A1 | 11/2017 | Lu et al. | |
| 2017/0323132 A1 | 11/2017 | Lu et al. | |
| 2017/0323133 A1 | 11/2017 | Tsai | |
| 2017/0364726 A1* | 12/2017 | Buchan | H10N 30/87 |
| 2017/0367679 A1 | 12/2017 | Wang | |
| 2018/0039471 A1 | 2/2018 | Yanagisawa et al. | |
| 2018/0068146 A1 | 3/2018 | Bai | |
| 2018/0109242 A1 | 4/2018 | Solal et al. | |
| 2018/0196982 A1 | 7/2018 | Panchawagh et al. | |
| 2018/0268187 A1 | 9/2018 | Jeong et al. | |
| 2018/0276443 A1 | 9/2018 | Strohmann et al. | |
| 2018/0326456 A1 | 11/2018 | Park et al. | |
| 2018/0373913 A1 | 12/2018 | Panchawagh et al. | |
| 2019/0205603 A1 | 7/2019 | Lee et al. | |
| 2020/0074134 A1 | 3/2020 | Lim et al. | |
| 2020/0125815 A1 | 4/2020 | Lu et al. | |
| 2020/0134280 A1 | 4/2020 | Apte et al. | |
| 2020/0234021 A1 | 7/2020 | Lu et al. | |
| 2020/0279087 A1 | 9/2020 | Seo et al. | |

FOREIGN PATENT DOCUMENTS

| | | | | |
|---|---|---|---|---|
| CN | 105335694 A | 2/2016 | | |
| CN | 205281517 U | 6/2016 | | |
| CN | 106203023 A | 12/2016 | | |
| CN | 207182312 U | 4/2018 | | |
| CN | 207264404 U | 4/2018 | | |
| JP | 2012088599 A | 5/2012 | | |
| KR | 20170057133 A | * | 5/2017 | ......... G02F 1/13338 |
| TW | 201501001 A | 1/2015 | | |
| TW | 201510555 A | 3/2015 | | |
| TW | 201709012 A | 3/2017 | | |
| TW | 201802723 A | 1/2018 | | |
| TW | 201820091 A | 6/2018 | | |
| WO | 2014197333 A1 | 12/2014 | | |
| WO | 2014197504 | 12/2014 | | |
| WO | 2016007250 A1 | 1/2016 | | |
| WO | 2016061406 A1 | 4/2016 | | |
| WO | 2017192238 A1 | 11/2017 | | |
| WO | 2017218228 A1 | 12/2017 | | |
| WO | 2020081182 A1 | 4/2020 | | |

OTHER PUBLICATIONS

Taiwan Search Report—TW108135992—TIPO—Feb. 15, 2023.
International Search Report and Written Opinion—PCT/US2018/037581—ISA/EPO—Sep. 21, 2018.
International Preliminary Report on Patentability—PCT/US2018/037581, The International Bureau of WIPO—Geneva, Switzerland, Jan. 9, 2020.
International Search Report and Written Opinion—PCT/US2019/051672—ISA/EPO—Dec. 13, 2019.
International Search Report and Written Opinion—PCT/US2020/013703—ISA/EPO—Jun. 26, 2020.
Partial International Search Report—PCT/US2020/013703—ISA/EPO—Mar. 27, 2020.
Taiwan Search Report—TW107121689—TIPO—Mar. 18, 2022.
U.S. Final Office Action dated Aug. 24, 2020, in U.S. Appl. No. 16/289,394.
U.S. Final Office Action dated Jul. 30, 2020, in U.S. Appl. No. 16/252,408.
U.S. Notice of Allowance dated Nov. 10, 2020, in U.S. Appl. No. 16/252,408.
U.S. Notice of Allowance dated Nov. 4, 2020, in U.S. Appl. No. 16/289,394.
U.S. Office Action dated Jun. 4, 2020, in U.S. Appl. No. 16/289,394.
U.S. Office Action dated May 14, 2020, in U.S. Appl. No. 16/252,408.
Dimitrov P., "Meet the First Smartphone with On-screen Fingerprint Scanner . . . Oh, It Also Packs 3 Cameras at the Back", PhoneArena, Updated on Aug. 2, 2017, pp. 1-22.
Lu Y., et al., "Ultrasonic Fingerprint Sensor Using a Piezoelectric Micromachined Ultrasonic Transducer Array Integrated with Comple-

(56) References Cited

OTHER PUBLICATIONS mentary Metal Oxide Semiconductor Electronics", Applied Physics Letters, Jun. 29, 2015, 6 Pages.

\* cited by examiner

ULTRASONIC FINGERPRINT SENSOR FOR UNDER-DISPLAY APPLICATIONS

PRIORITY CLAIM

This application is a continuation of U.S. patent application Ser. No. 16/006,640, filed on Jun. 12, 2018, and entitled "ULTRASONIC FINGERPRINT SENSOR FOR UNDER-OLED DISPLAY APPLICATIONS," which claims priority to U.S. Provisional Patent Application No. 62/525,154, filed Jun. 26, 2017, and entitled "ULTRASONIC FINGERPRINT SENSOR FOR UNDER-OLED DISPLAY APPLICATIONS," which is hereby incorporated by reference in its entirety and for all purposes.

TECHNICAL FIELD

This disclosure relates generally to ultrasonic fingerprint sensor systems and more particularly to ultrasonic fingerprint sensor systems incorporated under display applications.

DESCRIPTION OF RELATED TECHNOLOGY

In an ultrasonic sensor system, an ultrasonic transmitter may be used to send an ultrasonic wave through an ultrasonically transmissive medium or media and towards an object to be detected. The transmitter may be operatively coupled with an ultrasonic sensor configured to detect portions of the ultrasonic wave that are reflected from the object. For example, in ultrasonic fingerprint imagers, an ultrasonic pulse may be produced by starting and stopping the transmitter during a very short interval of time. At each material interface encountered by the ultrasonic pulse, a portion of the ultrasonic pulse is reflected.

For example, in the context of an ultrasonic fingerprint imager, the ultrasonic wave may travel through a platen on which a person's finger may be placed to obtain a fingerprint image. After passing through the platen, some portions of the ultrasonic wave encounter skin that is in contact with the platen, e.g., fingerprint ridges, while other portions of the ultrasonic wave encounter air, e.g., valleys between adjacent ridges of a fingerprint, and may be reflected with different intensities back towards the ultrasonic sensor. The reflected signals associated with the finger may be processed and converted to a digital value representing the signal strength of the reflected signal. When multiple such reflected signals are collected over a distributed area, the digital values of such signals may be used to produce a graphical display of the signal strength over the distributed area, for example by converting the digital values to an image, thereby producing an image of the fingerprint. Thus, an ultrasonic sensor system may be used as a fingerprint imager or other type of biometric scanner. In some implementations, the detected signal strength may be mapped into a contour map of the finger that is representative of the depth of the ridge structure detail.

Ultrasonic sensor systems can be incorporated in display devices as fingerprint sensor systems to authenticate a user. Advances in display devices have resulted in flexible displays, three-dimensional cover glasses, and bezel-less designs. Consequently, more and more display devices have limited space to incorporate a discrete button for a fingerprint sensor system or an under-glass fingerprint sensor system that is positioned peripherally to the display of the display device. An under-glass and under-display fingerprint sensor system may provide additional functionality and space to the display device and may open up additional authentication software applications for improved user interfaces.

SUMMARY

The devices, systems, and methods of this disclosure each have several aspects, no single one of which is solely responsible for the desirable attributes disclosed herein.

One aspect of the subject matter of this disclosure can be implemented in an apparatus. The apparatus includes a display, an ultrasonic sensor system underlying the display and configured to transmit and receive ultrasonic waves in an acoustic path through the display, a light-blocking layer between the ultrasonic sensor system and the display, the light-blocking layer positioned in the acoustic path, and an adhesive layer between the display and the ultrasonic sensor system. The adhesive layer is positioned in the acoustic path and configured to allow the ultrasonic sensor system to be separated from the display.

In some implementations, the apparatus further includes an electrical shielding layer between the ultrasonic sensor system and the display, the electrical shielding layer being electrically conductive and grounded, the electrical shielding layer positioned in the acoustic path. Each of the electrical shielding layer and the light-blocking layer may be non-porous or substantially non-porous. In some implementations, the display is an organic light-emitting diode (OLED) display. In some implementations, the display is a flexible OLED display formed on a plastic substrate. In some implementations, the adhesive layer includes an epoxy-based adhesive, the epoxy-based adhesive including a thermoplastic ink. In some implementations, the apparatus further includes a mechanical stress isolation layer between the adhesive layer and the ultrasonic sensor system, where the mechanical stress isolation layer includes a plastic material. In some implementations, the ultrasonic sensor system includes a sensor substrate having a plurality of sensor pixel circuits disposed thereon, a piezoelectric transceiver layer coupled to the sensor substrate and including a piezoelectric material configured to generate the ultrasonic waves, and an electrode layer coupled to the piezoelectric transceiver layer. In some implementations, the piezoelectric transceiver layer includes polyvinylidene fluoride (PVDF), polyvinylidene fluoride trifluoroethylene (PVDF-TrFE) copolymer, lead zirconate titanate (PZT), aluminum nitride (AlN), or composites thereof. In some implementations, the sensor substrate comprises a material selected from the group consisting of: glass, plastic, silicon, and stainless steel.

Another innovative aspect of the subject matter described in this disclosure can be implemented in an apparatus. The apparatus includes a display, an ultrasonic sensor system underlying the display and configured to transmit and receiving ultrasonic waves in an acoustic path through the display, and an adhesive layer between the ultrasonic sensor system and the display, the adhesive layer positioned in the acoustic path.

In some implementations, the apparatus further includes a mechanical stress isolation layer between the adhesive layer and the ultrasonic sensor system, the mechanical stress isolation layer including a plastic material and positioned in the acoustic path. In some implementations, the ultrasonic sensor system spans across an entirety or substantial entirety of an active area of the display. In some implementations, the display is an organic light-emitting diode (OLED) display. In some implementations, the adhesive layer is reworkable and configured to allow the ultrasonic sensor system to be separated from the display, the adhesive layer including a pressure-sensitive adhesive or an epoxy-based adhesive. In some implementations, the apparatus further includes a light-blocking layer between the adhesive layer and the display, the light-blocking layer positioned in the acoustic path, and an electrical shielding layer between the adhesive layer and the display, the electrical shielding layer being electrically conductive and grounded, the electrical shielding layer positioned in the acoustic path, where each of the light-blocking layer and the electrical shielding layer is non-porous or substantially non-porous.

Another innovative aspect of the subject matter described in this disclosure can be implemented in an apparatus. The apparatus includes a display, an ultrasonic sensor system underlying the display and configured to transmit and receiving ultrasonic waves in an acoustic path through the display, and a multi-functional film between the ultrasonic sensor system and the display, where the multi-functional film includes a light-blocking layer, an electrical shielding layer, an adhesive layer, a mechanical stress isolation layer, or combinations thereof, the multi-functional film positioned in the acoustic path.

Another innovative aspect of the subject matter described in this disclosure can be implemented in a method of manufacturing an apparatus. The method includes providing a display device, wherein the display device includes a platen and a display underlying the platen, bonding a light-blocking layer, an electrical shielding layer, a mechanical stress isolation layer, or combinations thereof to the display, where the electrically shielding layer is electrically conductive and grounded, and bonding an ultrasonic sensor system to the light-blocking layer, the electrical shielding layer, the mechanical stress isolation layer, or combinations thereof, where the ultrasonic sensor system is underlying the display and configured to transmit and receive ultrasonic waves in an acoustic path through the display and the platen, where the light-blocking layer, the electrical shielding layer, the mechanical stress isolation layer, or combinations thereof are in the acoustic path.

In some implementations, bonding the light-blocking layer, the electrical shielding layer, the mechanical stress isolation layer, or combinations thereof include laminating the light-blocking layer, the electrical shielding layer, the mechanical stress isolation layer, or combinations thereof to the display. In some implementations, the method further includes bonding an adhesive layer to the display to allow at least the ultrasonic sensor system to be separated from the display, wherein the adhesive layer is positioned in the acoustic path.

Another innovative aspect of the subject matter described in this disclosure can be implemented in an apparatus. The apparatus includes a display, and an ultrasonic sensor system underlying the display and configured to transmit and receive ultrasonic waves in an acoustic path through the display. The ultrasonic sensor system includes a flexible substrate including a plurality of sensor pixel circuits disposed thereon, and a piezoelectric transceiver layer coupled to the flexible substrate and including a piezoelectric material configured to generate the ultrasonic waves. The apparatus further includes a first high acoustic impedance layer between the piezoelectric transceiver layer and the display.

In some implementations, the first high acoustic impedance layer includes a one or both of a light-blocking layer and an electrical shielding layer. In some implementations, the first high acoustic impedance layer includes an electrode layer adjacent to the piezoelectric transceiver layer. In some implementations, the high acoustic impedance value layer has an acoustic impedance value greater than about 5.0 MRayls. The apparatus further includes an adhesive layer between the display and the ultrasonic sensor system, the adhesive layer positioned in the acoustic path and configured to allow the ultrasonic sensor system to be separated from the display. In some implementations, the flexible substrate includes polyethylene terephthalate (PET), polyethylene naphthalate (PEN), a polyimide, stainless steel foil, thin film silicon, or other flexible material. In some implementations, the apparatus further includes a second high acoustic impedance layer on a back side of the ultrasonic sensor system.

BRIEF DESCRIPTION OF THE DRAWINGS

Details of one or more implementations of the subject matter described in this specification are set forth in the accompanying drawings and the description below. Other features, aspects, and advantages will become apparent from the description, drawings and claims. Note that the relative dimensions of the following figures may not be drawn to scale.

Like reference numbers and designations in the various drawings indicate like elements.

DETAILED DESCRIPTION

Figure 1:
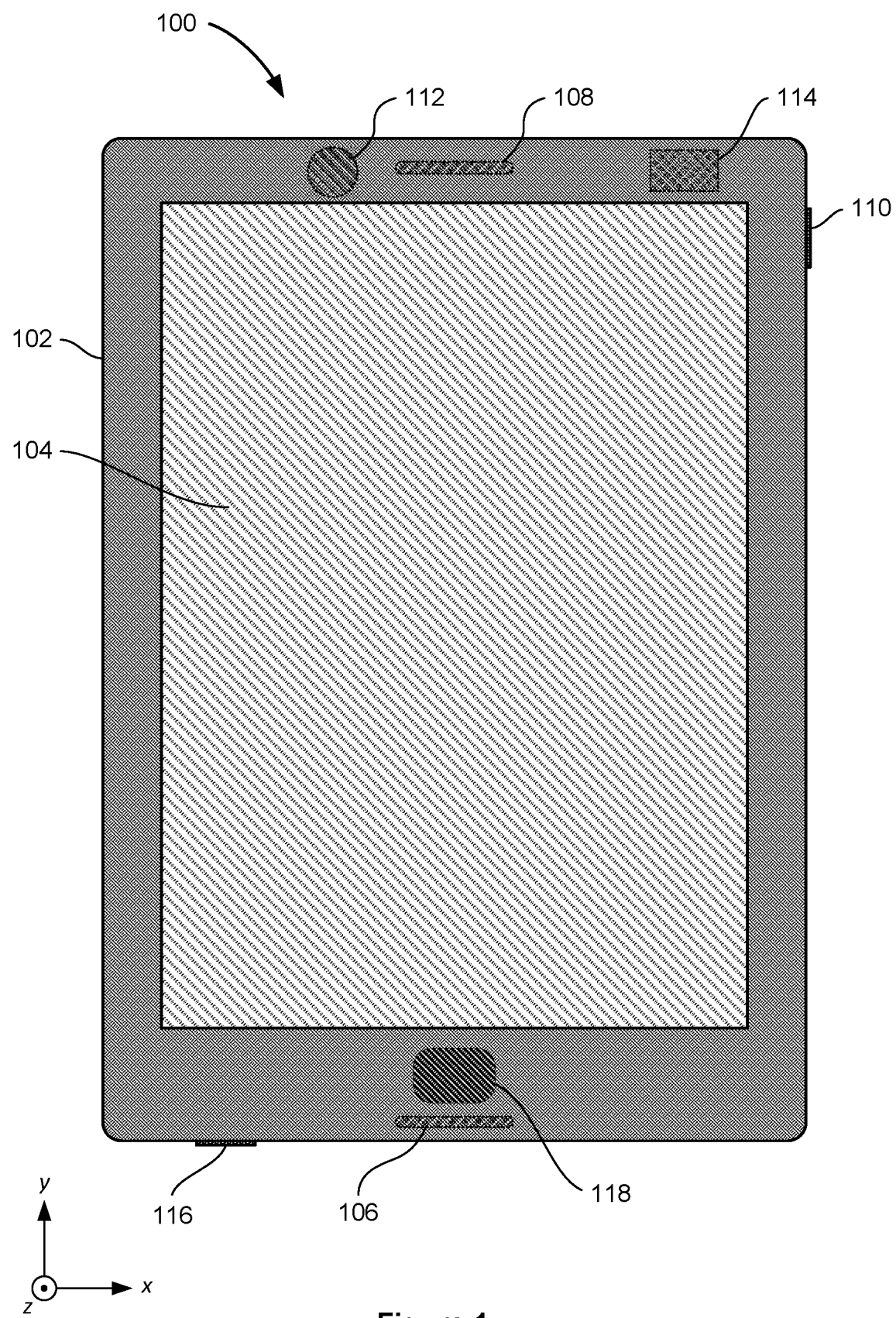
FIG. 1 shows a front view of a diagrammatic representation of an example mobile device that includes an ultrasonic sensing system according to some implementations.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, apparatus, or system that includes a biometric system as disclosed herein for ultrasonic sensing. In addition, it is contemplated that the described implementations may be included in or associated with a variety of electronic devices such as, but not limited to: mobile telephones, multimedia Internet enabled cellular telephones, mobile television receivers, wireless devices, smartphones, smart cards, wearable devices such as bracelets, armbands, wristbands, rings, headbands and patches, etc., Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (e.g., e-readers), mobile health devices, computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, automatic teller machines (ATMs), parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also can be used in applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

An under-display fingerprint sensor system may be provided in a display device or apparatus. Many high-end displays use organic light-emitting diode (OLED) displays or active matrix organic light-emitting diode (AMOLED) displays. Some displays of the present disclosure may be provided in plastic organic light-emitting diode (pOLED) displays, which may also be referred to as flexible OLED displays. Capacitive-based fingerprint sensors may require electromagnetic signals that can interfere with the electrical functions of the display. Signals generated or transferred within the display along with associated conductive traces may reduce capacitive fingerprint-sensing capability. Optical-based fingerprint systems may be limited or rendered useless where display devices include a light-blocking layer or a large number of metal traces. An ultrasonic-based fingerprint sensor may be incorporated in a display device under a display. The ultrasonic-based fingerprint sensor may be incorporated under the display of a display device with a light-blocking layer and without interfering with the electrical functions of the display device.

The configurations and techniques for ultrasonic fingerprint sensor systems described herein may be suitable for used with flexible displays, curved displays, curved cover glass, and emerging 2.5D or three-dimensional displays. The ultrasonic imaging of fingerprints is largely unaffected by small features in OLED displays and other display types such as pixels or the touchscreen electrodes. As the ultrasonic and electrical domains are intrinsically different, crosstalk between electro-optical and electro-acoustic domains is reduced. Crosstalk and undesirable interactions between the ultrasonic fingerprint sensor system and other portions of the display is further reduced or minimized in part due to use of the light-blocking, electromagnetic interference (EMI) reducing, electrical shielding, stress isolating, heat sinking and heat-spreading layers that are described below.

The ultrasonic-based fingerprint sensor is configured to transmit and receive ultrasonic waves in an acoustic path through a display of a display device. At least one of a light-blocking layer and an electrical shielding layer may be positioned between the ultrasonic-based fingerprint sensor and the display, where the light-blocking layer and the electrical shielding layer can be in the acoustic path. In some implementations, each of the light-blocking layer and the electrical shielding layer is substantially non-porous. In some implementations, a mechanical stress isolation layer may be positioned between the ultrasonic-based fingerprint sensor and the display. Specifically, the mechanical stress isolation layer may include a plastic material and the mechanical stress isolation layer may be positioned between an adhesive layer underlying the display and the ultrasonic-based fingerprint sensor. In some implementations, the ultrasonic-based fingerprint sensor may include a piezoelectric layer and an array of pixel circuits disposed on a flexible substrate, where a high acoustic impedance layer is disposed between the piezoelectric layer and the display. In some implementations, an additional high acoustic impedance layer may be disposed between the piezoelectric layer and a surface opposite the display, where the additional high acoustic impedance layer is not in the acoustic path. In some implementations, a low acoustic impedance layer is disposed between the piezoelectric layer and the display to create an impedance mismatch. High or low acoustic impedance layers create acoustic impedance mismatches to reflect more acoustic energy at interfaces between the high and low acoustic impedance layers. In some implementations, the ultrasonic-based fingerprint sensor may include a porous foam backing layer underlying the piezoelectric layer. In some implementations related to flexible or bendable displays, the ultrasonic-based fingerprint sensor may include a piezoelectric layer and an array of pixel circuits disposed on a flexible plastic substrate, where the flexible plastic substrate is attached to and extends edge-to-edge with the flexible display.

Particular implementations of the subject matter described in this disclosure may be implemented to realize one or more of the following potential advantages. An under-display fingerprint sensor increases the functionality of the active display area of a display device. Furthermore, an under-display fingerprint sensor may reduce form factor and may be incorporated in bezel-less display devices. Under-display configurations allow larger sensor active areas for improved performance, more flexibility in sensor placement, and a better user experience. A light-blocking layer may serve a mechanical function in the display device by providing mechanical stress isolation and may serve an optical function by providing a non-reflective absorbing layer so that visible light does not penetrate through. Ultrasonic fingerprint sensor systems may transmit and receive ultrasonic waves through light-blocking layers. An electrical shielding layer may serve an electrical function by providing an electrical or electromagnetic barrier or an EMI shield from other electrical components and reduce electromagnetic interference. The electrical shielding layer may serve a thermal function by providing heat dissipation and improving temperature uniformity at the back of the display. Ultrasonic fingerprint sensor systems may transmit and receive ultrasonic waves through an electrical shielding layer. The light-blocking layer and electrical shielding layer may reduce the amount of "noise" received by the ultrasonic fingerprint sensor system. Attaching, laminating or otherwise bonding an ultrasonic fingerprint sensor system to a display may result in mechanical stresses that can adversely affect display appearance and performance. However, a mechanical stress isolation layer positioned between the ultrasonic fingerprint sensor and the display may eliminate or otherwise reduce such stresses. In addition, the mechanical stress isolation layer may provide an area for a housing and/or edge seal to mechanically protect the ultrasonic fingerprint sensor from physical and/or environmental influences. A detachable (e.g., peelable) adhesive layer on the mechanical stress isolation layer and underlying the display may allow easier separation of the ultrasonic sensor from the display for ease of replacement and/or refurbishment. The ultrasonic fingerprint sensor may be implemented as a flexible sensor and incorporated in flexible electronics, three-dimensional displays, and curved displays for additional functionality. The ultrasonic fingerprint sensor system may be implemented globally across a display area of a display device and not just locally, which allows for continuous user authentication and for authentication and verification of a finger anywhere on the display. Moreover, the ultrasonic fingerprint sensor may include selected low and high acoustic impedance layers to reduce reflections of ultrasonic waves along the acoustic path for improved performance. A porous foam backing layer at the back of the display may provide a mechanical cushion or support and increase acoustic reflections at the backing layer interface for improved fingerprint imaging.

FIG. 1 shows a diagrammatic representation of an example mobile device 100 that includes an ultrasonic sensing system according to some implementations. The mobile device 100 may be representative of, for example, various portable computing devices such as cellular phones, smartphones, smart watches, multimedia devices, personal gaming devices, tablet computers and laptop computers, among other types of portable computing devices. However, various implementations described herein are not limited in application to portable computing devices. Indeed, various techniques and principles disclosed herein may be applied in traditionally non-portable devices and systems, such as in computer monitors, television displays, kiosks, vehicle navigation devices and audio systems, among other applications. Additionally, various implementations described herein are not limited in application to devices that include displays.

The mobile device 100 generally includes an enclosure (also referred to as a "housing" or a "case") 102 within which various circuits, sensors and other electrical components reside. In the illustrated example implementation, the mobile device 100 also includes a touchscreen display (also referred to herein as a "touch-sensitive display") 104. The touchscreen display 104 generally includes a display and a touchscreen arranged over or otherwise incorporated into or integrated with the display. The display 104 may generally be representative of any of a variety of suitable display types that employ any of a variety of suitable display technologies. For example, the display 104 may be a digital micro-shutter (DMS)-based display, a light-emitting diode (LED) display, an organic LED (OLED) display, a liquid crystal display (LCD), an LCD display that uses LEDs as backlights, a plasma display, an interferometric modulator (IMOD)-based display, or another type of display suitable for use in conjunction with touch-sensitive user interface (UI) systems.

The mobile device 100 may include various other devices or components for interacting with or otherwise communicating information to or receiving information from a user.

For example, the mobile device 100 may include one or more microphones 106, one or more speakers 108, and in some cases one or more at least partially mechanical buttons 110. The mobile device 100 may include various other components enabling additional features such as, for example, one or more video or still-image cameras 112, one or more wireless network interfaces 114 (for example, Bluetooth, Wi-Fi or cellular) and one or more non-wireless interfaces 116 (for example, a universal serial bus (USB) interface or an HDMI interface).

The mobile device 100 may include an ultrasonic sensing system 118 capable of scanning and imaging an object signature, such as a fingerprint, palm print or handprint. In some implementations, the ultrasonic sensing system 118 may function as a touch-sensitive control button. In some implementations, a touch-sensitive control button may be implemented with a mechanical or electrical pressure-sensitive system that is positioned under or otherwise integrated with the ultrasonic sensing system 118. In other words, in some implementations, a region occupied by the ultrasonic sensing system 118 may function both as a user input button to control the mobile device 100 as well as a fingerprint sensor to enable security features such as user authentication features. In some implementations, the ultrasonic sensing system 118 may be positioned under the cover glass of the display or under a portion of the display itself as described herein. In some implementations, the ultrasonic sensing system 118 may be positioned on a sidewall or on the backside of the mobile device enclosure 102.

Figure 2A:
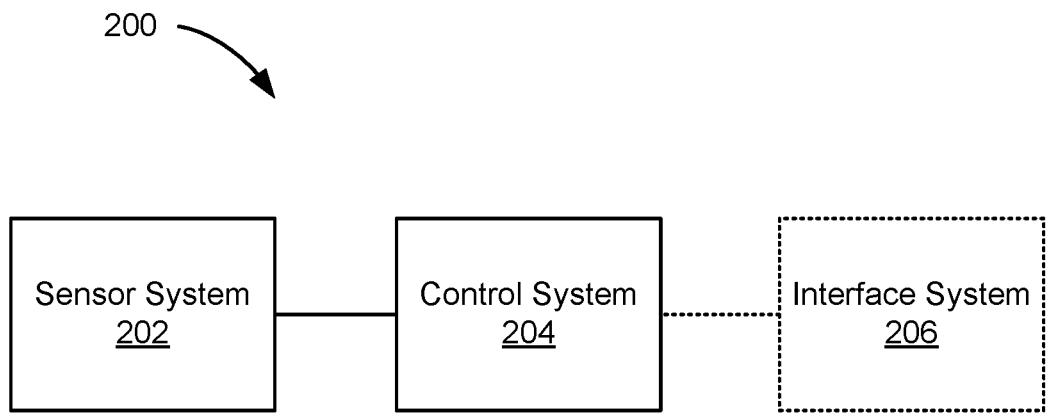
FIG. 2A shows a block diagram representation of components of an example ultrasonic sensing system according to some implementations.

FIG. 2A shows a block diagram representation of components of an example ultrasonic sensing system 200 according to some implementations. As shown, the ultrasonic sensing system 200 may include a sensor system 202 and a control system 204 electrically coupled to the sensor system 202. The sensor system 202 may be capable of scanning an object and providing raw measured image data usable to obtain an object signature such as, for example, a fingerprint of a human finger. The control system 204 may be capable of controlling the sensor system 202 and processing the raw measured image data received from the sensor system. In some implementations, the ultrasonic sensing system 200 may include an interface system 206 capable of transmitting or receiving data, such as raw or processed measured image data, to or from various components within or integrated with the ultrasonic sensing system 200 or, in some implementations, to or from various components, devices or other systems external to the ultrasonic sensing system.

Figure 2B:
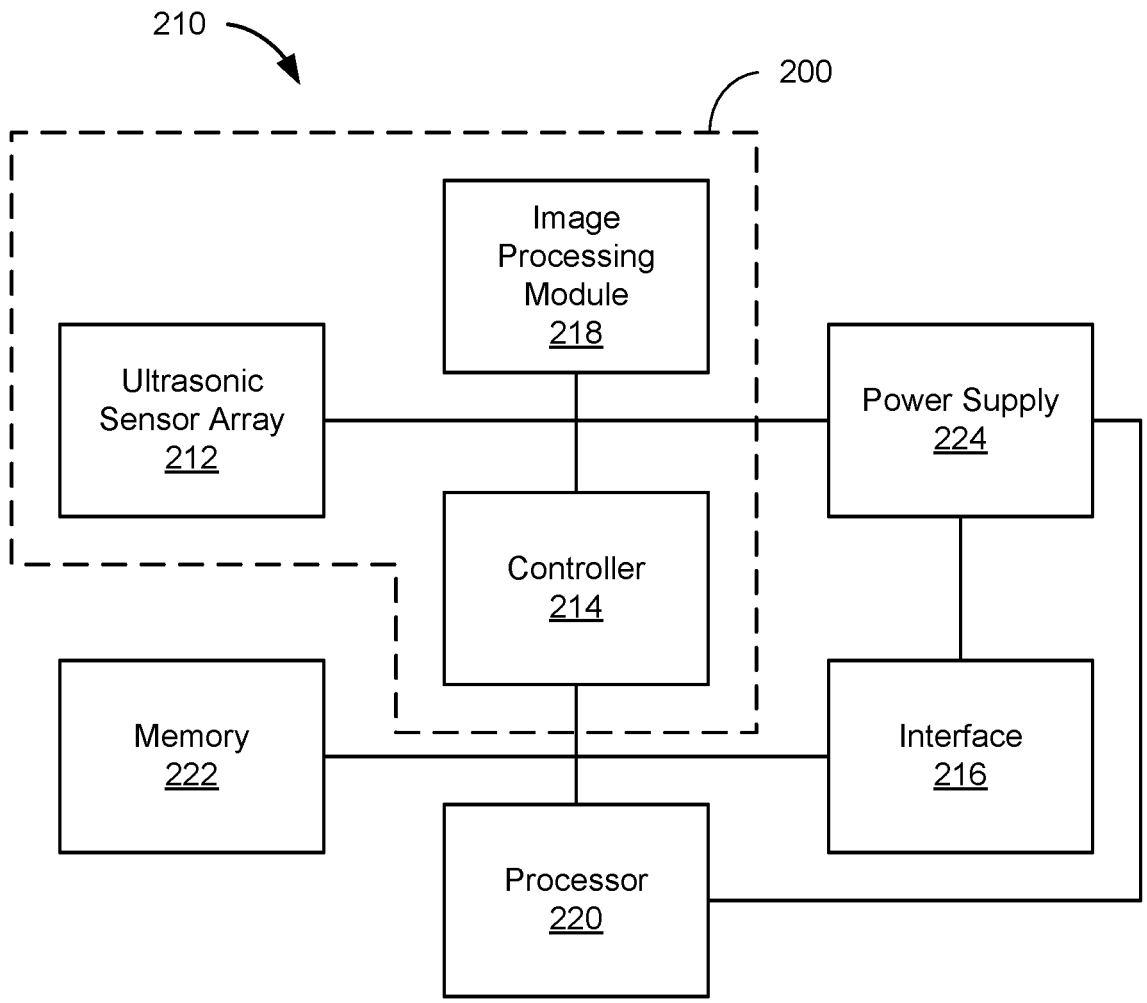
FIG. 2B shows a block diagram representation of components of an example mobile device that includes the ultrasonic sensing system of FIG. 2A.

FIG. 2B shows a block diagram representation of components of an example mobile device 210 that includes the ultrasonic sensing system 200 of FIG. 2A. For example, the mobile device 210 may be a block diagram representation of the mobile device 100 shown in and described with reference to FIG. 1 above. The sensor system 202 of the ultrasonic sensing system 200 of the mobile device 210 may be implemented with an ultrasonic sensor array 212. The control system 204 of the ultrasonic sensing system 200 may be implemented with a controller 214 that is electrically coupled to the ultrasonic sensor array 212. While the controller 214 is shown and described as a single component, in some implementations, the controller 214 may collectively refer to two or more distinct control units or processing units in electrical communication with one another. In some implementations, the controller 214 may include one or more of a general purpose single- or multi-chip processor, a central processing unit (CPU), a digital signal processor (DSP), an applications processor, an application specific integrated circuit (ASIC), a field programmable gate array (FPGA) or other programmable logic device (PLD), discrete gate or transistor logic, discrete hardware components, or any combination thereof designed to perform the functions and operations described herein.

The ultrasonic sensing system 200 of FIG. 2B may include an image processing module 218. In some implementations, raw measured image data provided by the ultrasonic sensor array 212 may be sent, transmitted, communicated or otherwise provided to the image processing module 218. The image processing module 218 may include any suitable combination of hardware, firmware and software configured, adapted or otherwise operable to process the image data provided by the ultrasonic sensor array 212. In some implementations, the image processing module 218 may include signal or image processing circuits or circuit components including, for example, amplifiers (such as instrumentation amplifiers or buffer amplifiers), analog or digital mixers or multipliers, switches, analog-to-digital converters (ADCs), passive filters or active analog filters, among others. In some implementations, one or more of such circuits or circuit components may be integrated within the controller 214, for example, where the controller 214 is implemented as a system-on-chip (SoC) or system-in-package (SIP). In some implementations, one or more of such circuits or circuit components may be integrated within a DSP included within or coupled to the controller 214. In some implementations, the image processing module 218 may be implemented at least partially via software. For example, one or more functions of, or operations performed by, one or more of the circuits or circuit components just described may instead be performed by one or more software modules executing, for example, in a processing unit of the controller 214 (such as in a general-purpose processor or a DSP). In some implementations, the image processing module 218 or portions thereof may be implemented in software that may run on an applications processor such as processor 220 associated with the mobile device 210. The applications processor may have a dedicated coprocessor and/or software modules for secure processing of the biometric image data within the applications processor (sometimes referred to as the "trust zone").

In some implementations, in addition to the ultrasonic sensing system 200, the mobile device 210 may include a separate processor 220, a memory 222, an interface 216 and a power supply 224. In some implementations, the controller 214 of the ultrasonic sensing system 200 may control the ultrasonic sensor array 212 and the image processing module 218, and the processor 220 of the mobile device 210 may control other components of the mobile device 210. In some implementations, the processor 220 communicates data to the controller 214 including, for example, instructions or commands. In some such implementations, the controller 214 may communicate data to the processor 220 including, for example, raw or processed image data (also referred to as "image information"). It should also be understood that, in some other implementations, the functionality of the controller 214 may be implemented entirely, or at least partially, by the processor 220. In some such implementations, a separate controller 214 for the ultrasonic sensing system 200 may not be required because the functions of the controller 214 may be performed by the processor 220 of the mobile device 210.

Depending on the implementation, one or both of controller 214 and processor 220 may store data in the memory 222. For example, the data stored in the memory 222 may include raw measured image data, filtered or otherwise processed image data, estimated image data, or final refined image data. The memory 222 may store processor-executable code or other executable computer-readable instructions capable of execution by one or both of controller 214 and the processor 220 to perform various operations (or to cause other components such as the ultrasonic sensor array 212, the image processing module 218, or other modules to perform operations), including any of the calculations, computations, estimations or other determinations described herein. It should also be understood that the memory 222 may collectively refer to one or more memory devices (or "components"). For example, depending on the implementation, the controller 214 may have access to and store data in a different memory device than the processor 220. In some implementations, one or more of the memory components may be implemented as a NOR- or NAND-based flash memory array. In some other implementations, one or more of the memory components may be implemented as a different type of non-volatile memory. Additionally, in some implementations, one or more of the memory components may include a volatile memory array such as, for example, a type of RAM.

In some implementations, the controller 214 or the processor 220 may communicate data stored in the memory 222 or data received directly from the image processing module 218 through an interface 216. For example, such communicated data can include image data or data derived or otherwise determined from image data. The interface 216 may collectively refer to one or more interfaces of one or more various types. In some implementations, the interface 216 may include a memory interface for receiving data from or storing data to an external memory such as a removable memory device. Additionally or alternatively, the interface 216 may include one or more wireless network interfaces or one or more wired network interfaces enabling the transfer of raw or processed data to, as well as the reception of data from, an external computing device, system or server.

A power supply 224 may provide power to some or all of the components in the mobile device 210. The power supply 224 may include one or more of a variety of energy storage devices. For example, the power supply 224 may include a rechargeable battery, such as a nickel-cadmium battery or a lithium-ion battery. Additionally or alternatively, the power supply 224 may include one or more supercapacitors. In some implementations, the power supply 224 may be chargeable (or "rechargeable") using power accessed from, for example, a wall socket (or "outlet") or a photovoltaic device (or "solar cell" or "solar cell array") integrated with the mobile device 210. Additionally or alternatively, the power supply 224 may be wirelessly chargeable. The power supply 224 may include a power management integrated circuit and a power management system.

As used hereinafter, the term "processing unit" refers to any combination of one or more of a controller of an ultrasonic system (for example, the controller 214), an image processing module (for example, the image processing module 218), or a separate processor of a device that includes the ultrasonic system (for example, the processor 220). In other words, operations that are described below as being performed by or using a processing unit may be performed by one or more of a controller of the ultrasonic system, an image processing module, or a separate processor of a device that includes the ultrasonic sensing system.

Figure 3A:
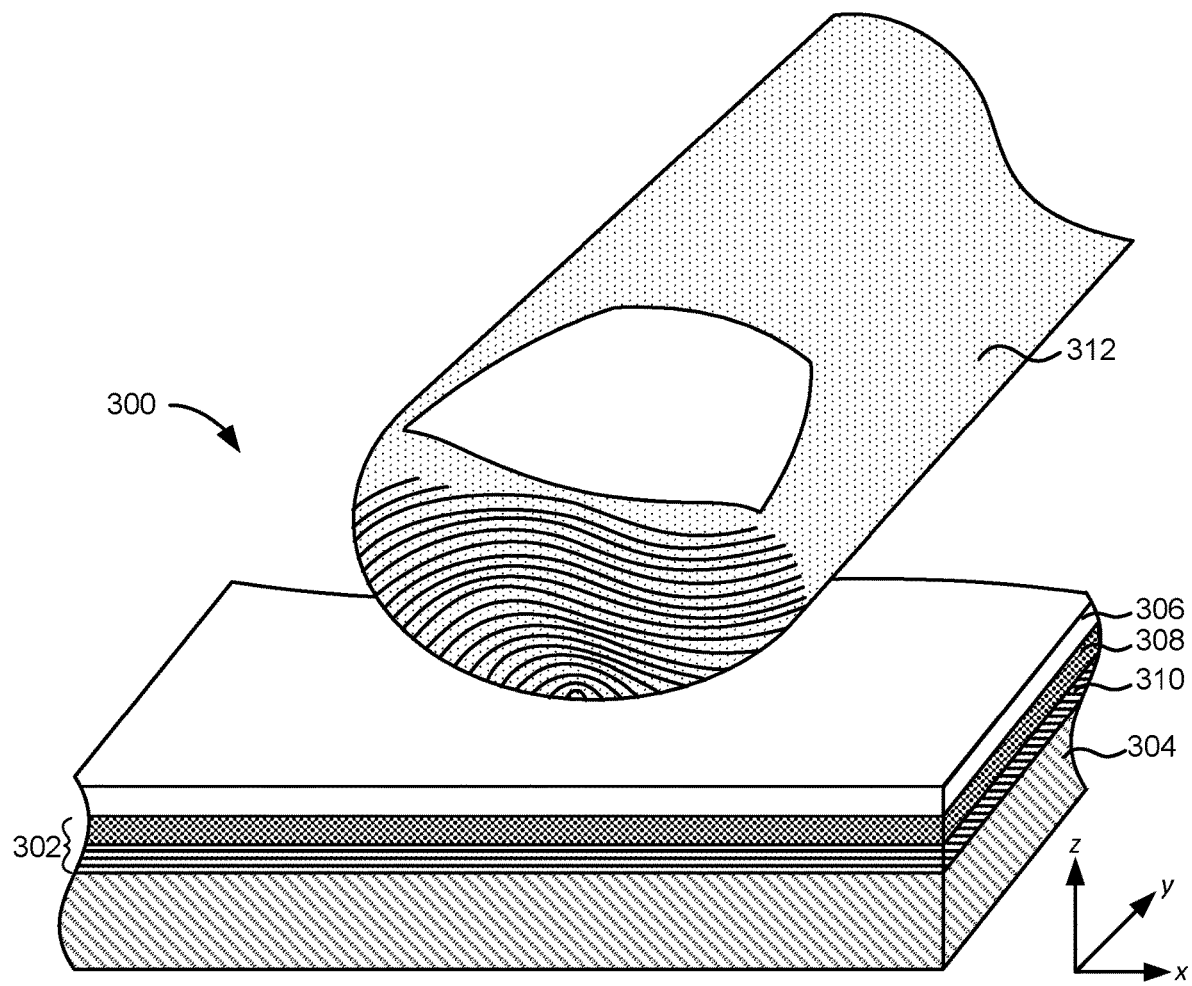
FIG. 3A shows a cross-sectional projection view of a diagrammatic representation of a portion of an example ultrasonic sensing system according to some implementations.
Figure 3B:
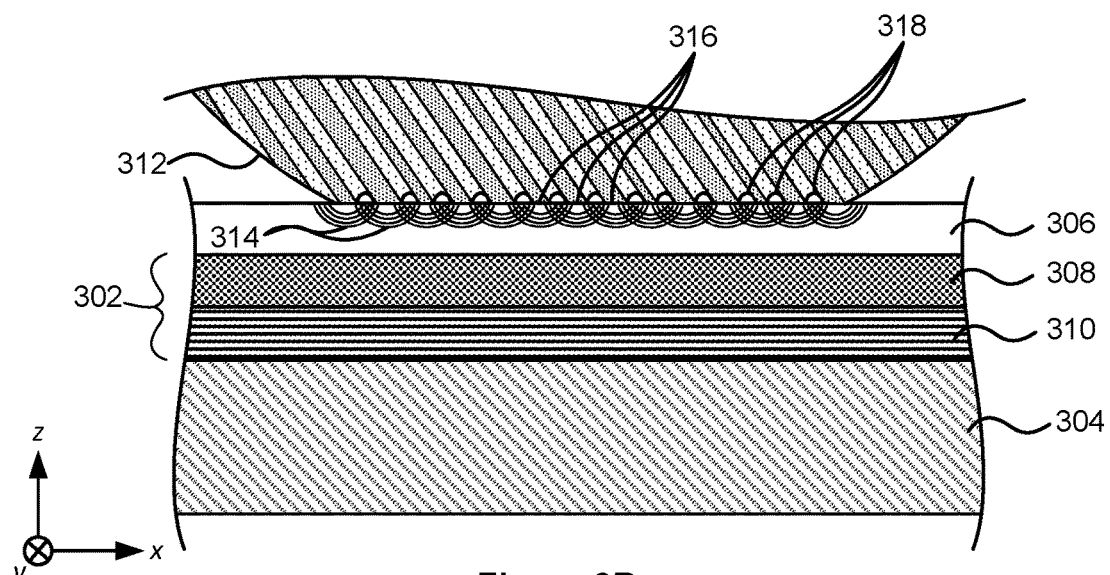
FIG. 3B shows a zoomed-in cross-sectional side view of the example ultrasonic sensing system of FIG. 3A according to some implementations.

FIG. 3A shows a cross-sectional projection view of a diagrammatic representation of a portion of an example ultrasonic sensing system 300 according to some implementations. FIG. 3B shows a zoomed-in cross-sectional side view of the example ultrasonic sensing system 300 of FIG. 3A according to some implementations. For example, the ultrasonic sensing system 300 may implement the ultrasonic sensing system 118 described with reference to FIG. 1 or the ultrasonic sensing system 200 shown and described with reference to FIG. 2A and FIG. 2B. The ultrasonic sensing system 300 may include an ultrasonic transducer 302 that overlies a substrate 304 and that underlies a platen (e.g., a "cover plate" or "cover glass") 306. The ultrasonic transducer 302 may include both an ultrasonic transmitter 308 and an ultrasonic receiver 310.

The ultrasonic transmitter 308 is generally configured to generate and transmit ultrasonic waves towards the platen 306, and in the illustrated implementation, towards a human finger 312 positioned on the upper surface of the platen 306. In some implementations, the ultrasonic transmitter 308 may more specifically be configured to generate and transmit ultrasonic plane waves towards the platen 306. For example, the piezoelectric material of the ultrasonic transmitter 308 may be configured to convert electrical signals provided by the controller of the ultrasonic sensing system into a continuous or pulsed sequence of ultrasonic plane waves at a scanning frequency. In some implementations, the ultrasonic transmitter 308 includes a layer of piezoelectric material such as, for example, polyvinylidene fluoride (PVDF) or a PVDF copolymer such as PVDF-TrFE. In some implementations, other piezoelectric materials may be used in the ultrasonic transmitter 308 and/or the ultrasonic receiver 310, such as aluminum nitride (AlN), lead zirconate titanate (PZT) or bismuth sodium titanate. In some implementations, the ultrasonic transmitter 308 and/or ultrasonic receiver 310 may additionally or alternatively include capacitive ultrasonic devices such as capacitive micromachined ultrasonic transducers (CMUTs) or piezoelectric ultrasonic devices such as piezoelectric micromachined ultrasonic transducers (PMUTs, also referred to as "piezoelectric micromechanical ultrasonic transducers").

Figure 4A:
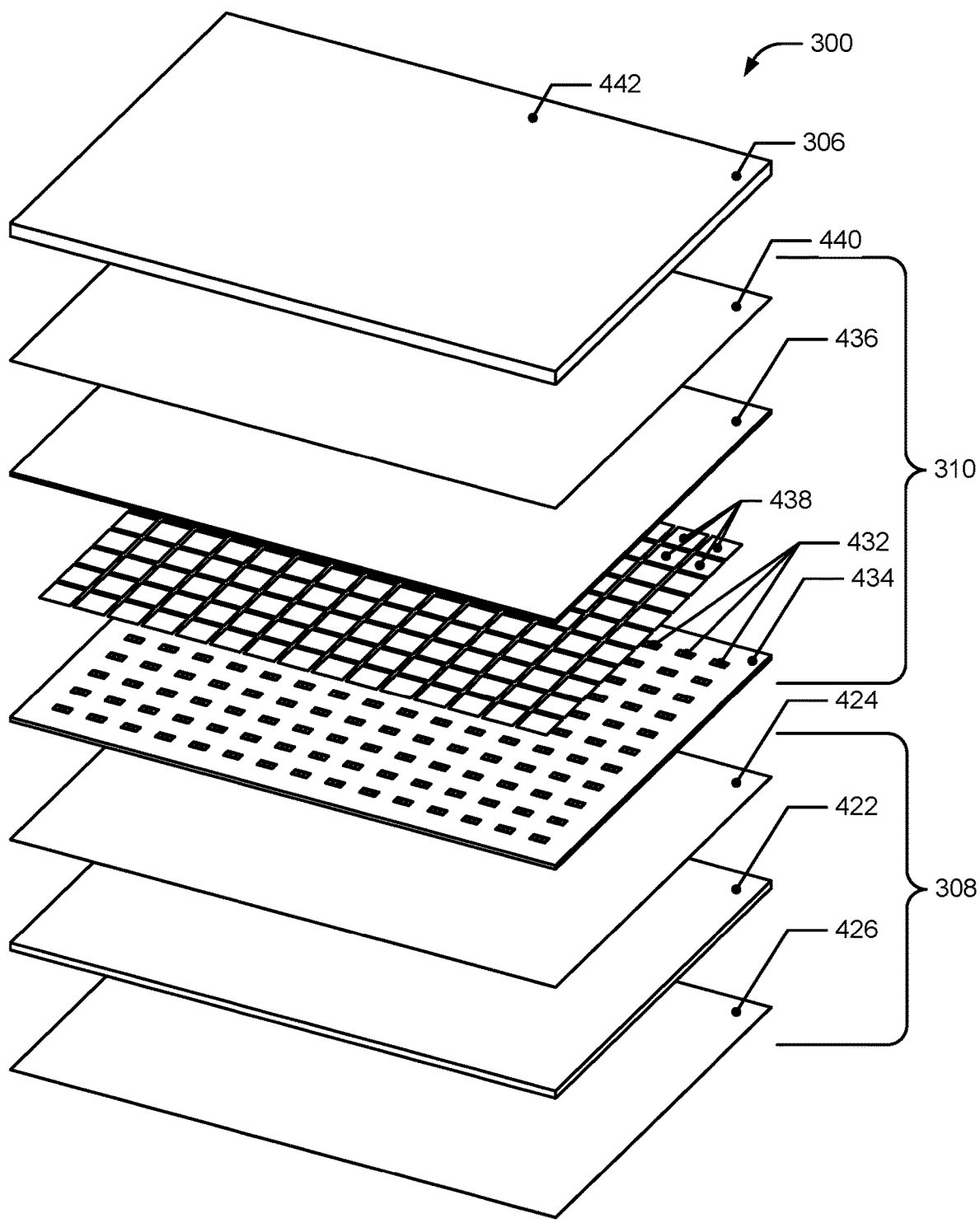
FIG. 4A shows an exploded projection view of example components of the example ultrasonic sensing system of FIGS. 3A and 3B according to some implementations.
Figure 4B:
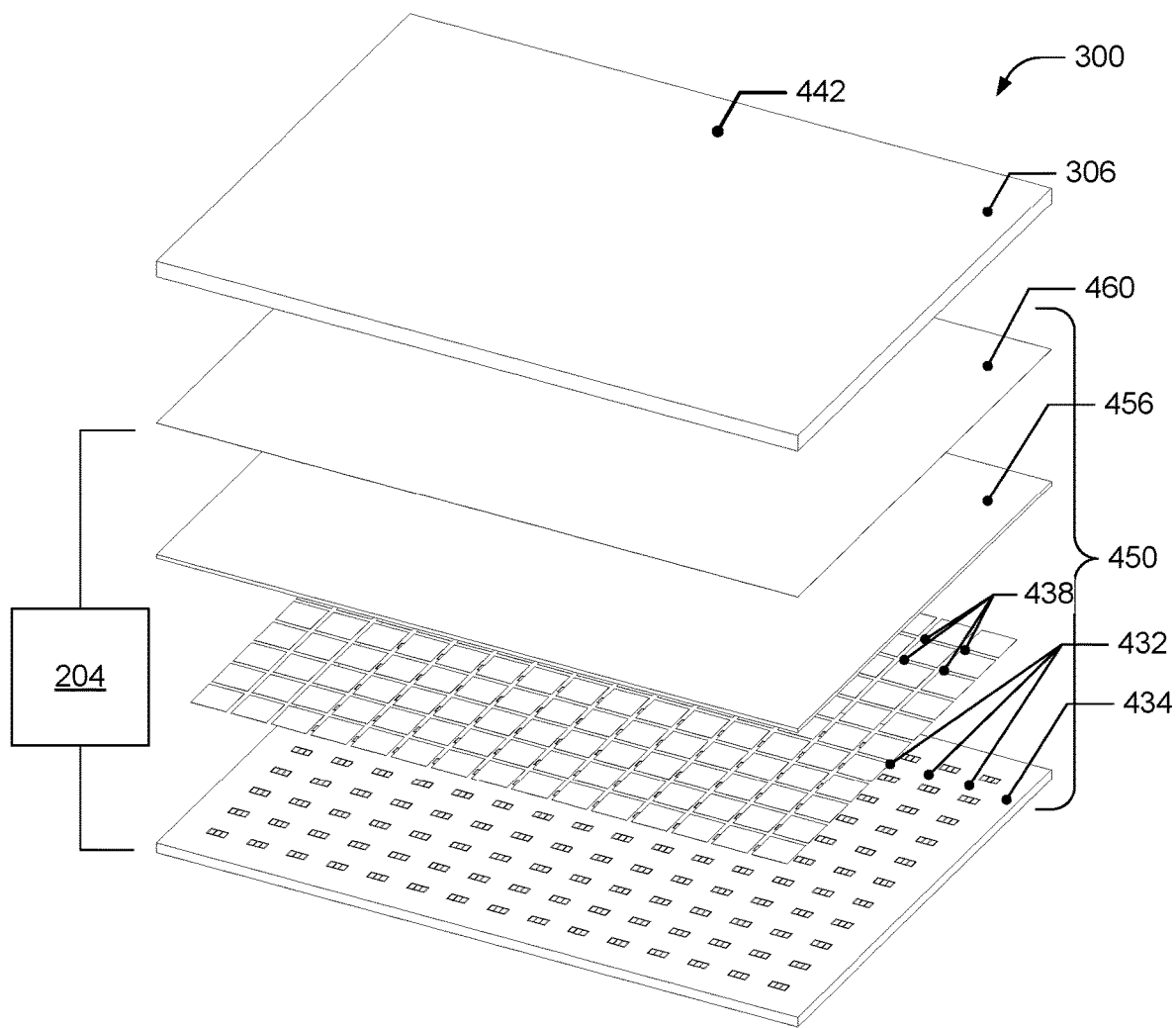
FIG. 4B shows an exploded projection view of example components of an ultrasonic transceiver array in an ultrasonic sensor system of FIGS. 3A and 3B according to some implementations.

The ultrasonic receiver 310 is generally configured to detect ultrasonic reflections 314 resulting from interactions of the ultrasonic waves transmitted by the ultrasonic transmitter 308 with ridges 316 and valleys 318 defining the fingerprint of the finger 312 being scanned. In some implementations, the ultrasonic transmitter 308 overlies the ultrasonic receiver 310 as, for example, illustrated in FIGS. 3A and 3B. In some implementations, the ultrasonic receiver 310 may overlie the ultrasonic transmitter 308 (as shown in FIG. 4A described below). The ultrasonic receiver 310 may be configured to generate and output electrical output signals corresponding to the detected ultrasonic reflections. In some implementations, the ultrasonic receiver 310 may include a second piezoelectric layer different from the piezoelectric layer of the ultrasonic transmitter 308. For example, the piezoelectric material of the ultrasonic receiver 310 may be any suitable piezoelectric material such as, for example, a layer of PVDF or a PVDF-TrFE copolymer. The piezoelectric layer of the ultrasonic receiver 310 may convert vibrations caused by the ultrasonic reflections into electrical output signals. In some implementations, the ultrasonic receiver 310 further includes a thin-film transistor (TFT) layer. In some such implementations, the TFT layer may include an array of sensor pixel circuits configured to amplify or buffer the electrical output signals generated by the piezoelectric layer of the ultrasonic receiver 310. The electrical output signals provided by the array of sensor pixel circuits may then be provided as raw measured image data to the processing unit for use in processing the image data, identifying a fingerprint associated with the image data, and in some applications, authenticating a user associated with the fingerprint. In some implementations, a single piezoelectric layer may serve as the ultrasonic transmitter 308 and the ultrasonic receiver 310 (as shown in FIG. 4B described below). In some implementations, the substrate 304 may be a glass, plastic or silicon substrate upon which electronic circuitry may be fabricated. In some implementations, an array of sensor pixel circuits and associated interface circuitry of the ultrasonic receiver 310 may be configured from CMOS circuitry formed in or on the substrate 304. In some implementations, the substrate 304 may be positioned between the platen 306 and the ultrasonic transmitter 308 and/or the ultrasonic receiver 310. In some implementations, the substrate 304 may serve as the platen 306. One or more protective layers, acoustic matching layers, anti-smudge layers, adhesive layers, decorative layers, conductive layers or other coating layers (not shown) may be included on one or more sides of the substrate 304 and the platen 306.

The platen 306 may be formed of any suitable material that may be acoustically coupled to the ultrasonic transmitter 308. For example, the platen 306 may be formed of one or more of glass, plastic, ceramic, sapphire, metal or metal alloy. In some implementations, the platen 306 may be a cover plate such as, for example, a cover glass or a lens glass of an underlying display. In some implementations, the platen 306 may include one or more polymers, such as one or more types of parylene, and may be substantially thinner. In some implementations, the platen 306 may have a thickness in the range of about 10 microns (μm) to about 1000 μm or more.

In some implementations, the ultrasonic sensing system 300 may further include a focusing layer (not shown). For example, the focusing layer may be positioned above the ultrasonic transmitter 308. The focusing layer may generally include one or more acoustic lenses capable of altering the paths of ultrasonic waves transmitted by the ultrasonic transmitter 308. In some implementations, the lenses may be implemented as cylindrical lenses, spherical lenses or zone lenses. In some implementations, some or all of the lenses may be concave lenses, whereas in some other implementations some or all of the lenses may be convex lenses, or include a combination of concave and convex lenses.

In some implementations that include such a focusing layer, the ultrasonic sensing system 300 may additionally include an acoustic matching layer to ensure proper acoustic coupling between the focusing lens(es) and an object, such as a finger, positioned on the platen 306. For example, the acoustic matching layer may include an epoxy doped with particles that change the density of the acoustic matching layer. If the density of the acoustic matching layer is changed, then the acoustic impedance will also change according to the change in density, if the acoustic velocity remains constant. In alternative implementations, the acoustic matching layer may include silicone rubber doped with metal or with ceramic powder. In some implementations, sampling strategies for processing output signals may be implemented that take advantage of ultrasonic reflections being received through a lens of the focusing layer. For example, an ultrasonic wave coming back from a lens' focal point will travel into the lens and may propagate towards multiple receiver elements in a receiver array fulfilling the acoustic reciprocity principle. Depending on the signal strength coming back from the scattered field, an adjustment of the number of active receiver elements is possible. In general, the more receiver elements that are activated to receive the returned ultrasonic waves, the higher the signal-to-noise ratio (SNR). In some implementations, one or more acoustic matching layers may be positioned on one or both sides of the platen 306, with or without a focusing layer.

FIG. 4A shows an exploded projection view of example components of the example ultrasonic sensing system 300 of FIGS. 3A and 3B according to some implementations. The ultrasonic transmitter 308 may include a substantially planar piezoelectric transmitter layer 422 capable of functioning as a plane wave generator. Ultrasonic waves may be generated by applying a voltage across the piezoelectric transmitter layer 422 to expand or contract the layer, depending upon the voltage signal applied, thereby generating a plane wave. In this example, the processing unit (not shown) is capable of causing a transmitter excitation voltage to be applied across the piezoelectric transmitter layer 422 via a first transmitter electrode 424 and a second transmitter electrode 426. The first and second transmitter electrodes 424 and 426 may be metallized electrodes, for example, metal layers that coat opposing sides of the piezoelectric transmitter layer 422. As a result of the piezoelectric effect, the applied transmitter excitation voltage causes changes in the thickness of the piezoelectric transmitter layer 422, and in such a fashion, generates ultrasonic waves at the frequency of the transmitter excitation voltage.

The ultrasonic waves may travel towards a target object such as a finger, passing through the platen 306. A portion of the ultrasonic waves not absorbed or transmitted by the target object may be reflected back through the platen 306 and received by the ultrasonic receiver 310, which, in the implementation illustrated in FIG. 4A, overlies the ultrasonic transmitter 308. The ultrasonic receiver 310 may include an array of sensor pixel circuits 432 disposed on a substrate 434 and a piezoelectric receiver layer 436. In some implementations, each sensor pixel circuit 432 may include one or more TFT or silicon-based CMOS transistor elements, electrical interconnect traces and, in some implementations, one or more additional circuit elements such as diodes, capacitors and the like. Each sensor pixel circuit 432 may be configured to convert surface charge generated in the piezoelectric receiver layer 436 proximate to the pixel circuit into an electrical signal. Each sensor pixel circuit 432 may include a pixel input electrode 438 that electrically couples the piezoelectric receiver layer 436 to the sensor pixel circuit 432.

In the illustrated implementation, a receiver bias electrode 440 is disposed on a side of the piezoelectric receiver layer 436 proximal to the platen 306. The receiver bias electrode 440 may be a metallized electrode and may be grounded or biased to control which signals may be passed to the array of sensor pixel circuits 432. Ultrasonic energy that is reflected from the exposed (upper/top) surface 442 of the platen 306 may be converted into surface charge by the piezoelectric receiver layer 436. The generated surface charge may be coupled to the pixel input electrodes 438 and underlying sensor pixel circuits 432. The charge signal may be amplified or buffered by the sensor pixel circuits 432 and provided to the processing unit. The processing unit may be electrically connected (directly or indirectly) with the first transmitter electrode 424 and the second transmitter electrode 426, as well as with the receiver bias electrode 440 and the sensor pixel circuits 432 on the substrate 434. In some implementations, the processing unit may operate substantially as described above. For example, the processing unit may be capable of processing the signals received from the sensor pixel circuits 432.

Some examples of suitable piezoelectric materials that may be used to form the piezoelectric transmitter layer 422 or the piezoelectric receiver layer 436 include piezoelectric polymers having appropriate acoustic properties, for example, an acoustic impedance between about 2.5 MRayls and 5 MRayls. Specific examples of piezoelectric materials that may be employed include ferroelectric polymers such as polyvinylidene fluoride (PVDF) and polyvinylidene fluoride-trifluoroethylene (PVDF-TrFE) copolymers. Examples of PVDF copolymers include 60:40 (molar percent) PVDF-TrFE, 70:30 PVDF-TrFE, 80:20 PVDF-TrFE, and 90:10 PVDR-TrFE. Other examples of piezoelectric materials that may be utilized include polyvinylidene chloride (PVDC) homopolymers and copolymers, polytetrafluoroethylene (PTFE) homopolymers and copolymers, and diisopropylammonium bromide (DIPAB). In some implementations, other piezoelectric materials may be used in the piezoelectric transmitter layer 422 and/or the piezoelectric receiver layer 436, such as aluminum nitride (AlN), lead zirconate titanate (PZT) or bismuth sodium titanate.

The thickness of each of the piezoelectric transmitter layer 422 and the piezoelectric receiver layer 436 is selected so as to be suitable for generating and receiving ultrasonic waves, respectively. In one example, a PVDF piezoelectric transmitter layer 422 is approximately 28 μm thick and a PVDF-TrFE receiver layer 436 is approximately 12 μm thick. Example frequencies of the ultrasonic waves may be in the range of about 1 megahertz (MHz) to about 100 MHz, with wavelengths on the order of a millimeter or less.

FIG. 4B shows an exploded projection view of example components of an ultrasonic transceiver array in an ultrasonic sensing system 300 of FIGS. 3A and 3B according to some implementations. In this example, the ultrasonic sensing system 300 includes an ultrasonic transceiver array 450 under a platen 306. The ultrasonic transceiver array 450 may serve as the ultrasonic sensor array 212 that is shown in FIG. 2B and described above. The ultrasonic transceiver array 450 may include a substantially planar piezoelectric transceiver layer 456 capable of functioning as a plane wave generator. Ultrasonic waves may be generated by applying a voltage across the transceiver layer 456. The control system 204 may be capable of generating a transceiver excitation voltage that may be applied across the piezoelectric transceiver layer 456 via one or more underlying pixel input electrodes 438 or one or more overlying transceiver bias electrodes 460. The generated ultrasonic wave may travel towards a linger or other object to be detected, passing through the platen 306. A portion of the wave not absorbed or transmitted by the object may be reflected so as to pass back through the platen 306 and be received by the ultrasonic transceiver array 450. The ultrasonic transceiver array 450 may serve as both an ultrasonic transmitter and an ultrasonic receiver using a single piezoelectric transceiver layer 456.

The ultrasonic transceiver array 450 may include an array of sensor pixel circuits 432 disposed on a sensor substrate 434. In some implementations, each sensor pixel circuit 432 may include one or more TFT- or silicon-based elements, electrical interconnect traces and, in some implementations, one or more additional circuit elements such as diodes, capacitors and the like. Each sensor pixel circuit 432 may include a pixel input electrode 438 that electrically couples the piezoelectric transceiver layer 456 to the sensor pixel circuit 432.

In the illustrated implementation, the transceiver bias electrode 460 is disposed on a side of the piezoelectric transceiver layer 456 proximal to the platen 306. The transceiver bias electrode 460 may be a metallized electrode and may be grounded or biased to control which signals may be generated and which reflected signals may be passed to the array of sensor pixel circuits 432. Ultrasonic energy that is reflected from the exposed (top) surface 442 of the platen 306 may be converted into surface charge by the piezoelectric transceiver layer 456. The generated surface charge may be coupled to the pixel input electrodes 438 and underlying sensor pixel circuits 432. The charge signal may be amplified or buffered by the sensor pixel circuits 432 and provided to the control system 204.

The control system 204 may be electrically connected (directly or indirectly) to the transceiver bias electrode 460 and the sensor pixel circuits 432 on the sensor substrate 434. In some implementations, the control system 204 may operate substantially as described above. For example, the control system 204 may be capable of processing the amplified or buffered electrical output signals received from the sensor pixel circuits 432.

The control system 204 may be capable of controlling the ultrasonic transceiver array 450 to obtain ultrasonic image data, which may include fingerprint image data. According to some implementations, the control system 204 may be capable of providing functionality such as that described herein, e.g., such as described herein with reference to FIGS. 1-3B, 5-14B, and 16A-16D.

In other examples of an ultrasonic sensor system with an ultrasonic transceiver array, a backside of the sensor substrate 434 may be attached directly or indirectly to an overlying platen 306. In operation, ultrasonic waves generated by the piezoelectric transceiver layer 456 may travel through the sensor substrate 434 and the platen 306, reflect off surface 442 of the platen 306, and travel back through the platen 306 and the sensor substrate 434 before being detected by sensor pixel circuits 432 on or in the substrate sensor 434.

Many electronic devices, including mobile devices and smart phones, use fingerprint authentication as one method of access control. An ultrasonic fingerprint sensor may authenticate a user's fingerprint, where ultrasonic waves generated by a piezoelectric material may travel through a platen on which a person's finger is placed. Some portions of an ultrasonic wave encounter skin that is in contact with the platen, e.g., fingerprint ridges, while other portions of an ultrasonic wave encounter air, e.g., valleys between two ridges of a fingerprint. The ultrasonic waves are reflected back with different intensities towards an ultrasonic sensor array. Reflected signals associated with the finger may be processed and converted to a digital value representing the signal strength of the reflected signal, and a fingerprint image may be obtained.

Figure 5:
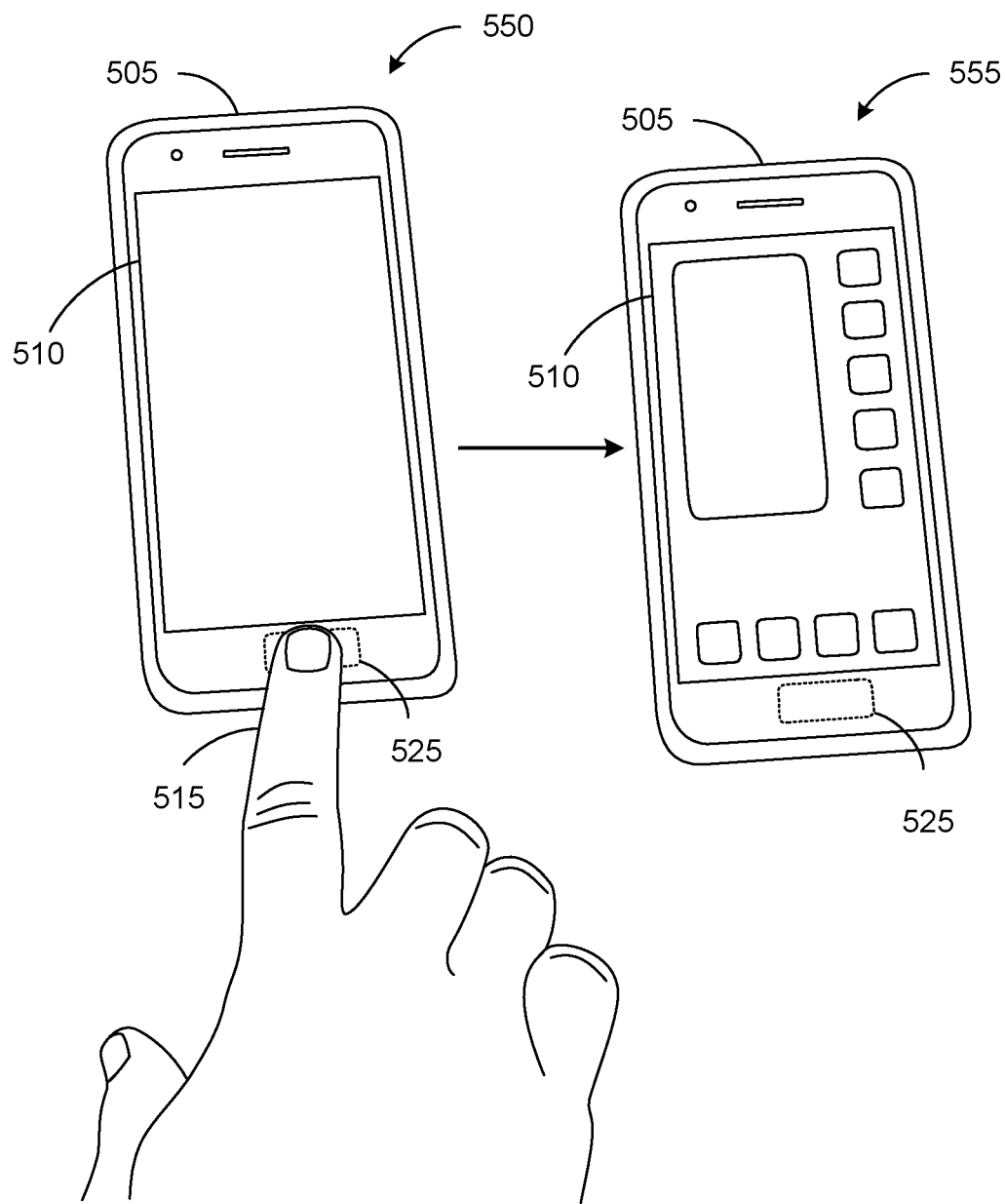
FIG. 5 shows an example of using a fingerprint sensor where the fingerprint sensor is not under display according to some implementations.

FIG. 5 shows an example of using a fingerprint sensor where the fingerprint sensor is not under display according to some implementations. In FIG. 5, an electronic device 505 (e.g., mobile device 210) includes controller circuit (e.g., controller 214 in FIG. 2B) which may operate a sensor 525 (e.g., at least one of the ultrasonic sensors or ultrasonic sensor array 212 of the ultrasonic sensor system 202 in FIG. 2B). In some implementations, the controller circuit may switch sensor 525 to operate between a capacitive sensing mode and an ultrasonic sensing mode. For example, the sensor 525 may be configured to be in a capacitive sensing mode to determine whether an object has touched or is positioned near the receiver bias electrode of the ultrasonic sensor, and then subsequently configured to be in an ultrasonic sensing mode to determine whether that object is a finger 515.

As shown in FIG. 5, at time 550, a finger 515 is placed above sensor 525 that is part of an ultrasonic authenticating button (e.g., "home button") of the electronic device 505. In some implementations, the sensor 525 may be part of an electromechanical button that can authenticate a user and is inserted through a cut-out region in the cover glass of display 510. Accordingly, the sensor 525 may be positioned separate from where visual image content is displayed in the display 510. At time 550, the electronic device 505 may be in a locked state, turned off, or in a relatively low-power "sleep" mode. An object or finger 515 may be determined to have been positioned near or on the display 510, sensor 525, or other sensing electrode. Then at time 555, the controller circuit may "wake up" an applications processor and cause the display 510 to be turned on if a fingerprint of the finger 515 is authenticated. For example, an applications processor may obtain the fingerprint image data (e.g., by receiving the corresponding data stored in memory by the controller circuit) and then determine whether the fingerprint image data represents a fingerprint of an authorized user of the electronic device 505. The image data for the authorized fingerprint may have been previously provided by the user (e.g., the owner), for example, during the setup of the electronic device 505 or during enrollment and setup of the security features of the electronic device 505.

Figure 6:
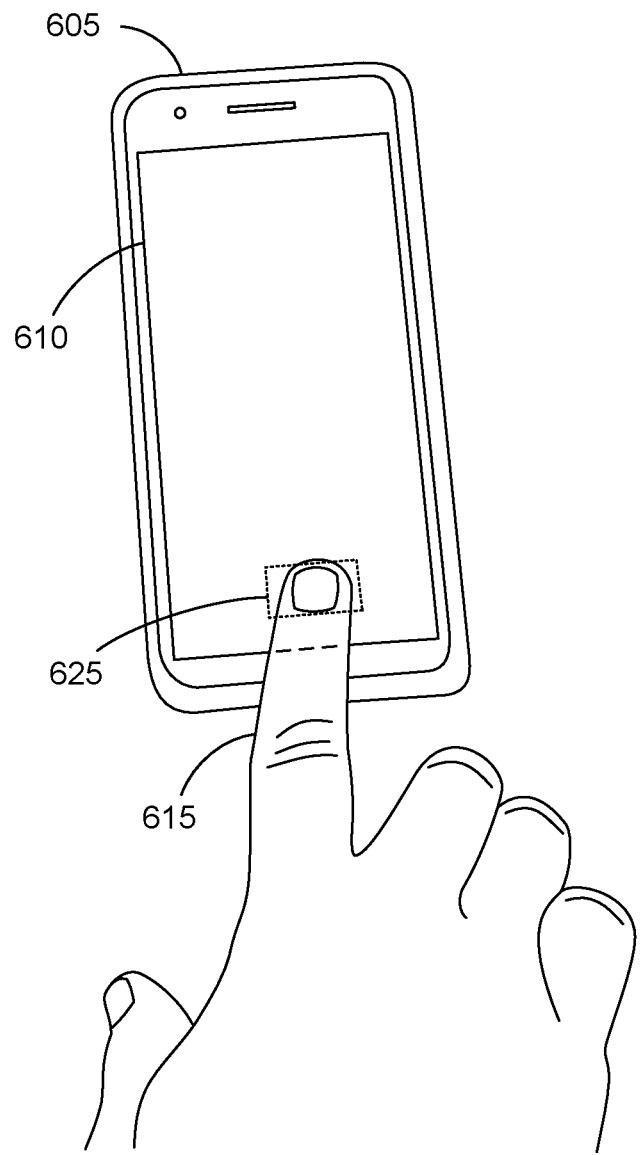
FIG. 6 shows an example of using a fingerprint sensor where the fingerprint sensor is under display according to some implementations.

FIG. 6 shows an example of using a fingerprint sensor where the fingerprint sensor is under display according to some implementations. In FIG. 6, an electronic device 605 (e.g., mobile device 210) includes controller circuit (e.g., controller 214 in FIG. 2B) which may operate a sensor 625 (e.g., at least one of the ultrasonic sensors or ultrasonic sensor array 212 of the ultrasonic sensor system 202 in FIG. 2B). In contrast to FIG. 5 where the sensor 525 is placed in a cut-out region of the cover glass of the display 510, the sensor 625 in FIG. 6 is placed in a region of a display 610 through which visual image content can be displayed. Having the sensor 625 in a display area of the display 610 can improve the user interface and increase the functionality of the display 610 of the electronic device 605. The sensor 625 does not have to be part of an electromechanical button as discussed in FIG. 5. Accordingly, when a finger 615 is positioned near or on the sensor 625, the sensor 625 may authenticate a user's fingerprint. The sensor 625 may authenticate the user's fingerprint using an ultrasonic fingerprint sensor system as described below.

Figure 7:
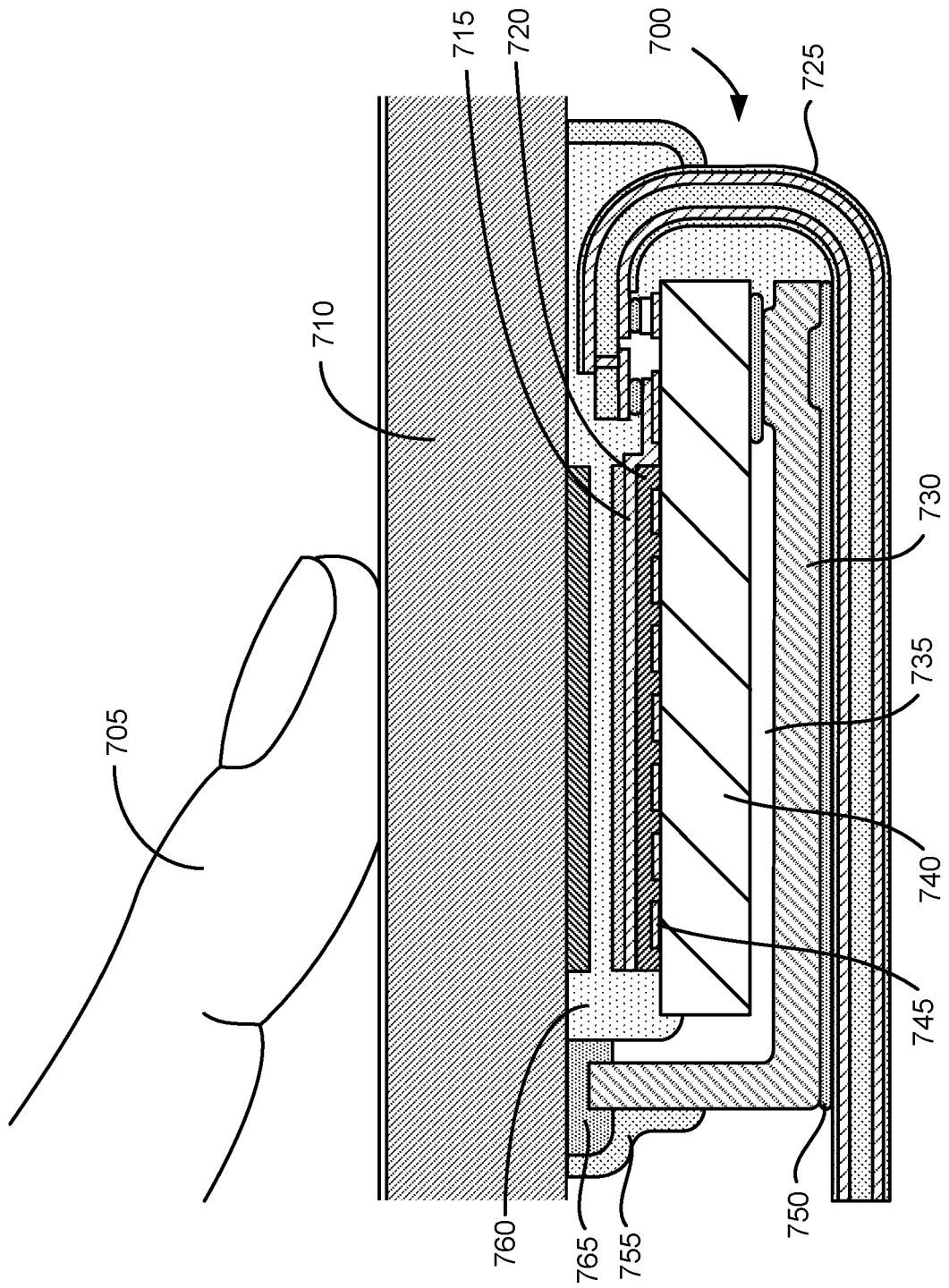
FIG. 7 shows a cross-sectional view of an example under-platen ultrasonic sensor system with a flexible printed circuit (FPC).

FIG. 7 shows a cross-sectional view of an example under-platen ultrasonic sensor system with a flexible printed circuit (FPC). In FIG. 7, an ultrasonic sensor system 700 is located underneath or underlying a platen 710. The platen 710 may be deemed "in front of," "above," or "overlying" the ultrasonic sensor system 700, and the ultrasonic sensor system 700 may be deemed "behind," "below," or "underlying" the platen 710. Such terms as used herein are relative terms depending on the orientation of the device. In some implementations, the ultrasonic sensor system 700 is coupled to the platen 710 by a first adhesive 760. A finger 705 may press against the platen 710 to activate the ultrasonic sensor system 700. In some implementations, the platen 710 may be a cover glass of a display device (e.g., mobile device). In some implementations, the platen 710 may include a portion of a display such as an organic light-emitting diode (OLED) or active matrix organic light-emitting diode (AMOLED) display.

The ultrasonic sensor system 700 may include a sensor substrate 740, a plurality of sensor circuits 745 disposed on the sensor substrate 740, a transceiver layer 720, and an electrode layer 715. The transceiver layer 720 may be referred to as a "piezoelectric layer" or as a "piezoelectric transceiver layer." The electrode layer 715 may be referred to as a "transceiver electrode layer." In some implementations, the transceiver layer 720 may correspond to the piezoelectric transceiver layer 456 of FIG. 4B or may correspond to one or both of the piezoelectric receiver layer 436 and the piezoelectric transmitter layer 422 of FIG. 4A. The ultrasonic sensor system 700 may further include a passivation layer (not shown). Different implementations may use different materials for the sensor substrate 740. For example, the sensor substrate 740 may include a silicon substrate, a silicon-on-insulator (SOI) substrate, a thin-film transistor (TFT) substrate, a glass substrate, a plastic substrate, a ceramic substrate, and/or a combination thereof.

The plurality of sensor circuits 745 may be formed over or on the sensor substrate 740, such as TFT circuits formed on a TFT substrate or complementary metal-oxide-semiconductor (CMOS) circuits formed on or in a silicon substrate. In some implementations, the transceiver layer 720 may be positioned over the plurality of sensor circuits 745. The transceiver layer 720 may serve as both a transmitter and a receiver of ultrasonic waves, where the transceiver layer 720 is configured to transmit at least one ultrasonic wave/signal and receive or detect at least one ultrasonic wave/signal. Accordingly, the transceiver layer 720 may include one or more piezoelectric layers and one or more electrode layers to enable the transceiver layer to transmit and receive ultrasonic waves.

An ultrasonic wave is an acoustic wave that has a frequency above about 20 kHz. In some implementations, ultrasonic waves have a frequency between about 1 MHz and about 100 MHz, such as between about 5 MHz and about 20 MHz. Acoustic waves are longitudinal waves that have the same direction of vibration as their direction of travel. Acoustic waves push particles in a medium, whether the medium is a solid, liquid, or gas. Acoustic waves travel at the speed of sound, which depends on the medium that they are passing through. Acoustic impedance in a material measures the opposition to acoustic flow resulting from an acoustic pressure applied to the material. Acoustic impedance enables determination of the reflection and transmission of acoustic energy at boundaries. If the acoustic impedance of two media is very different, then most acoustic energy will be reflected, rather than transmitted across the boundary. Acoustic impedance may be measured in terms of Pascal-seconds per meter (Pa-s/m or $kg/s/m^2$) with units of Rayls or MRayls.

The plurality of sensor circuits 745 may include an array of thin-film transistor circuits. For example, the sensor circuits 745 may include an array of pixel circuits, where each pixel circuit may include one or more TFTs. A pixel circuit may be configured to convert an electric charge generated by the transceiver layer proximate to the pixel circuit into an electrical signal in response to a received ultrasonic wave. Output signals from the sensor circuits 745 may be sent to a controller or other circuitry for signal processing.

In some implementations, the transceiver electrode layer 715 may be disposed, positioned, placed, or formed over the transceiver layer 720. The transceiver electrode layer 715 may include one or more electrically conductive layers/traces that are coupled to the transceiver layer 720. In some implementations, the transceiver electrode layer 715 may include silver ink. In some implementations, the transceiver electrode layer 715 may include copper. Ultrasonic waves may be generated and transmitted by providing an electrical signal to the transceiver electrode layer 715. In addition, a passivation layer (not shown) may be disposed, positioned, placed, or formed over at least portions of the transceiver electrode layer 715. The passivation layer may include one or more layers of electrically insulating material. The sensor substrate 740 and sensor circuits 745, the piezoelectric transceiver layer 720 and the transceiver electrode layer 715 may be positioned under a platen 710.

FIG. 7 shows a flexible printed circuit (FPC) 725 coupled to the sensor substrate 740. However, it will be understood in the present disclosure that the sensor substrate 740 may be coupled to a rigid printed circuit board (PCB) or other circuitry. The FPC 725 may be referred to as a flex tape, flex cable, flex circuit, or simply as "flex." The FPC 725 may include one or more dielectric layers and one or more interconnects (e.g., traces, vias and pads). In some implementations, the FPC 725 may be electrically coupled to a controller or other circuitry for signal processing of signals to/from the sensor circuits 745. In some implementations, the FPC 725 may wrap around from a front side of the ultrasonic sensor system 700 to a back side of the ultrasonic sensor system 700.

In FIG. 7, the ultrasonic sensor system 700 may be attached to the platen 710 using a first adhesive 760 and an edge sealant 755. The ultrasonic sensor system 700 may further include a sensor housing or cap 730 for protecting the ultrasonic sensor system 700. The sensor housing 730 may be coupled to a portion of the platen 710 via a second adhesive 765 and may be coupled to a portion of the sensor substrate 740 and to a portion of the FPC 725 via a third adhesive 750. In some implementations, the sensor housing 730 may be largely cantilevered over the active area of the sensor substrate 740. The sensor housing 730 may be coupled to the sensor substrate 740 such that a cavity 735 is formed between the back side of the sensor substrate 740 and the sensor housing 730. In some implementations, the sensor housing 730 may include one or more layers of plastic or metal. In some implementations, the sensor housing 730 and the cavity 735 may allow the interface between the sensor substrate 740 and the cavity 735 to operate as an acoustic barrier for the ultrasonic sensor system 700. In some implementations, the cavity 735 may provide a space for accommodating an acoustic shielding structure that is configured to absorb, trap, or otherwise attenuate ultrasonic waves. The FPC 725 may be wrapped around the sensor substrate 740 and the sensor housing 730, where the FPC 725 is attached to a backside of the sensor housing 730.

An under-platen ultrasonic sensor system 700 may be provided in a display device as shown in FIG. 7, but an under-display ultrasonic sensor system is not necessarily provided in a display device as in an under-platen ultrasonic sensor system. Accordingly, a display device including an under-display ultrasonic sensor system may be constructed differently than an under-platen ultrasonic sensor system.

Figure 8A:
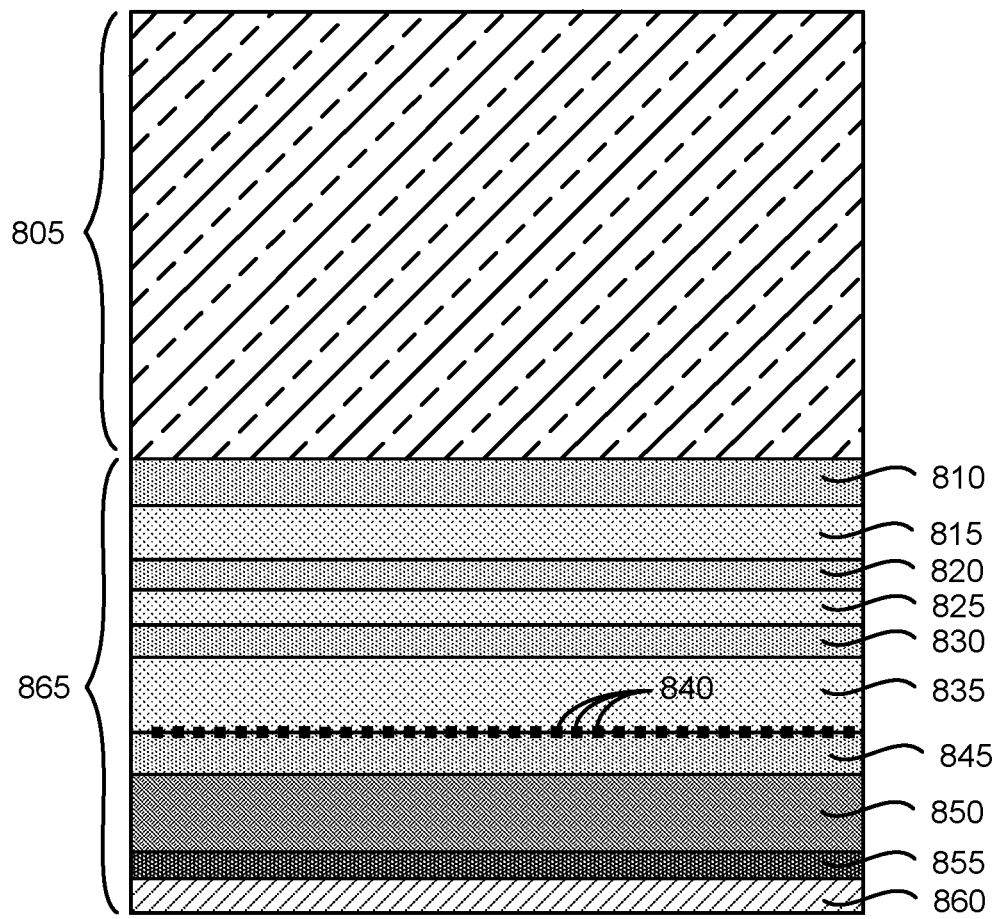
FIG. 8A shows a cross-sectional schematic view of an example device including a platen and a display underlying the platen according to some implementations.

FIG. 8A shows a cross-sectional schematic view of an example device including a platen and a display underlying the platen according to some implementations. A display device may include a display 865, such as a DMS-based display, an LED display, an OLED display, an LCD, a plasma display, an IMOD-based display, or another type of display suitable for use in conjunction with a touch-sensitive user interface. In some implementations, the display 865 may be modified to reduce or remove air gaps that can hinder ultrasonic imaging capability. In FIG. 8A, the display 865 is an OLED display underlying a platen 805, such as a cover glass, cover lens or outer layer of the OLED stack or any associated touchscreen.

The OLED display 865 in FIG. 8A may include a plurality of thin film layers 810, 815, 820, 825, 830, 835, 845, and 850. At least some of the thin film layers 810, 815, 820, 825, 830, 835, 845, and 850 include layers of organic or plastic materials. The organic or plastic materials may provide a range of colors depending on which materials are employed. The OLED display 865 may include a plurality of pixels 840 arranged in a matrix. The OLED display 865 may include rows and columns of pixel circuits driven by an active matrix for addressing the pixels 840. In some implementations, the OLED display 865 may further include one or more layers 810, 815 of touch-sensitive film, including one or more layers of sensing electrodes. The one or more layers 810, 815 formed upon an organic light-emitting material in the OLED display 865 (e.g., OLED stack) may be substantially transparent to visible light. Substantial transparency as used herein may be defined as transmittance of visible light of about 70% or more, such as about 80% or more, or even about 90% or more. Additional layers in the OLED display 865 may optionally include color filters, polarizers, anti-reflective film, anti-shatter film, adhesive layers, barrier layers, optical layers and one or more coatings or cover layers. In some implementations, the OLED display 865 may be a glass OLED display with a glass cover layer. Pixel circuits in the glass OLED display 865 may be disposed between a glass substrate and the glass cover layer.

Typically, an OLED display 865 may include one or more backing layers 855, 860. The one or more backing layers 855, 860 may separate the OLED display 865 from other electronics or components of the display device, such as a battery, RF components, printed circuit boards, framing to support the electronic components, etc. In some implementations, the one or more backing layers 855, 860 may include a light-blocking layer 855 and an electrical shielding layer 860. The light-blocking layer 855 may include one or more materials that are opaque or substantially opaque to visible light. Being substantially opaque or substantially non-transparent as used herein may be defined as absorbance of visible light of about 70% or more, such as about 80% or more, or even about 90% or more. When an OLED display 865 is functioning or turned on, the light-blocking layer 855 may prevent or otherwise limit transmission of visible light to the back of a display device. Moreover, the light-blocking layer 855 may provide a mechanical function as a cushion for protecting the OLED display 865 from external forces. In some implementations, the light-blocking layer 855 in the OLED display 865 may include a porous black foam.

In some implementations, the one or more backing layers 855, 860 may include an electrical shielding layer 860. The electrical shielding layer 860 may include one or more electrically conductive materials and may be electrically grounded. The electrical shielding layer 860 may serve to prevent or otherwise limit electrical interference with the OLED display 865, particularly when the OLED display 865 is functioning or turned on. For example, the electrical shielding layer 860 may limit electrical interference from nearby electronics, such as a battery charger, digital or analog electronics, RF components, etc. Furthermore, the electrical shielding layer 860 may provide heat dissipation and improve temperature uniformity at the back of the display, as high temperature gradients can occur near the OLED display 865 that may be caused by electronic circuits and other devices (e.g., batteries) near the OLED display 865. In some implementations, the electrical shielding layer 860 in the OLED display 865 may include a thick copper tape. For example, the copper tape may have a thickness that is greater than about 50 µm, greater than about 20 µm, greater than about 10 µm, or greater than about 6 µm.

However, one or both of the light-blocking layer 855 and the electrical shielding layer 860 as described above may include pores, voids, or air gaps that do not allow ultrasonic waves to effectively pass through. Voids and air gaps may also exist at an interface with one or both of the light-blocking layer 855 and the electrical shielding layer 860. Voids and air gaps may also exist between a glass cover layer and a glass substrate in a glass OLED display. Additionally, the electrical shielding layer 860 may be excessively thick and reduce the signal of ultrasonic waves propagating therethrough.

A display device as disclosed herein may include an ultrasonic fingerprint sensor system integrated with a display, such as an OLED display 865 in FIG. 8A, that retains the light-blocking and electrical shielding functionality of an OLED display 865 without degrading the performance of the ultrasonic fingerprint sensor system. Integration can occur, for example, by bonding (e.g., laminating) the ultrasonic fingerprint sensor system to a back side of the display 865. Integration of the ultrasonic fingerprint sensor system with the display 865 can occur without degrading the performance of the display device. In some implementations, integration of the ultrasonic fingerprint sensor system may provide for ease of replacement and/or refurbishment of one or both of the ultrasonic fingerprint sensor system and the display 865 without damaging the display device and its components.

Figure 8B:
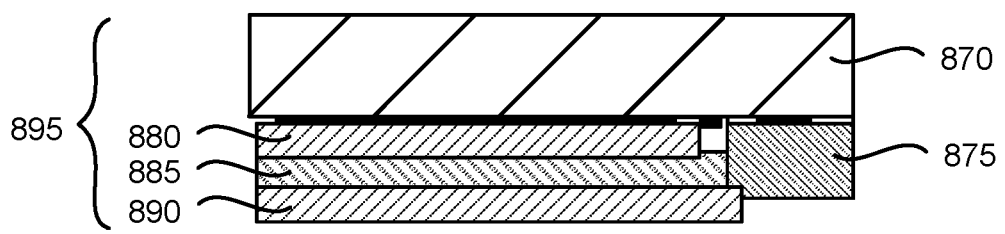
FIG. 8B shows a cross-sectional schematic view of an example ultrasonic fingerprint sensor system according to some implementations.

FIG. 8B shows a cross-sectional schematic view of an example ultrasonic fingerprint sensor system according to some implementations. The ultrasonic fingerprint sensor system 895 in FIG. 8B may include a sensor substrate 870, a piezoelectric transceiver layer 880 coupled to the sensor substrate 870, a transceiver electrode layer 885, a passivation layer 890, and an FPC 875 coupled to the sensor substrate 870. Aspects of the ultrasonic fingerprint sensor system 895 in FIG. 8B may be identical or similar to the ultrasonic fingerprint sensor systems in FIGS. 1, 2A-2B, 3A-3B, 4A-4B, and 5-7. However, integration of an ultrasonic fingerprint sensor system 895 with an OLED display 865 in FIG. 8A may limit or degrade the performance of one or both of the ultrasonic fingerprint sensor system 895 and the display 865. For example, integration of the ultrasonic fingerprint sensor system 895 may introduce stresses that can distort the appearance and degrade the performance of the OLED display 865. In addition or in the alternative, integration of the ultrasonic fingerprint sensor system 895 with the OLED display 865 of FIG. 8A may reduce the effectiveness of the ultrasonic fingerprint sensor system 895 by limiting transmission of acoustic signals.

Figure 9A:
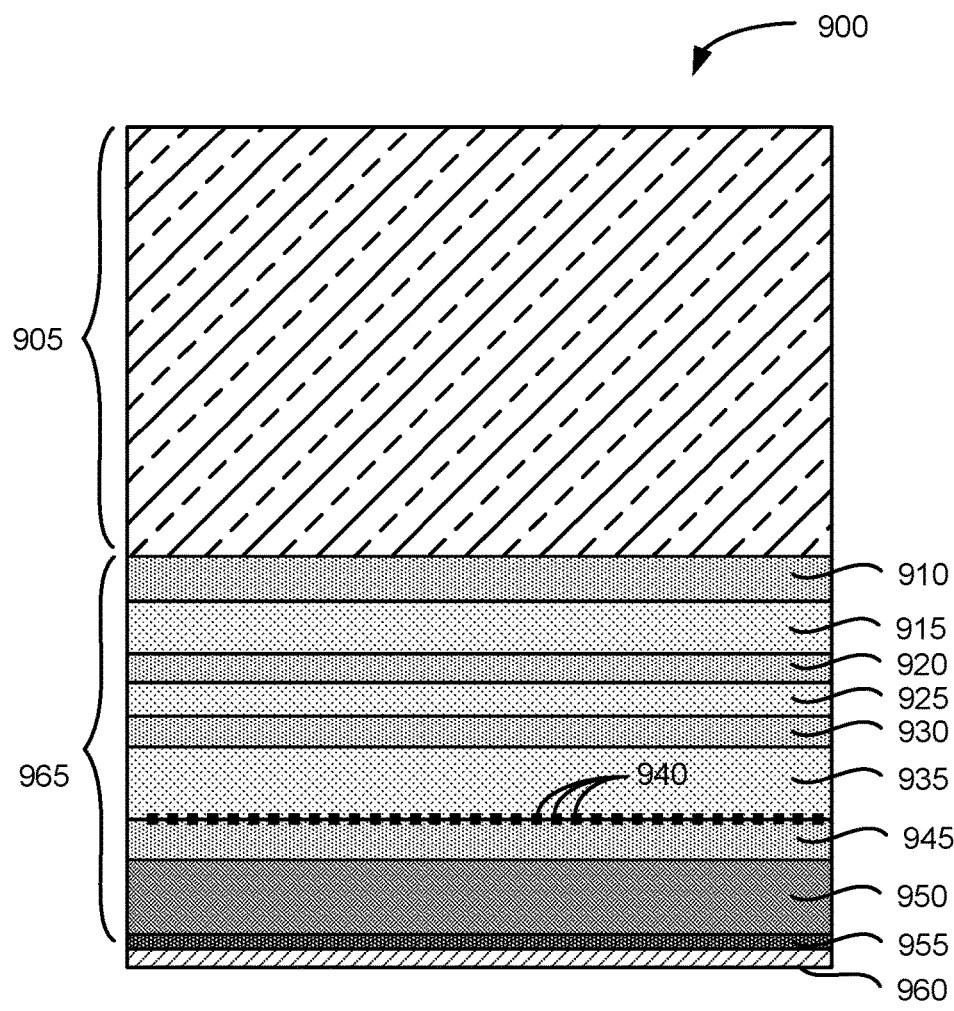
FIG. 9A shows a cross-sectional schematic view of an example device including a platen, a display underlying the platen, and a light-blocking layer and an electrical shielding layer underlying the display according to some implementations.
Figure 9B:
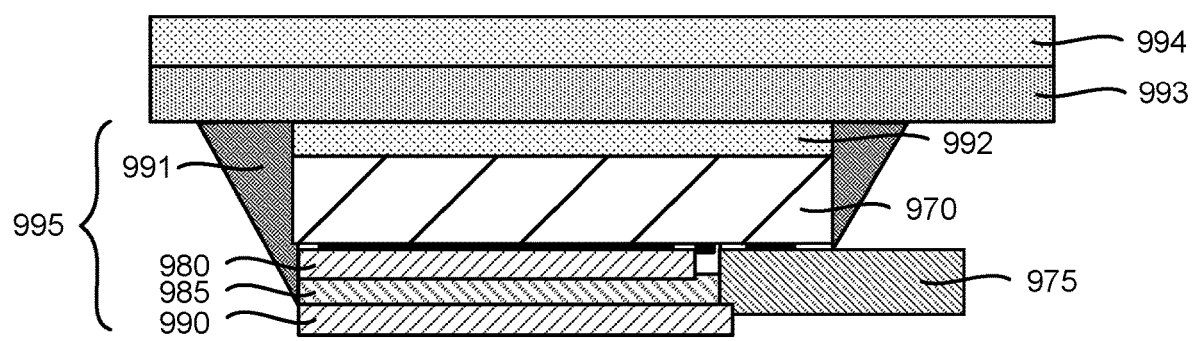
FIG. 9B shows a cross-sectional schematic view of an example ultrasonic fingerprint sensor system to be attached or bonded to the device of FIG. 9A and to be underlying the display according to some implementations.

One or both of the display 865 and the ultrasonic fingerprint sensor system 895 may be modified to effectively integrate the ultrasonic fingerprint sensor system 895 with the display 865 without degrading the performance of either the ultrasonic fingerprint sensor system 895 or the display 865. FIG. 9A shows a cross-sectional schematic view of an example device 900 including a cover glass 905, a display 965 underlying the cover glass 905, and a light-blocking layer 955 and an electrical shielding layer 960 underlying the display 965 according to some implementations. FIG. 9B shows a cross-sectional schematic view of an example ultrasonic fingerprint sensor system 995 to be attached or bonded to the device 900 of FIG. 9A and to be underlying the display 965 according to some implementations. As described above, the ultrasonic fingerprint sensor system 995 includes a sensor substrate 970, a piezoelectric transceiver layer 980 coupled to the sensor substrate 970, a transceiver electrode layer 985, a passivation layer 990, and an FPC 975 coupled to the sensor substrate 970.

In FIG. 9A, the light-blocking layer 855 of FIG. 8A is replaced with a non-porous light-blocking layer 955 in FIG. 9A to permit effective transmission of ultrasonic waves and the electrical shielding layer 860 of FIG. 8A is replaced with a thin electrical shielding layer 960 in FIG. 9A to permit effective transmission of ultrasonic waves. The non-porous light-blocking layer 955 and/or the electrical shielding layer 960 may be positioned locally between the active area of the ultrasonic fingerprint sensor system 995 in some implementations, while in other implementations the non-porous blocking layer 955 and/or the electrical shielding layer 960 may extend beyond the active area of the ultrasonic fingerprint sensor system 995 and may extend to the edges of the display 965. In some implementations, where the display 965 of FIG. 9A includes a glass cover layer, voids and/or air gaps between the glass cover layer and a substrate glass may be filled with a filling material such as a substantially transparent oil or polymer, thereby allowing effective transmission of ultrasonic waves. The non-porous light-blocking layer 955 and the thin electrical shielding layer 960 may be part of a multi-functional film positioned between a display 965 and an ultrasonic fingerprint sensor system, such as an ultrasonic fingerprint sensor system 995 in FIG. 9B or any of the ultrasonic fingerprint sensor systems described in FIGS. 11A-11F, 12A-12F, and 13A-13B. In some implementations, the non-porous light-blocking layer 955 may include a colored plastic material such as black polyethylene terephthalate (PET) or colored polyethylene naphthalate, polyimide, polycarbonate or PMMA, etc., one or more paint layers, one or more colored ink layers, or a coated plastic layer. In some implementations, the thin electrical shielding layer 960 may include a metalized plastic or a metal such as copper. In some implementations, a thin metal foil may serve as a light-blocking layer and as an electrical shielding layer. The thin metal foil may be positioned on or attached to a layer of plastic material. In some implementations, the thin electrical shielding layer 960 may have a thickness between 0.05 µm and about 10 µm, or between about 0.1 µm and about 9 µm. In some implementations, the thickness of the electrical shielding layer 960 comprising a thin metal layer or a metallized plastic layer may between about 0.1 µm and about 25 µm or between about 0.1 µm and about 50 µm. Each of the non-porous light-blocking layer 955 and the thin electrical shielding layer 960 and the interfaces therebetween are substantially free of voids and substantially non-porous. While FIG. 9A shows the non-porous light-blocking layer 955 and the thin electrical shielding layer 960 as at least two discrete layers, it will be understood that the non-porous light-blocking layer 955 and the thin electrical shielding layer 960 may be integrated as a single layer or single material. For example, a paint layer with conductive components such as metal flakes may serve both as a light-blocking layer and as an electrical shielding layer on the display 965. In some implementations, a single adhesive positioned between the ultrasonic fingerprint sensor system 995 and the display 965 may serve as an adhesive layer, a light-blocking layer, an ultrasonically conductive layer, and an electrical shielding layer.

The display 965 in FIG. 9A may include an OLED display stack, where the OLED display stack includes a plurality of thin film layers 910, 915, 920, 925, 930, 935, 945, and 950. The OLED display stack may include a plurality of pixels 940 arranged in matrix. In some implementations, the light-blocking layer 955 disposed between the OLED display stack and the ultrasonic sensing system 995 may include an index-matching layer that is index-matched with the lower layers of the OLED display stack. For example, the optical index of refraction of the light-blocking layer 955 may be matched or substantially matched to the optical index of refraction of the lowest layer of the OLED display stack to minimize optical reflections from the interface between the OLED display stack and the light-blocking layer 955. The optical index of the light-blocking layer 955 may be controlled to be within, for example, 0.05 of the optical index of the lowest layer in the OLED display stack to avoid unwanted internal reflections. In some implementations, the light-blocking layer 955 may include an index-controlled optically clear adhesive or optically clear resin that has been combined with a suitable light-blocking component such as a paint, an ink, a pigment, a colorant, colored fibers or carbon, graphite, graphene or metal particles. The metal particles or other conductive materials in the light-blocking layer 955 may also serve as an electrical shield. In some implementations, a portion of a foam layer in the OLED display stack may be injected with a light-blocking material to minimize voids and to allow effective transmission of ultrasonic waves through the OLED display stack. In some implementations, the foam layer in the OLED display stack may be electrically conductive and serve as an electrical isolation layer. In some implementations, the light-blocking layer 955 or the injected foam layer may extend throughout the active area and in some examples extend to the edges of the display 965.

In FIG. 9B, a mechanical stress isolation layer 993 and an adhesive layer 994 may be added to the ultrasonic fingerprint sensor system 995 to allow for attachment or bonding to the display 965 with minimal transference of stresses to the display 965 and/or ultrasonic fingerprint sensor system 995. Mechanical stresses caused by curing of dispensed epoxies, edge sealant or other adhesive materials may lead to mechanical distortions of the OLED display stack and generate artefacts that may be visible to a user. The mechanical stress isolation layer 993 and the adhesive layer 994 may be part of a multi-functional film positioned between the display 965 and the ultrasonic fingerprint sensor system 995. In some implementations, the adhesive layer 994 for attaching or bonding to the display 965 may include a pressure-sensitive adhesive (PSA) or epoxy. In some implementations, the mechanical stress isolation layer 993 may include a plastic material, such as PET, polyethylene naphthalate (PEN), or polyimide. In some implementations, the materials used in the mechanical stress isolation layer 993 may be selected to minimize thermal coefficient of expansion mismatches with materials in the OLED display stack. In some implementations, an adhesive layer 992 may be provided underlying the mechanical stress isolation layer 993. For example, such an adhesive layer 992 may include a structural adhesive, such as a thermally curable epoxy or a UV-curable epoxy. The mechanical stress isolation layer 993 may be selected with a material and thickness to limit the transference of stress between the ultrasonic fingerprint sensor system 995 and the display 965 upon attaching or bonding the ultrasonic fingerprint sensor system 995 to the display 965. While FIGS. 9A-9B show the non-porous light-blocking layer 955, thin electrical shielding layer 960 and mechanical stress isolation layer 993 as discrete layers, it will be understood that the mechanical stress isolation layer 993 may be integrated as a single layer or single material with one or both of the non-porous light-blocking layer 955 and the thin electrical shielding layer 960.

The multi-functional film may include the non-porous light-blocking layer 955 and the thin electrical shielding layer 960 so that the ultrasonic fingerprint sensor system 995 couples with a display 965 (e.g., OLED display) ultrasonically, allows ultrasonic waves to pass from the ultrasonic fingerprint sensor system 995 through the display 965, eliminates or reduces transmission of visible light to the ultrasonic fingerprint sensor system 995, and eliminates or reduces electrical noise to the ultrasonic fingerprint sensor system 995. In some implementations, the multi-functional film may include an adhesive layer 994 over a mechanical stress isolation layer 993 so that the ultrasonic fingerprint sensor system 995 eliminates or reduces stresses (e.g., lamination stresses) that may be introduced from attaching or bonding the ultrasonic fingerprint sensor system 995 or that may be introduced from an edge seal application process. For example, the ultrasonic fingerprint sensor system 995 may be laminated onto the display 965 while minimizing lamination stresses that can distort the appearance and performance of the display 965. The adhesive layer 994 may also allow for ease of reworking, replacement and refurbishment of the ultrasonic fingerprint sensor system 995 and the display 965. In some implementations, a tab or extension may be included on one or more of the adhesive layer 994 or mechanical stress isolation layer 993 to allow peeling and removal of the ultrasonic fingerprint sensor system 995 from the display 965 without causing cosmetic or functional damage to the display 965. The adhesive layer 994 may be reworkable and configured to allow the ultrasonic fingerprint sensor system 995 to be separated from the display 965. In some implementations, the adhesive layer 994 may be a pressure sensitive adhesive layer to permit ease of reworking. In some implementations, the adhesive layer 944 may include an epoxy-based adhesive such as a thermoplastic ink. The thermoplastic ink may be configured to dissolve in a suitable organic solvent, thereby allowing for separation between the ultrasonic fingerprint sensor system 995 and the display 965 for ease of reworking. It will be understood that reattachment or replacement of the ultrasonic fingerprint sensor system 995 onto the back of the display 965 as part of a reworking process may impose similar scrutiny to avoid gaps, particulates, voids and other detrimental features that may impede the conveyance of ultrasonic image information and reduce signal integrity.

The mechanical stress isolation layer 993 may be disposed over or on the ultrasonic fingerprint sensor system 995. In some implementations, a surface area of the mechanical stress isolation layer 993 extends beyond a surface of the ultrasonic fingerprint sensor system 995 to which the mechanical stress isolation layer 993 is attached or bonded to. As shown in FIG. 9B, the mechanical stress isolation layer 993 may extend beyond a periphery of the ultrasonic fingerprint sensor system 995. In some implementations, the mechanical stress isolation layer 993 may span the entire display region of the display 965 and in some implementations to the edges of the display 965. The extended area provides a landing for a housing or cap so that the ultrasonic fingerprint sensor system 995 can be protected and enclosed. The extended area also provides an area for an edge seal 991 to be formed around the sidewalls of a sensor and the sensor substrate 970 to protect and package the ultrasonic fingerprint sensor system 995 for improved reliability of the ultrasonic fingerprint sensor system 995 without causing image artefacts in the OLED stack. In some implementations, the mechanical stress isolation layer 993 provides a substantially planar surface for sensor-to-display lamination. In some implementations, the mechanical stress isolation layer 993 allows the ultrasonic fingerprint sensor system 995 to be packaged so that it can be handled with thin layers (e.g., thinned glass and silicon substrates) and handled for attachment or bonding to glass, plastic, metal or other materials.

Figure 10A:
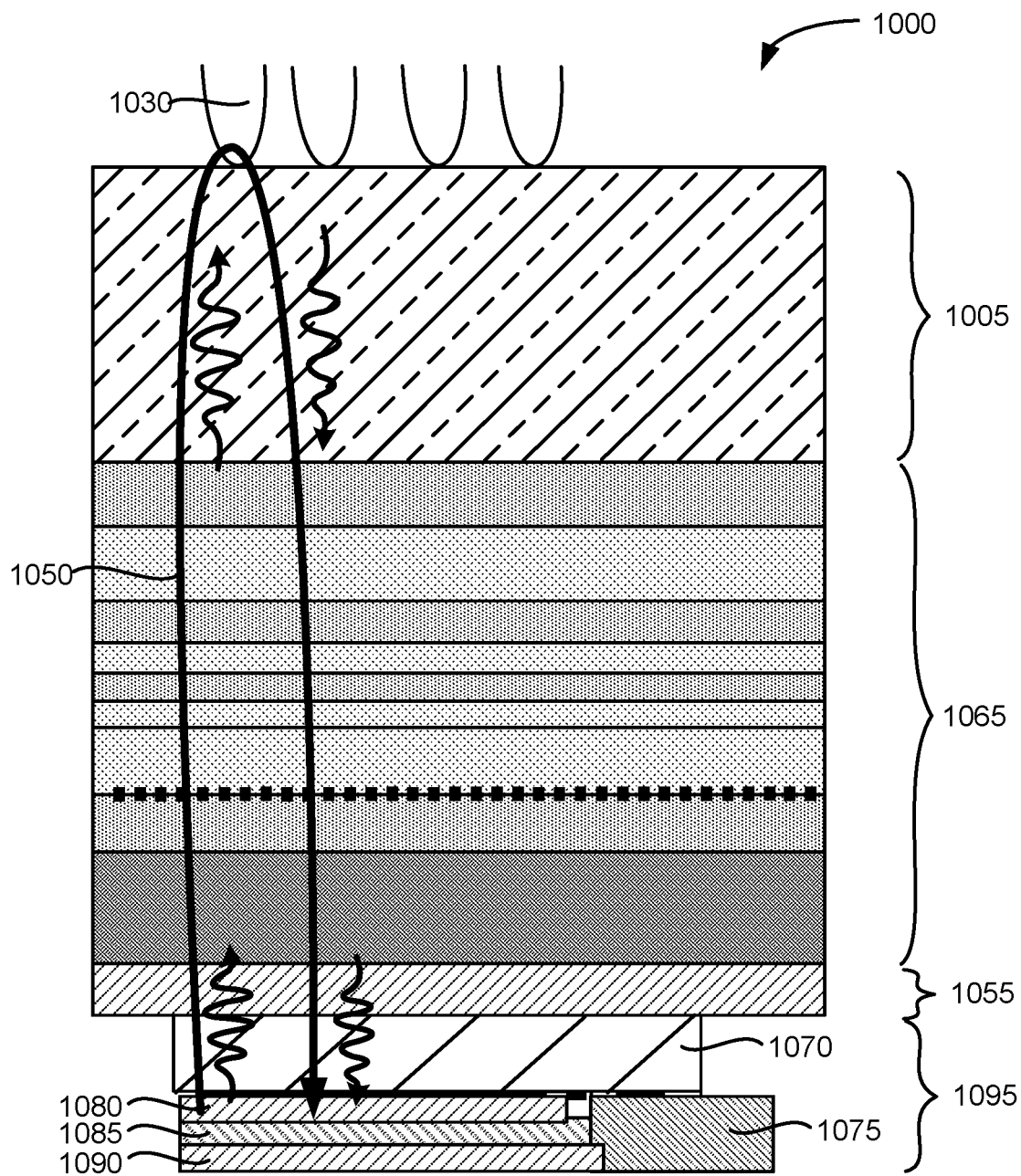
FIG. 10A shows a cross-sectional schematic view of an example device including an ultrasonic fingerprint sensor system underlying a display and an acoustic path from the ultrasonic fingerprint sensor system according to some implementations.

FIG. 10A shows a cross-sectional schematic view of an example device 1000 including an ultrasonic fingerprint sensor system 1095 underlying a display 1065 and an acoustic path 1050 from the ultrasonic fingerprint sensor system 1095 according to some implementations. As described above, an ultrasonic fingerprint sensor system 1095 may include a sensor substrate 1070, a piezoelectric transceiver layer 1080 coupled to the sensor substrate 1070, a transceiver electrode layer 1085, a passivation layer 1090, and an FPC 1075 coupled to the sensor substrate 1070. The ultrasonic fingerprint sensor system 1095 may be configured to transmit and receive ultrasonic waves in an acoustic path 1050 through a display 1065 of a display device 1000, where the ultrasonic fingerprint sensor system 1095 is underlying the display 1065 of the display device 1000. At least some of the ultrasonic waves transmitted from the ultrasonic fingerprint sensor system 1095 may be reflected back by an object 1030 (e.g., a finger) positioned on an outer surface of the display 1065, touchscreen, platen, or cover glass 1005. The acoustic path 1050 may be defined by the propagation of ultrasonic waves to and from the ultrasonic fingerprint sensor system 1095 that allows an object 1030 such as a finger placed in contact with the outer surface of the display 1065, touchscreen, platen, or cover glass 1005 to be imaged. To integrate the display 1065 and the underlying ultrasonic fingerprint sensor system 1095, a multi-functional film 1055 may be positioned between the ultrasonic fingerprint sensor system 1095 and the display 1065 so that the multi-functional film 1055 is in the acoustic path 1050. In some implementations, the multi-functional film 1055 includes one or more of a light-blocking layer, an electrical shielding layer, an adhesive layer, and a mechanical stress isolation layer, one or more of which are in the acoustic path 1050. In some implementations, each of the light-blocking layer, the electrical shielding layer, the mechanical stress isolation layer, and the adhesive layer between the mechanical stress isolation layer and the display 1065 are positioned in the acoustic path 1050.

Figure 10B:
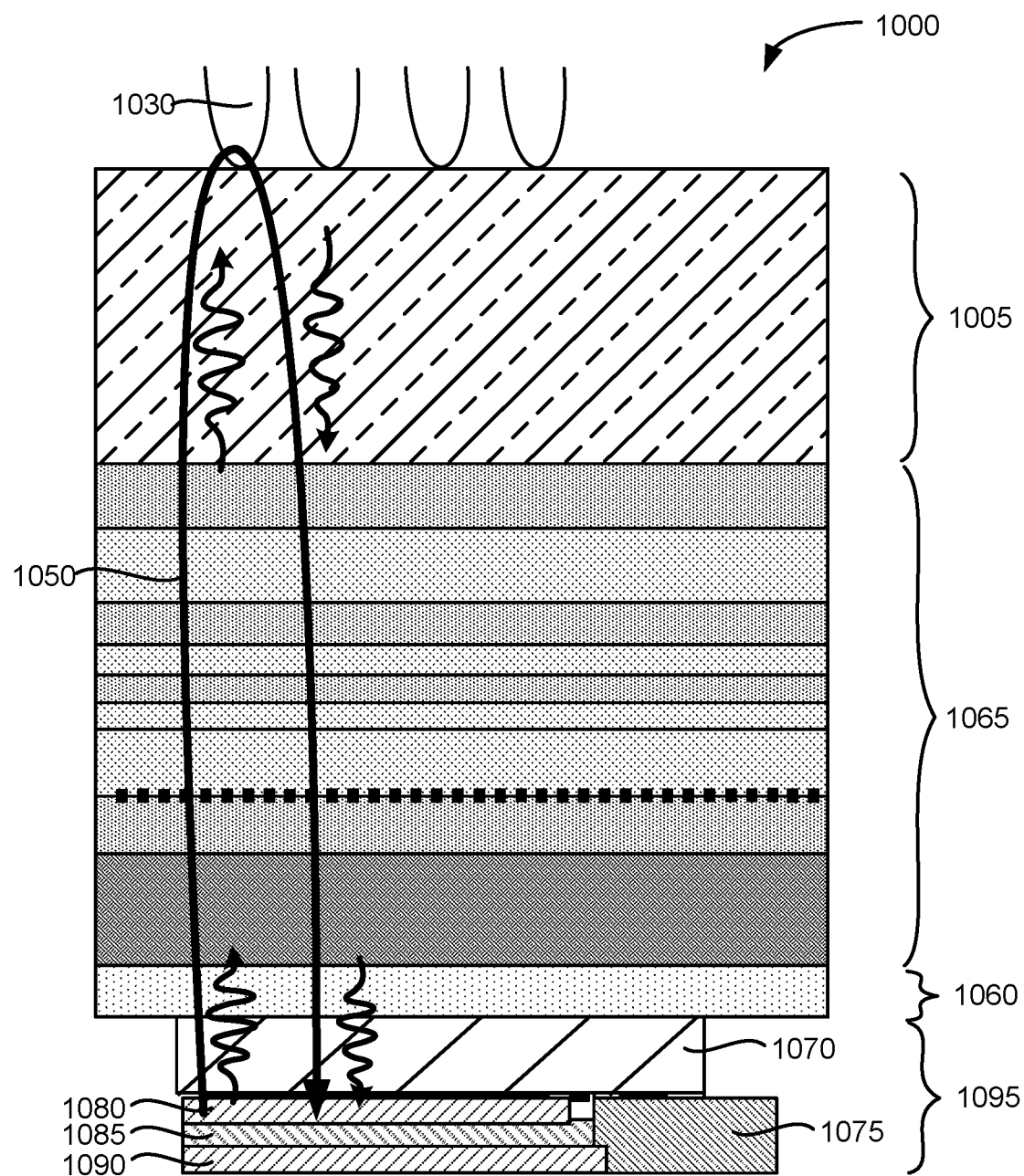
FIG. 10B shows a cross-sectional schematic view of an example device including an ultrasonic fingerprint sensor system underlying a display and an acoustic path from the ultrasonic fingerprint sensor system according to some other implementations.

FIG. 10B shows a cross-sectional schematic view of an example device 1000 including an ultrasonic fingerprint sensor system 1095 underlying a display 1065 and an acoustic path 1050 from the ultrasonic fingerprint sensor system 1095 according to some other implementations. In FIG. 10B, the multi-functional film 1055 may be replaced by an adhesive layer 1060 that connects the ultrasonic fingerprint sensor system 1095 to the display 1065. In some implementations, the adhesive layer 1060 includes an epoxy or a pressure-sensitive adhesive. An epoxy may include an epoxy-based adhesive, where the epoxy-based adhesive may include a thermoplastic ink that is configured to dissolve in a suitable organic solvent. In some implementations, the adhesive layer 1060 may serve functions in addition to adhering the ultrasonic fingerprint sensor system 1095 to the display 1065, including mechanical stress isolation and light-blocking functions.

The mechanical stress isolation layer may be integrated with the ultrasonic fingerprint sensor system according to various implementations as shown in FIGS. 11A-11F, 12A-12F, and 13A-13B. FIGS. 11A-11F show cross-sectional schematic views of various example ultrasonic fingerprint sensor systems 1100 in a "receiver down" orientation according to some implementations. FIGS. 12A-12F show cross-sectional schematic views of various example ultrasonic fingerprint sensor systems 1200 in a "receiver up" orientation according to some implementations. The ultrasonic fingerprint sensor system may be oriented in a "receiver down" orientation or "receiver up" orientation. In the "receiver down" orientation, a piezoelectric transceiver layer is underlying a sensor substrate so that the sensor substrate is in the acoustic path. An FPC may be coupled to the sensor substrate so that the FPC is underlying the sensor substrate in the "receiver down" orientation. In the "receiver up" orientation, a piezoelectric transceiver layer is overlying a sensor substrate so that the sensor substrate is not in the acoustic path. Rather, a transceiver electrode layer and a passivation layer are in the acoustic path. An FPC may be coupled to the sensor substrate so that the FPC is overlying the sensor substrate in the "receiver up" orientation.

In FIGS. 11A-11F, each of the ultrasonic fingerprint sensor systems 1100 includes a sensor substrate 1130, a piezoelectric transceiver layer 1140, a transceiver electrode layer 1145, a passivation layer 1150 (except in FIG. 11F), and an FPC 1120 coupled to the sensor substrate 1130. The piezoelectric transceiver layer 1140 may include a piezoelectric material configured to transmit ultrasonic waves upon the application of a voltage. Examples of a suitable piezoelectric material include PVDF or PVDF-TrFE copolymers. In some implementations, the piezoelectric material is configured to receive ultrasonic waves and generate a surface charge that is provided to sensor pixel circuits disposed in or on the sensor substrate 1130. The sensor substrate 1130 may include a plurality of sensor pixel circuits 1135 such as a TFT array of sensor pixel circuits. The sensor pixel circuits 1135 on the sensor substrate 1130 may amplify or buffer the generated surface charge to provide electrical output signals to the FPC 1120 or control system (not shown). The ultrasonic fingerprint sensor system 1100 in the "receiver down" orientation includes a transceiver electrode layer 1145 underlying the piezoelectric transceiver layer 1140 and coupled to the piezoelectric transceiver layer 1140. In some implementations, the transceiver electrode layer 1145 may include a metallized electrode that may be grounded or biased to control which signals may be generated and which reflected signals may be passed to the plurality of sensor pixel circuits 1135 disposed on the sensor substrate 1130. The ultrasonic fingerprint sensor system 1100 in the "receiver down" orientation may include a passivation layer 1150 underlying the transceiver electrode layer 1145 or at least portions of the transceiver electrode layer 1145. The passivation layer 1150 may include one or more layers of electrically insulating material, such as silicon nitride, silicon dioxide, benzocyclobutene (BCB), polyimide, a thermosetting material such as a thermosetting epoxy, a UV-curable resin, an acrylic, an epoxy, or other suitable material to provide protection for underlying electrodes, the piezoelectric transceiver layer 1140, interconnects, electrical traces, electrical and electronic components, and electronic circuits. The thickness of the passivation layer 1150 may be selected to maximize the efficiency of the ultrasonic fingerprint sensor system 1100. In some implementations, the passivation layer 1150 may be printed, sprayed or laminated onto an outer portion of the transceiver electrode layer 1145.

In each of the ultrasonic fingerprint sensor systems in FIGS. 11A-11F, a mechanical stress isolation layer 1110 may be disposed over the sensor substrate 1130 in the "receiver down" orientation. While the mechanical stress isolation layer 1130 is shown as a separate and discrete layer in FIGS. 11A-11F, it will be understood that the non-porous light-blocking layer 955 in FIG. 9A or the multi-functional film 1055 in FIG. 10 may serve as a mechanical stress isolation layer in addition or in the alternative to the mechanical stress isolation layer 1110 shown in FIGS. 11A-11F.

In each of the ultrasonic fingerprint sensor systems 1100 in FIGS. 11A-11D, the mechanical stress isolation layer 1110 is positioned between two adhesive layers 1105, 1125. In some implementations, a first adhesive layer 1105 positioned between the mechanical stress isolation layer 1110 and a display (not shown) may include a pressure-sensitive adhesive. In some implementations, a second adhesive layer 1125 between the mechanical stress isolation layer 1110 and the sensor substrate 1130 may include a structural adhesive, such as a thermally curable epoxy. An edge seal 1115 may be provided on the mechanical stress isolation layer 1110 and around the sides of the ultrasonic fingerprint sensor system 1100 and in some implementations on the back side to seal and protect the ultrasonic fingerprint sensor system 1100 as a package. The edge seal 1115 may serve to protect the ultrasonic fingerprint sensor system 1100 against the ambient environment, moisture ingress and external forces. In some implementations, the edge seal 1115 may include a thermally curable epoxy. The mechanical stress isolation layer 1110 enables the edge seal 1115 so that the edge seal 1115 is not directly attached or bonded to the display, which could otherwise result in stresses and distortions being imparted to the display.

Figure 11A:
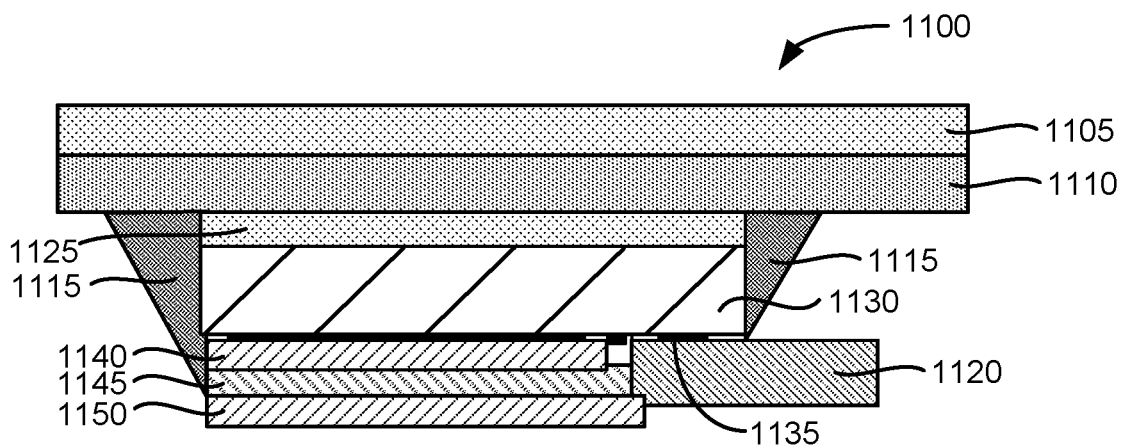
FIGS. 11A-11F show cross-sectional schematic views of various example ultrasonic sensor systems in a "receiver down" orientation according to some implementations.
Figure 11B:
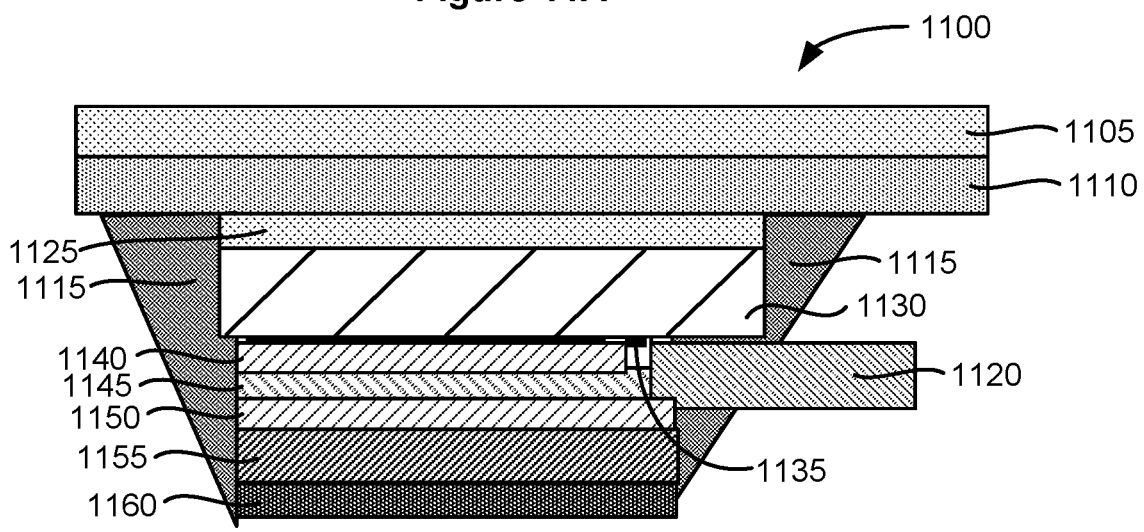

FIG. 11A as shown does not include additional backing layers or structures underlying the passivation layer 1150 of the ultrasonic fingerprint sensor system 1100. In this configuration, air serves as an effective backing layer. However, air backing layers may provide insufficient protection against inadvertent contact with other components, which may result in interference with the ultrasonic imaging and potential mechanical damage to the sensor system 1100. In FIG. 11B, the ultrasonic fingerprint sensor system further includes a foam backing layer 1155 (also referred to as a "foam backer" or "foam layer") and a stiffener 1160 underlying the foam backing layer 1155 relative to the ultrasonic fingerprint sensor system 1100 of FIG. 11A. In some implementations, the ultrasonic fingerprint sensor system 1100 includes a stiffener 1160 and an electrical shield underlying the foam backing layer 1155. The stiffener 1160, which may be a stamped layer of stainless steel or aluminium in some implementations, may be electrically grounded to provide an effective electrical shield.

The foam backing layer 1155 may have an acoustic impedance very close to air and substantially lower than the piezoelectric transceiver layer 1140 such that acoustic wave transmission into the foam backing layer 1155 and subsequent layers is significantly reduced. The foam backing layer 1155 may have an acoustic impedance substantially different than the piezoelectric transceiver layer 1140. The acoustic impedance mismatch between the foam backing layer 1155 and the piezoelectric transceiver layer 1140 are substantially different. The term "substantially different" with respect to acoustic impedance throughout this disclosure refers to an acoustic impedance value that is at least five times, at least eight times, at least ten times, or at least 100 times greater or less than an acoustic impedance value being compared to. That way, the foam backing layer 1155 can provide total or near-total reflection of propagating ultrasonic waves. In addition, the foam backing layer 1155 may provide a mechanical support and cushion for protecting the ultrasonic fingerprint sensor system 1100. When external forces are applied to the ultrasonic fingerprint sensor system 1100 from other components or objects touching the back side of the sensor, acoustic energy may be lost unless a foam backing layer or other protection (e.g., a sensor housing and an air cavity) is provided. Details regarding the foam backing layer 1155 are discussed further with respect to FIGS. 13A-13B.

In FIG. 11B, the stiffener 1160 may serve as a cap and may be coupled to the back side of the ultrasonic fingerprint sensor system 1100. In some implementations, the stiffener 1100 may comprise a wafer, substrate, panel, sub-panel, or one or more layers of plastic, metal, glass, or silicon. In some implementations, the stiffener 1160 may have a high flexural modulus and mechanical strength to structurally and environmentally protect the ultrasonic fingerprint sensing system 1100. The foam backing layer 1155 and the stiffener 1160 may combine to provide the ability to seal the sensor system 1100 from external moisture and to improve moisture protection for higher reliability. In some implementations, an air backing layer may be combined with the foam backing layer 1155 and positioned between the transceiver electrode layer 1145 and the stiffener 1160 to provide additional acoustic isolation.

Figure 11C:
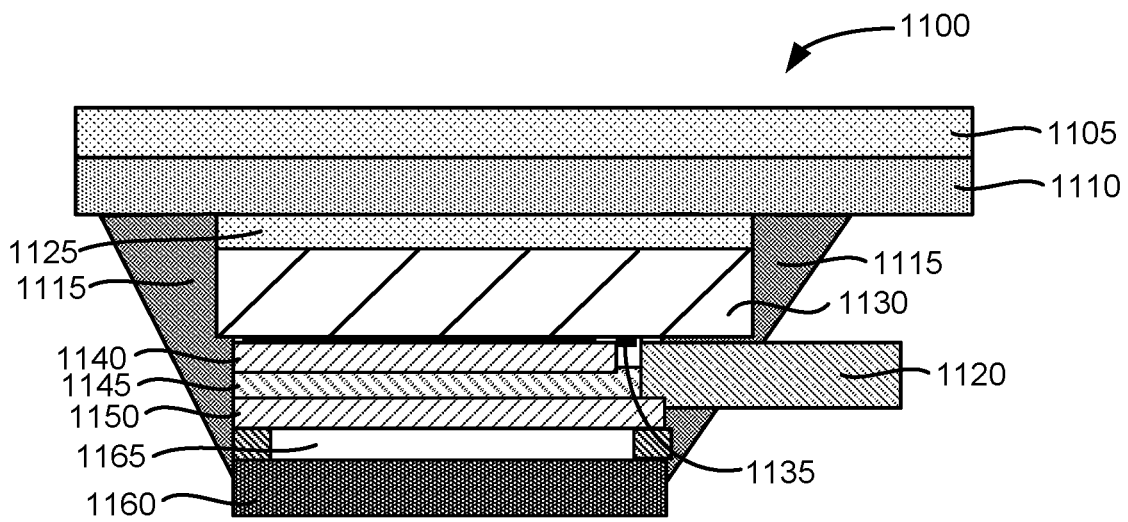

In FIG. 11C, the ultrasonic fingerprint sensor system 1100 further includes a stiffener 1160 and a cavity 1165 relative to the ultrasonic fingerprint sensor system 1100 of FIG. 11A. The cavity 1165 may be an air gap defined between the stiffener 1160 and the passivation layer 1150 of the ultrasonic fingerprint sensor system 1100. One or more spacers may be used to control the gap height or height of the cavity 1165. The cavity 1165 forms an air backing layer that may provide a substantial acoustic impedance mismatch with the piezoelectric transceiver layer 1140, transceiver electrode layer 1145, and passivation layer 1150 so that the cavity 1165 can provide total or near-total reflection of propagating ultrasonic waves. An electrical shield may be further provided on the back side of the ultrasonic fingerprint sensor system 1100 along with the stiffener 1160. In some implementations, the stiffener 1160 may be electrically grounded and serve as an electrical shield.

Figure 11D:
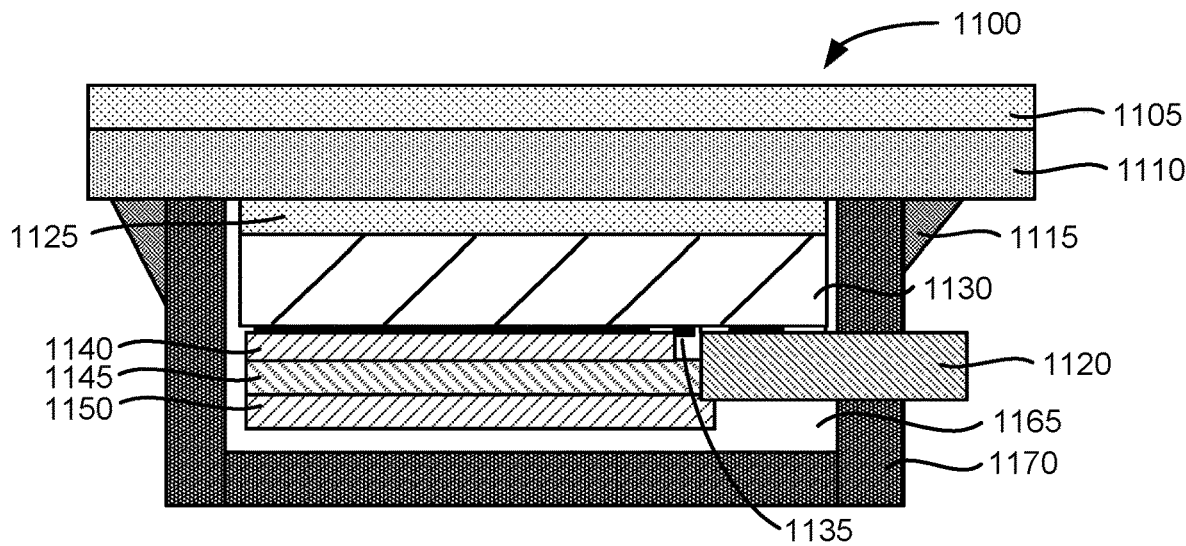

In FIG. 11D, the ultrasonic fingerprint sensor system 1100 further includes a sensor housing 1170 and a cavity 1165 relative to the ultrasonic fingerprint sensor system 1100 of FIG. 11A. The cavity 1165 forms an air gap or air backing layer (also referred to as an "air backer") between the sensor housing 1170 and at least the passivation layer 1150 of the ultrasonic fingerprint sensor system 1100. In some implementations, the sensor housing 1170 includes one or more layers of plastic or metal. The sensor housing 1170 may be disposed on the mechanical stress isolation layer 1110 to provide encapsulation of the ultrasonic fingerprint sensor system 1100. An electrical shield may be provided on the back side of the ultrasonic fingerprint sensor system 1100 along with the sensor housing 1170. As described with respect to FIG. 11C, a stiffener may be electrically grounded and serve as an electrical shield. The stiffener may be included as part of the sensor housing 1170 or on the sensor housing 1170.

Figure 11E:
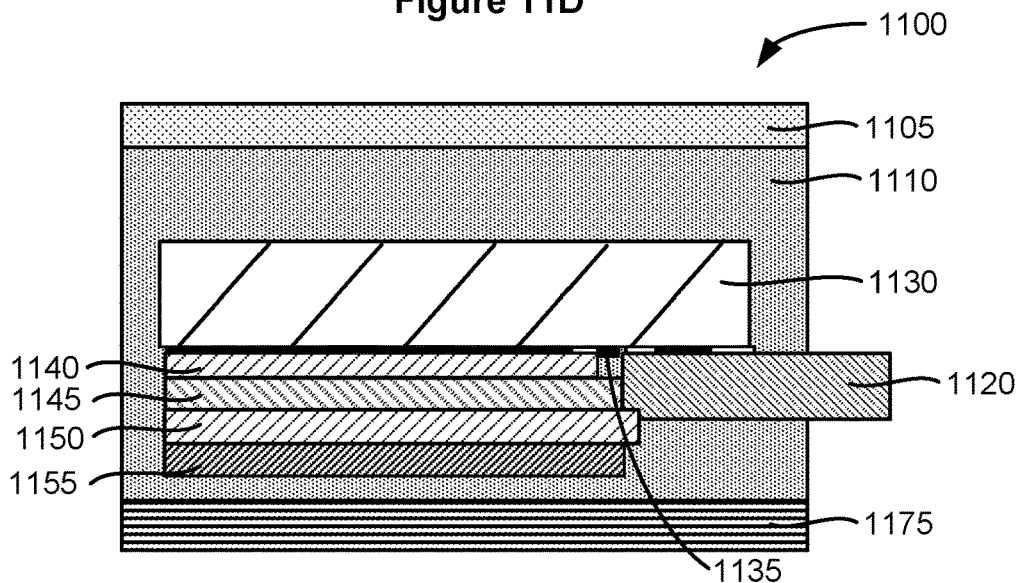
Figure 11F:
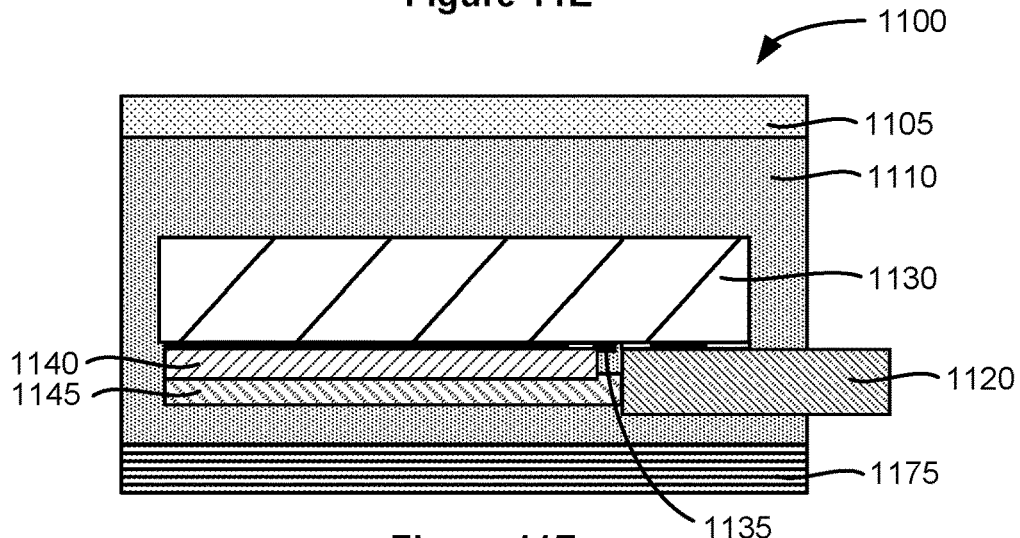

In the ultrasonic fingerprint sensor systems 1100 shown in FIGS. 11E-11F, the mechanical stress isolation layer 1110 may be formed as a molded structure around the ultrasonic fingerprint sensor system 1100. Instead of an adhesive layer positioned between the mechanical stress isolation layer 1110 and the sensor substrate 1130 and instead of an edge seal around the ultrasonic fingerprint sensor system 1100 in the "receiver down" orientation, the mechanical stress isolation layer 1110 may be molded to surround the ultrasonic fingerprint sensor system 1100 as a package. Thus, the mechanical stress isolation layer 1110 is formed on the front side, edges, and back side of the ultrasonic fingerprint sensor system 1100. In some implementations, a cavity may be formed in the molded mechanical stress isolation layer 1110 behind the sensor active area to serve as an air backing layer for improved acoustic isolation.

In FIG. 11E, the ultrasonic fingerprint sensor system 1100 includes a foam backing layer 1155 underlying the passivation layer 1150. The foam backing layer 1155 may serve one or both of a mechanical function (e.g., cushion) and acoustic function (e.g., reflection of ultrasonic waves). An electrical shield 1175 may be disposed on the back side of the ultrasonic fingerprint sensor system 1100, where the mechanical stress isolation layer 1110 on the back side is positioned between the electrical shield 1175 and the foam backing layer 1155. In some implementations, an air backing layer may be combined with the foam backing layer 1155 and both positioned between the transceiver electrode layer 1145 and the backside portion of the molded mechanical stress isolation layer 1110 to provide additional acoustic isolation.

In FIG. 11F, the ultrasonic fingerprint sensor system 1100 includes an electrical shield 1175 underlying the mechanical stress isolation layer 1110 on the back side. However, in contrast to FIG. 11E, the ultrasonic fingerprint sensor system 1100 does not include a foam backing layer or a passivation layer. In some implementations, an air backing layer may be formed in the molded mechanical stress isolation layer 1110 behind the sensor active area.

Figure 12A:
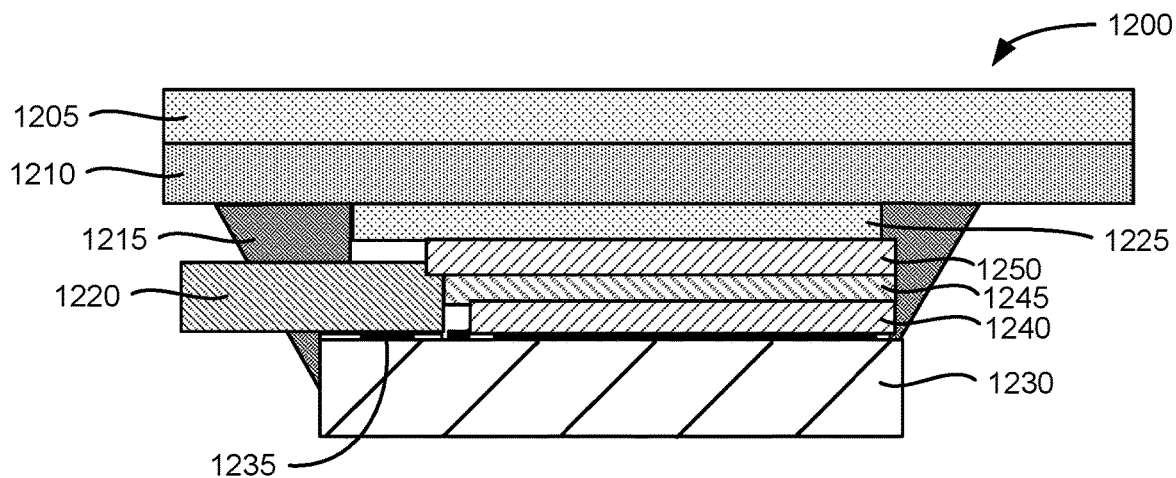
FIGS. 12A-12F show cross-sectional schematic views of various example ultrasonic sensor systems in a "receiver up" orientation according to some implementations.
Figure 12B:
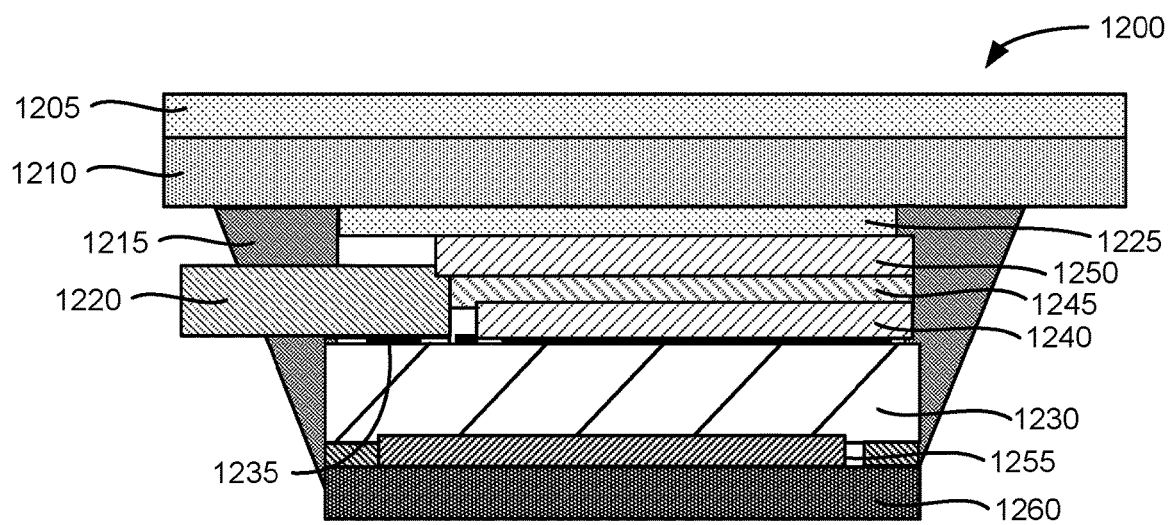
Figure 12C:
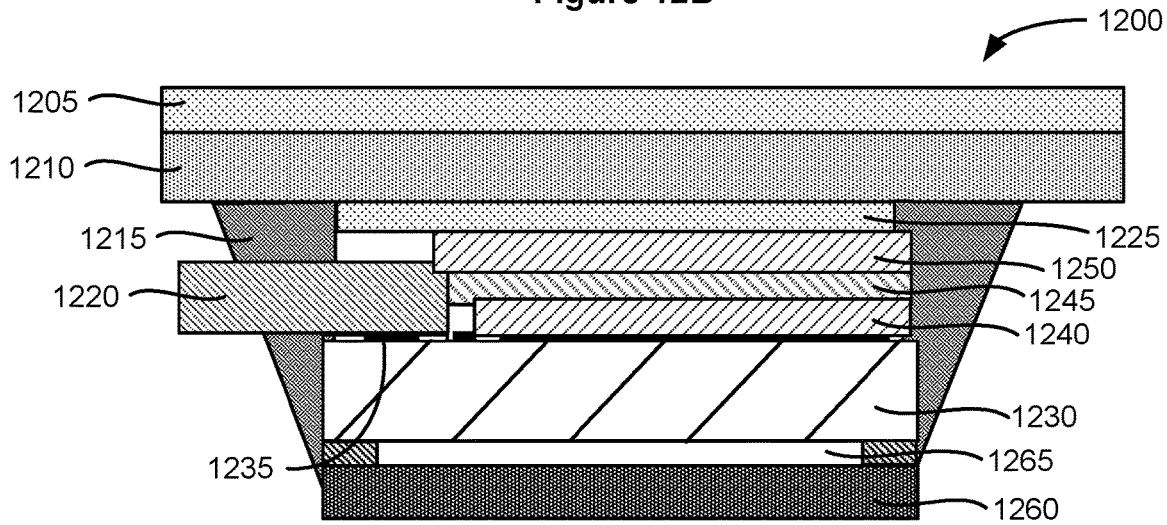
Figure 12D:
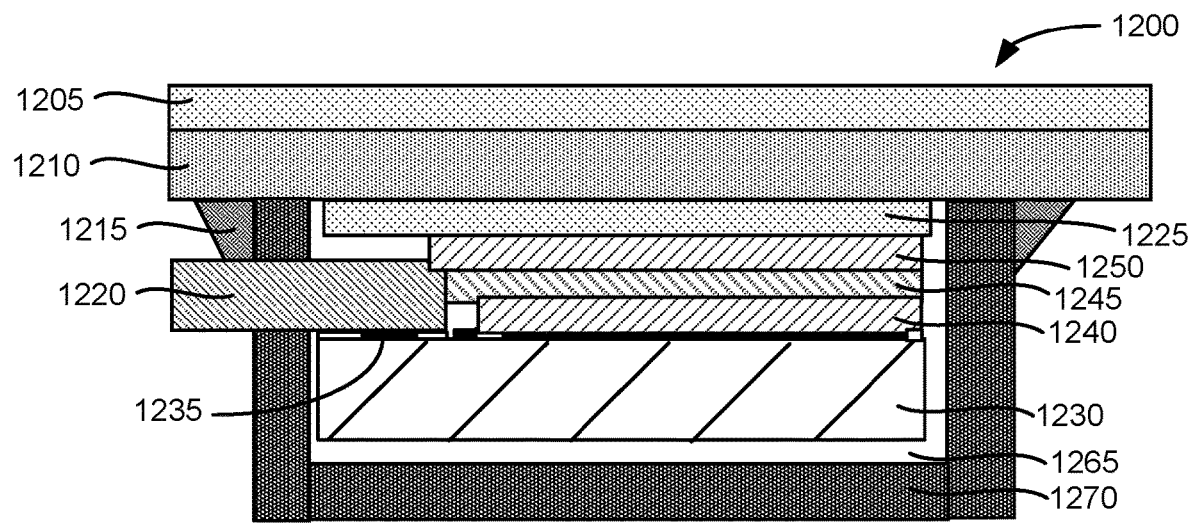
Figure 12E:
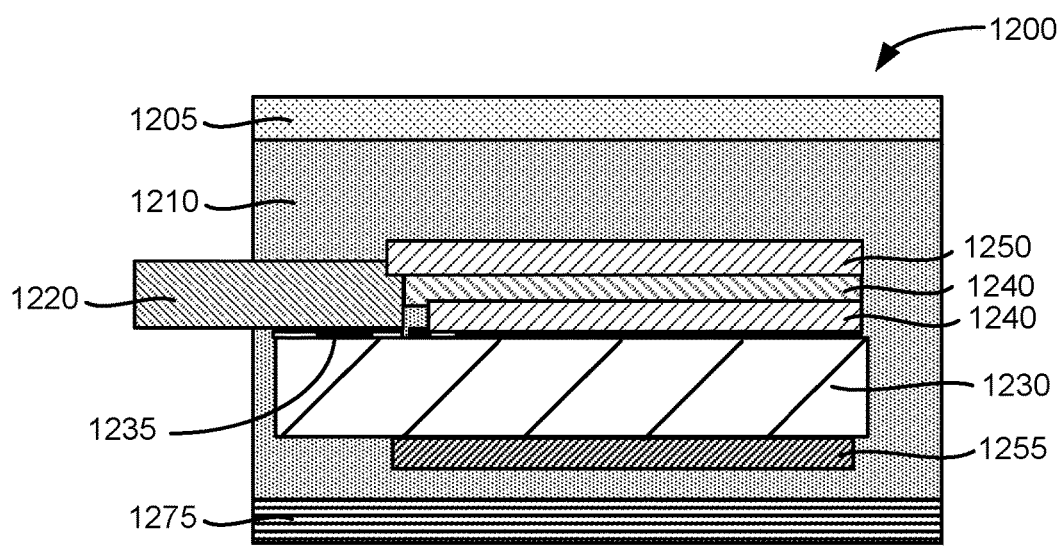
Figure 12F:
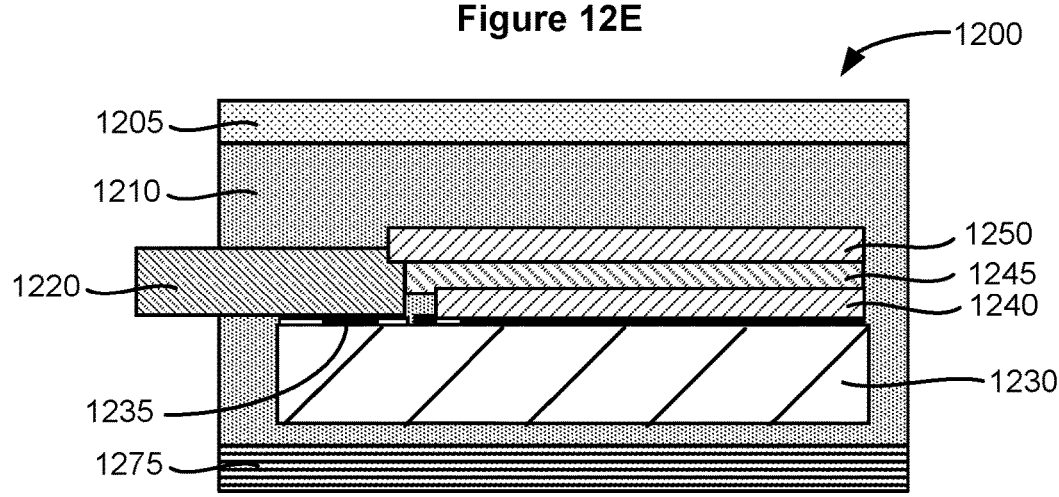

In FIGS. 12A-12F, each of the ultrasonic fingerprint sensor systems 1200 is in a "receiver up" orientation and includes a sensor substrate 1230, a piezoelectric transceiver layer 1240, a transceiver electrode layer 1245, a passivation layer 1250, and an FPC 1220 coupled to the sensor substrate 1230 similar to that shown in FIGS. 11A-11F. Similar to the configurations shown in FIGS. 11A-11D, a mechanical stress isolation layer 1210 may be positioned between at least two adhesive layers 1205, 1225 as shown in FIGS. 12A-12D. Similar to the configurations shown in FIGS. 11E-11F, a mechanical stress isolation layer 1210 may be molded around the ultrasonic fingerprint sensor system 1200 as shown in FIGS. 12E-12F.

The ultrasonic fingerprint sensor system 1200 in the "receiver up" orientation includes the piezoelectric transceiver layer 1240 coupled to and overlying the sensor substrate 1230 with a plurality of sensor pixel circuits 1235 disposed thereon. The transceiver electrode layer 1245 may be coupled to and overlying the piezoelectric transceiver layer 1240, and the passivation layer 1250 may be overlying the transceiver electrode layer 1245 or at least portions of the transceiver electrode layer 1245. In FIG. 12B, a foam backing layer 1255 along with one or both of a stiffener 1260 and an electrical shield underlies the sensor substrate 1230 at the back side of the ultrasonic fingerprint sensor system 1200. In FIG. 12C, a cavity 1265 and one or both of a stiffener 1260 and an electrical shield underlies the sensor substrate 1230 at the back side of the ultrasonic fingerprint sensor system 1200. In FIG. 12D, a cavity 1265 and one or both of a housing 1270 and an electrical shield underlies the sensor substrate 1230 at the back side of the ultrasonic fingerprint sensor system 1200. In FIG. 12E, the mechanical stress isolation layer 1210 may be molded around the ultrasonic fingerprint sensor system 1200, where a foam backing layer 1255 underlies the sensor substrate 1230 and an electrical shield 1275 underlies the mechanical stress isolation layer 1210 at the back side of the ultrasonic fingerprint sensor system 1200. In FIG. 12F, the mechanical stress isolation layer 1210 may be molded around the ultrasonic fingerprint sensor system 1200, where an electrical shield 1275 underlies the mechanical stress isolation layer 1210 at the back side of the ultrasonic fingerprint sensor system 1200. There is no foam backing layer 1255. In some implementations, a cavity may be formed in the molded stress isolation material behind the sensor active area to serve as an air backing layer. In the implementations shown in FIGS. 12B-12D, the stiffener 1260 may be electrically grounded and serve as an electrical shield. In the implementations shown in FIGS. 12E-12F, the electrical shield 1275 may be electrically grounded and serve as a mechanical stiffener.

Figure 13A:
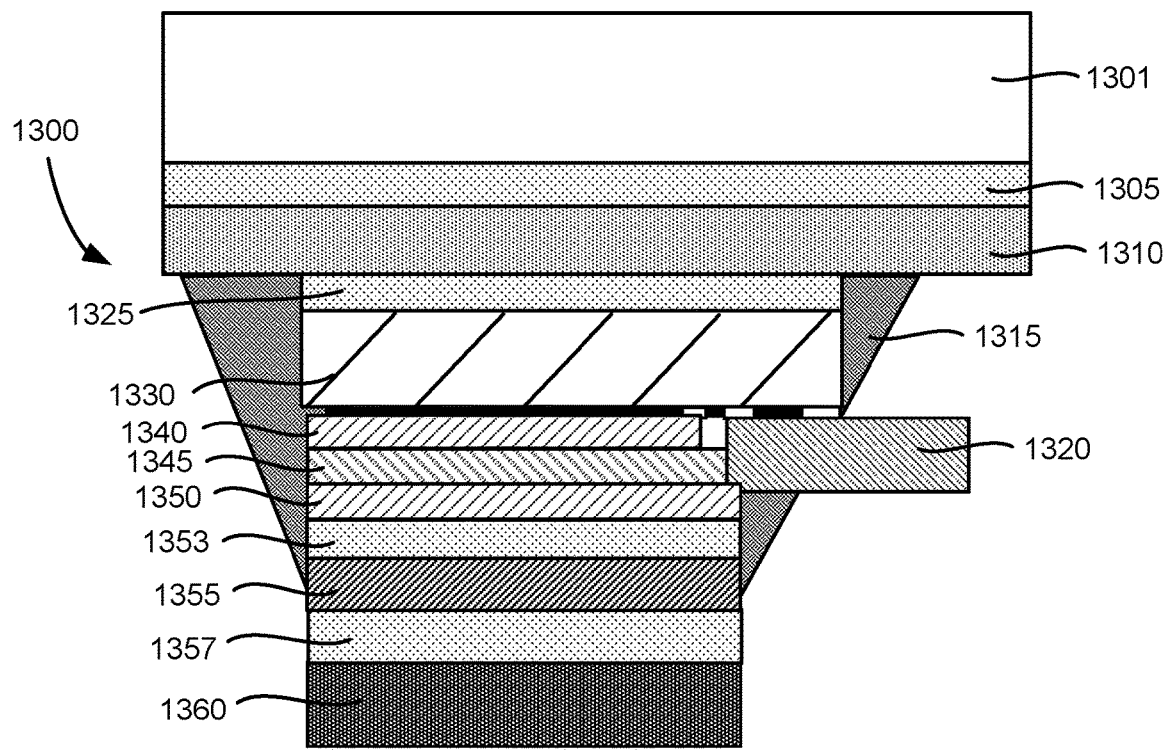
FIGS. 13A-13B show cross-sectional schematic views of various example ultrasonic sensor systems including a foam backing layer according to some implementations.
Figure 13B:
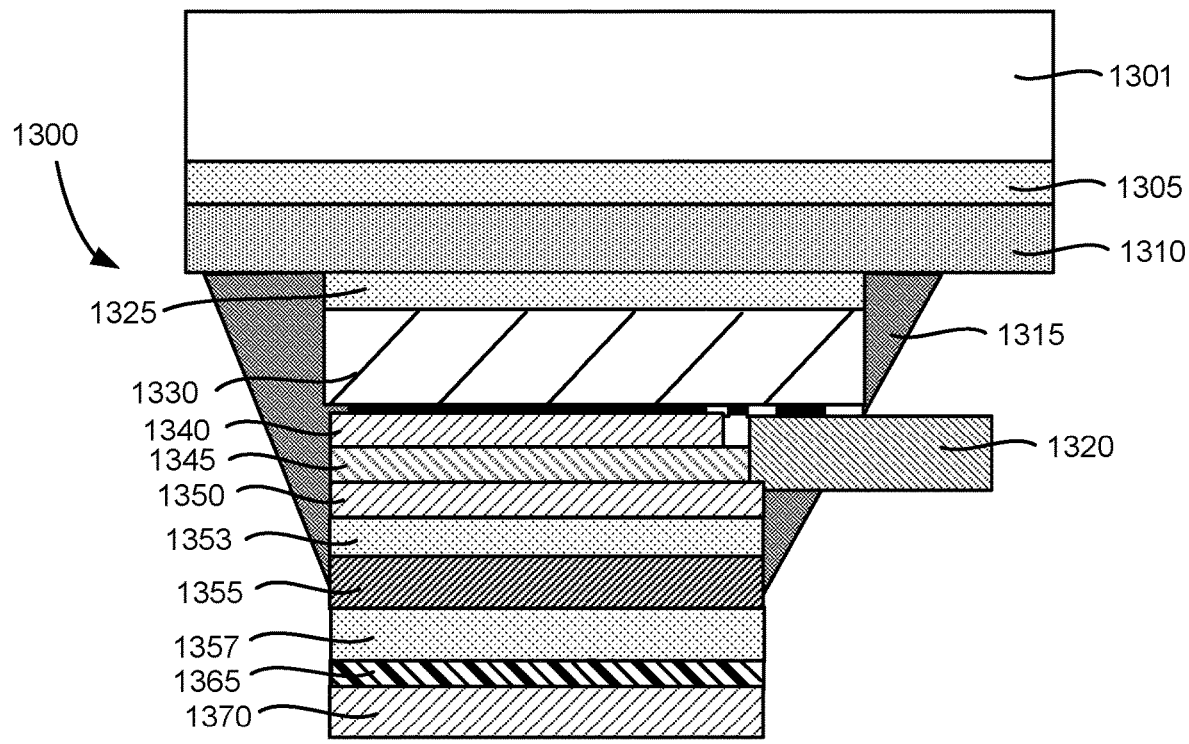

FIGS. 13A-13B show cross-sectional schematic views of various example ultrasonic sensor systems 1300 including a foam backing layer 1355 according to some implementations. The ultrasonic sensor systems 1300 in FIGS. 13A-13B are in a "receiver down" orientation, though it will be understood that the foam backing layer 1355 may be provided also in a "receiver up" orientation. The ultrasonic sensor systems 1300 include at least a sensor substrate 1330, a piezoelectric transceiver layer 1340 coupled to the sensor substrate 1330, a transceiver electrode layer 1345 coupled to the piezoelectric transceiver layer 1340, a passivation layer 1350, and an FPC 1320 coupled to the sensor substrate 1330. In FIGS. 13A-13B, a multi-functional film 1310 may be positioned between the ultrasonic sensor system 1300 and a display 1301. The multi-functional film 1310 may include one or more of a mechanical stress isolation layer, a non-porous light-blocking layer, and a thin electrical shielding layer. In some implementations, the mechanical stress isolation layer, the non-porous light-blocking layer, and the thin electrical shielding layer may be integrated as a single layer or single material. The multi-functional film 1310 may be positioned between at least two adhesive layers 1305, 1325 for attaching or bonding to the ultrasonic sensor system 1300 as well as for attaching or bonding to the display 1301. An edge seal 1315 may be provided around the ultrasonic sensor system 1300 and disposed on the multi-functional film 1310.

In FIGS. 13A-13B, the foam backing layer 1355 underlies the ultrasonic sensor system 1300 at the back side. In some implementations, the foam backing layer 1355 may be attached or bonded to the passivation layer 1350 via an adhesive layer 1353. In some implementations, the adhesive layer 1353 may include a pressure-sensitive adhesive. The foam backing layer 1355 may be sufficiently porous with air pockets to provide total or near-total reflection of ultrasonic waves. In some implementations, the foam backing layer 1355 may have a thickness between about 10 µm and about 500 µm, or between about 50 µm and about 200 µm. In some implementations, the foam backing layer 1355 may include a substantially non-transparent polymer material, such as a substantially non-transparent polypropylene foam material. For example, the substantially non-transparent polypropylene foam material may be one of an SCF-400 series of foam materials manufactured by the Nitto Denko Corporation in Osaka, Japan. Closed cell foam or semi-closed cell foam for use in the foam backing layer 1355 allows improved edge seal and acoustic performance in that the edge sealant is restrained from entering the foam and altering the acoustic impedance of the foam backing layer 1355.

In FIG. 13A, one or both of a stiffener 1360 and an electrical shield underlies the foam backing layer. One or both of the stiffener 1360 and the electrical shield may be attached or bonded to the foam backing layer 1355 via an adhesive layer 1357. In FIG. 13B, a plastic layer 1365 underlies the foam backing layer 1355, and a metal layer 1370 underlies the plastic layer 1365. The plastic layer 1365 is attached or bonded to the foam backing layer 1355 via an adhesive layer 1357.

More and more electronic devices include materials that are compatible with flexible display devices and flexible electronics. Incorporation of organic materials in display devices can introduce mechanical flexibility to the devices. In some implementations, the ultrasonic sensor systems as described herein may be implemented as a flexible ultrasonic sensor system. In some implementations, the flexible ultrasonic sensor system may include a flexible substrate including a polymer material, such as polyimide, PEN or PET. In some implementations, the flexible substrate may include a thin layer of stainless steel, a stainless steel foil, thinned glass, thinned silicon, thin-film silicon, or other flexible material. The thickness of the flexible substrates may be below about 250 μm and in some examples below about 100 μm and in some examples between about 50 μm and about 100 μm with TFT or CMOS circuitry formed in or on the flexible substrates. The flexible substrates may be suitable for use with flexible displays, curved displays, curved cover glass, and emerging 2.5D and three-dimensional displays. Flexible substrates may allow the ultrasonic sensor system to cover an entire active area or substantially an entire active area of the display.

Figure 14A:
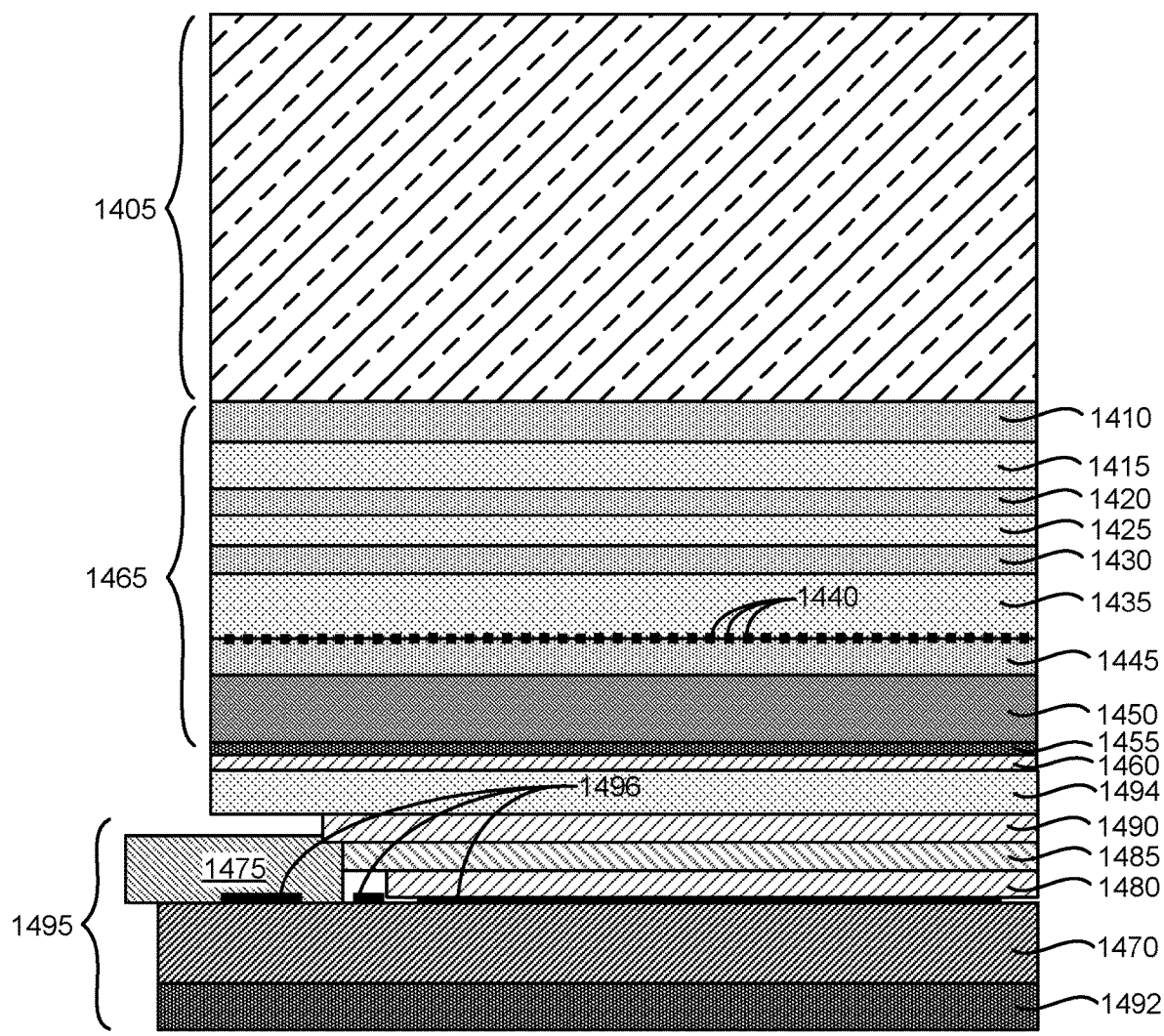
FIG. 14A shows a cross-sectional schematic view of an example flexible ultrasonic sensor system in a "receiver up" orientation according to some implementations.

FIG. 14A shows a cross-sectional schematic view of an example flexible ultrasonic sensor system 1495 in a "receiver up" orientation according to some implementations. The flexible ultrasonic sensor system 1495 underlies a display 1465 with an adhesive 1494 positioned between the flexible ultrasonic sensor system 1495 and the display 1465. In some implementations, the adhesive 1494 may be a pressure-sensitive adhesive or an epoxy-based adhesive. The display 1465 may underlie a platen or cover glass 1405. In some implementations, the display 1465 may include an OLED display or an AMOLED display or a pOLED (plastic OLED) also called as a flexible OLED display. In some implementations, an electrical shielding layer 1460 may be positioned between the display 1465 and the adhesive 1494. For example, the electrical shielding layer 1460 may include an electrically conductive material such as a metal coating. In some implementations, a light-blocking layer 1455 may be positioned between the display 1465 and the adhesive 1494.

The flexible ultrasonic sensor system 1495 in the "receiver up" orientation may include a flexible substrate 1470 having a plurality of sensor pixel circuits 1496 disposed thereon. A piezoelectric transceiver layer 1480 may be coupled to and disposed on the flexible substrate 1470. An electrode layer 1485 may be coupled to and disposed on the piezoelectric transceiver layer 1480, and a passivation layer 1490 disposed on at least a portion of the electrode layer 1485. An FPC 1475 may be electrically and mechanically coupled to the flexible substrate 1470. The flexible ultrasonic sensor system 1495 may further include an optional backing layer 1492 on the back side of the flexible ultrasonic sensor system 1495. The backing layer 1492 may include one or both of an optically non-transparent layer and an electrically conductive blocking layer to serve a light-blocking function and/or an electrical shielding function.

Generation of a strong transmission-side pressure wave may facilitate the flexible ultrasonic sensor system 1495 to be effective. The strong transmission-side pressure wave may be generated by designing film stacks with strong acoustic impedance mismatch interfaces for reflecting ultrasonic waves. The strong acoustic pressure creates greater reflection of ultrasonic waves for improving the quality of ultrasonic imaging. A strong acoustic impedance mismatch between layers of materials can result in total or near-total reflection of ultrasonic waves. By way of an example, an interface between air and plastic creates a low acoustic impedance mismatch whereas an interface between air and metal or glass creates a high acoustic impedance mismatch.

Layers or materials with high acoustic impedance values may be referred to herein as "hard" materials, and layers or materials with low acoustic impedance values may be referred to herein as "soft" materials. Acoustic impedance values may be measured in MRayls. Table 1 below lists a series of materials and their acoustic impedance values. High acoustic impedance values may be greater than about 5.0 MRayls, and low acoustic impedance values may be between about 0.0 MRayls and about 5.0 MRayls. Generally, metals, ceramics and glasses may be considered to have high acoustic impedance values; plastics and polymers may be considered to have low acoustic impedance values; and air may be considered to have a very low acoustic impedance value.

TABLE 1

| Material | Acoustic Impedance (MRayl) |
| --- | --- |
| Stainless Steel | 45.7 |
| Copper | 39.1 |
| Glass | 13.1 |
| Silver Ink | 8.9 |
| Piezoelectric Polymer | 4.0 |
| Epoxy | 3.4 |
| PET (polyethylene terephthalate) | 3.3 |
| Passivation Epoly Film | 3.1 |
| Pressure-Sensitive Adhesive | 2.0 |
| Air | 0.0 |

Figure 14B:
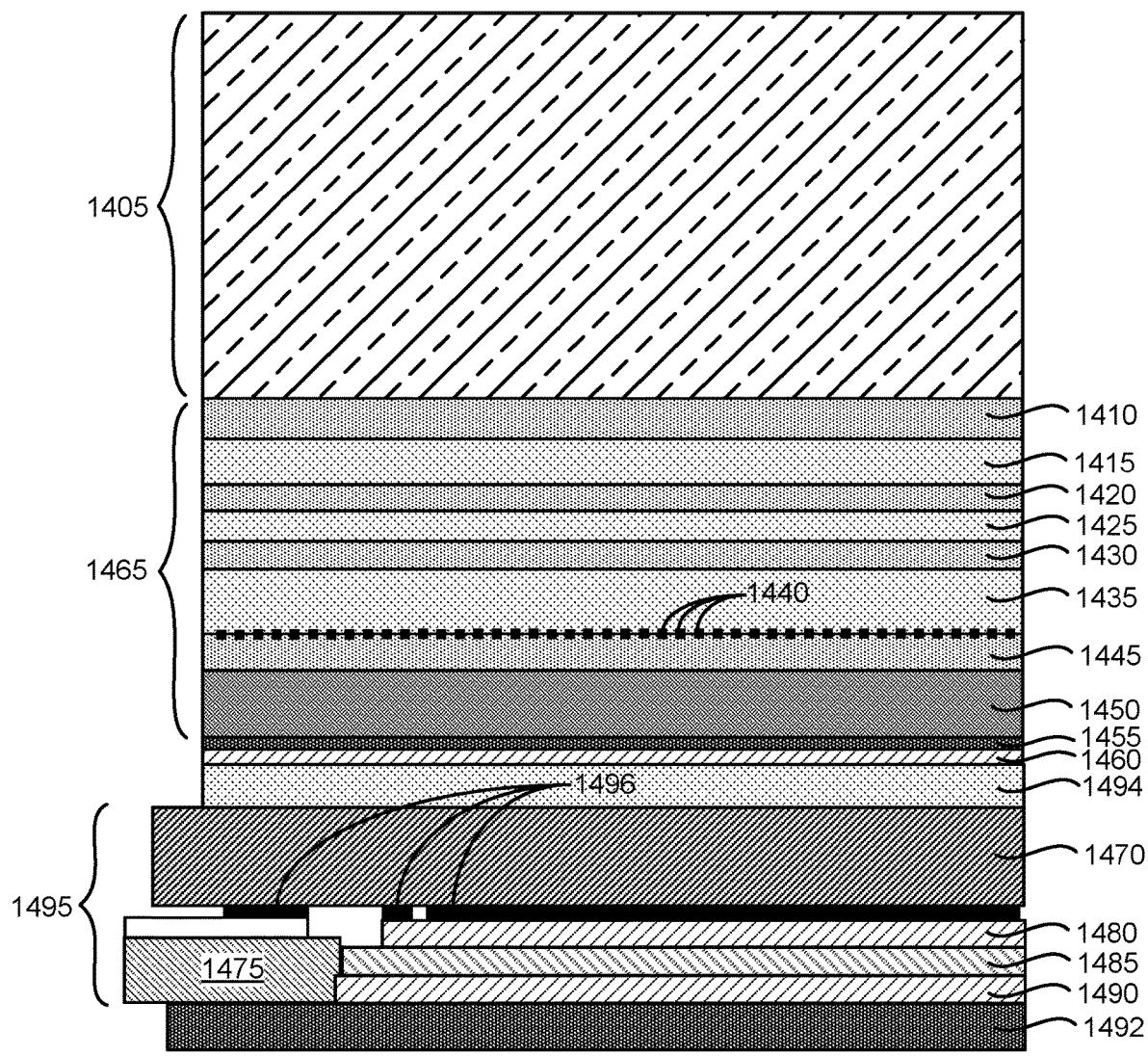
FIG. 14B shows a cross-sectional schematic view of an example flexible ultrasonic sensor system in a "receiver down" orientation according to some implementations.

In FIGS. 14A and 14B, an acoustic impedance mismatch between the flexible substrate 1470 and layers 1410, 1415, 1420, 1425, 1430, 1435, and 1445 may not be sufficient or significant enough to create a strong transmission-side pressure wave. Whereas non-flexible ultrasonic sensor systems may include a "hard" substrate material such as glass adjacent to a piezoelectric transceiver layer 1480, the flexible ultrasonic sensor system 1495 may compensate by incorporating "hard" materials between the piezoelectric transceiver layer 1480 and the display 1465 and/or between the piezoelectric transceiver layer 1480 and a back side of the flexible ultrasonic sensor system 1495. Incorporation of a layer with a high acoustic impedance value to create a strong acoustic impedance mismatch may facilitate generation of the strong transmission-side pressure wave. In some implementations, the layer with the high acoustic impedance value may be between the display 1465 and the piezoelectric transceiver layer 1480. In addition or in the alternative, a layer with a high acoustic impedance value may be between the piezoelectric layer 1480 and the back side of the flexible ultrasonic sensor system 1495.

In FIG. 14A, in some implementations, the light-blocking layer 1455 may include a material with a high acoustic impedance value. In some implementations, the electrical shielding layer 1460 may include a material with a high acoustic impedance value. One or both of the light-blocking layer 1455 and the electrical shielding layer 1460 may provide a high acoustic impedance mismatch at an interface with the adhesive 1494 or the piezoelectric transceiver layer 1480. The adhesive 1494 and/or the piezoelectric transceiver layer 1480 may include a "soft" material that has a low acoustic impedance value. In some implementations, the electrode layer 1485 may include a material with a high acoustic impedance value. The electrode layer 1485 may provide a high acoustic impedance mismatch at an interface with the piezoelectric transceiver layer 1480. Examples of materials with high acoustic impedance values are shown above, which can include but are not limited to copper, plated electrodes, or filled materials like silver ink. The high acoustic impedance values may result in an acoustic impedance mismatch that is substantial enough to result in total or near-total reflection of ultrasonic waves.

In some implementations, the backing layer 1492 may have a high acoustic impedance. Thus, underlying the flexible substrate 1470 is a layer with a high acoustic impedance, which provides a substantial acoustic impedance mismatch with one or more adjacent layers or materials (e.g., air). For example, where the backing layer 1492 forms an interface with air, the acoustic impedance mismatch can be substantial enough to result in total or near-total reflection of ultrasonic waves. Generally speaking, air at the interface provides a readily available boundary condition for reflection of ultrasonic waves.

FIG. 14B shows a cross-sectional schematic view of an example flexible ultrasonic sensor system 1495 in a "receiver down" orientation according to some implementations. The flexible ultrasonic sensor system 1495 underlies a display 1465 with an adhesive 1494 positioned between the flexible ultrasonic sensor system 1495 and the display 1465. In some implementations, the adhesive 1494 may be a pressure-sensitive adhesive or an epoxy-based adhesive. The display 1465 may underlie a platen or cover glass 1405. In some implementations, the display 1465 may include an OLED display or an AMOLED display. In some implementations, an electrical shielding layer 1460 may be positioned between the display 1465 and the adhesive 1494. For example, the electrical shielding layer 1460 may include an electrically conductive material such as a metal coating. In some implementations, a light-blocking layer 1455 may be positioned between the display 1465 and the adhesive 1494.

The flexible ultrasonic sensor system 1495 in the "receiver down" orientation may include a flexible substrate 1470 having a plurality of sensor pixel circuits 1496 disposed on a side of the flexible substrate 1470 facing away from the display 1465. A piezoelectric transceiver layer 1480 may be coupled to and underlie the flexible substrate 1470. An electrode layer 1485 may be coupled to and underlie the piezoelectric transceiver layer 1480, and a passivation layer 1490 may underlie at least a portion of the electrode layer 1485. An FPC 1475 may be coupled to and underlie the flexible substrate 1470. The flexible ultrasonic sensor system 1495 may further include an optional backing layer 1492 on the back side of the flexible ultrasonic sensor system 1495. The backing layer 1492 may include one or both of an optically non-transparent layer and an electrically conductive blocking layer to serve a light-blocking function and/or an electrical shielding function.

In FIG. 14B, in some implementations, the light-blocking layer 1455 may include a material with a high acoustic impedance value. In some implementations, the electrical shielding layer 1460 may include a material with a high acoustic impedance value. One or both of the light-blocking layer 1455 and the electrical shielding layer 1460 may provide a high acoustic impedance mismatch at an interface with the adhesive 1494 or the flexible substrate 1470. The adhesive 1494 and/or the flexible substrate 1470 may include a "soft" material that has a low acoustic impedance value. In some implementations, the array of pixel circuits 1496 may be plated or coated with a metal or "hard" material that has a high acoustic impedance value to provide a high acoustic impedance mismatch at an interface with the piezoelectric transceiver layer 1480. In some implementations, a layer (not shown) between the flexible substrate 1470 and the adhesive 1494 may include a material with a high acoustic impedance value. Examples of materials with high acoustic impedance values are shown above, which can include but are not limited to copper, plated electrodes, or filled materials like silver ink. The high acoustic impedance values may result in an acoustic impedance mismatch that is substantial enough to result in total or near-total reflection of ultrasonic waves.

Underlying the piezoelectric transceiver layer 1480 may be one or more layers of "hard" materials. In some implementations, the electrode layer 1485 may include a material with a high acoustic impedance value. The electrode layer 1485 may provide a high acoustic impedance mismatch at an interface with the piezoelectric transceiver layer 1480. In some implementations, the backing layer 1492 may have a high acoustic impedance. Thus, underlying the piezoelectric transceiver layer 1480 is a layer with a high acoustic impedance, which provides a substantial acoustic impedance mismatch with one or more adjacent layers or materials (e.g., air). For example, where the backing layer 1492 forms an interface with air, the acoustic impedance mismatch can be substantial enough to result in total or near-total reflection of ultrasonic waves.

The flexible ultrasonic sensor system enables the production of large area sensors. In some implementations, the flexible substrate spans across an entire active area of the display. In some implementations, the TFT array of sensor pixel circuits and the piezoelectric transceiver layer spans across the entire active area of the display. The piezoelectric transceiver layer and the plurality of sensor pixel circuits disposed upon the flexible substrate are not necessarily localized to a particular area of the display. Rather, the substrate upon which the piezoelectric transceiver layer and the plurality of sensor pixel circuits disposed thereon may span across the display. Flexible ultrasonic sensor systems may cover an entire active area of the display due at least in part to the ease of laminating a flexible substrate compared to a rigid substrate. Authentication of a user via acquiring and authenticating a fingerprint image need not be performed at a specific region of the display, allowing for continuous authentication anywhere on the display of the display device.

Figure 15:
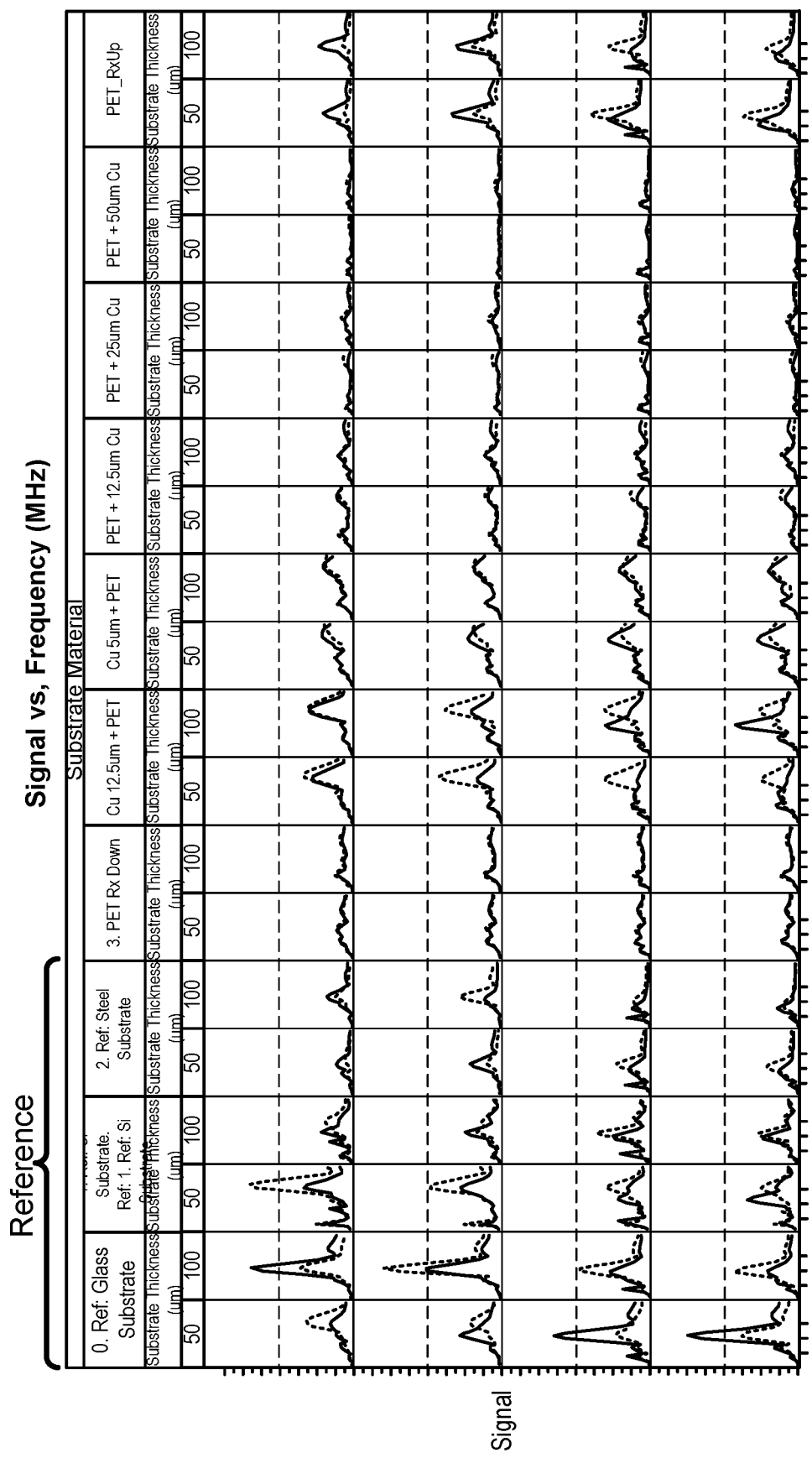
FIG. 15 shows data of reflected acoustic signals in "soft" and "hard" substrates and with different layers overlying and/or underlying the "soft" substrates.

FIG. 15 shows simulated data of reflected acoustic signals in "soft" and "hard" substrates and with different layers overlying and/or underlying the "soft" substrates. The data in FIG. 15 shows a percentage of reflected acoustic signals through a series of materials as a function of transmitter frequency. Each of the series of materials includes at least a substrate material, an electrode material and a passivation material. Each of the series of materials further includes a piezoelectric material. An electrode material in FIG. 15 made of copper has a thickness of either 9 μm or 15 μm. A passivation material in FIG. 15 has a thickness of either 0.1 μm or 12.5 μm. The "reference" data in FIG. 15 shows the percentage of reflected acoustic signals in a glass substrate, a silicon substrate, and a stainless steel substrate. The percentage of reflected acoustic signals in the "reference" data is relatively high, particularly for the glass substrate and the silicon substrate.

The percentage of reflected acoustic signals for a PET substrate where the series of materials are arranged in a "receiver down" orientation is reduced. The addition of a plated metal over the PET substrate substantially increases the percentage of reflected acoustic signals in the "receiver down" orientation, where the plated metal includes either 12.5 μm of copper or 5 μm of copper. Adding a metal film between the display and the PET substrate, however, did not increase the percentage of reflected acoustic signals. When the series of materials are arranged in a "receiver up" orientation, the percentage of reflected acoustic signals for the PET substrate is relatively high. Without being limited by any theory, the interface with the electrode layer and the interface with air in the "receiver up" orientation provide substantial acoustic impedance mismatches that provided greater reflection of acoustic signals.

FIGS. 16A-16D show cross-sectional schematic views of various example devices 1600 including a display 1610 and incorporating a light-blocking layer 1615, an electrical shielding layer 1620, and an ultrasonic sensor system 1630 underlying the display 1610. Each of the different implementations in FIGS. 16A-16D represent different ways of modifying or manufacturing a display 1610 to attach or bond an ultrasonic sensor system 1630 underlying the display 1610.

Figure 16A:
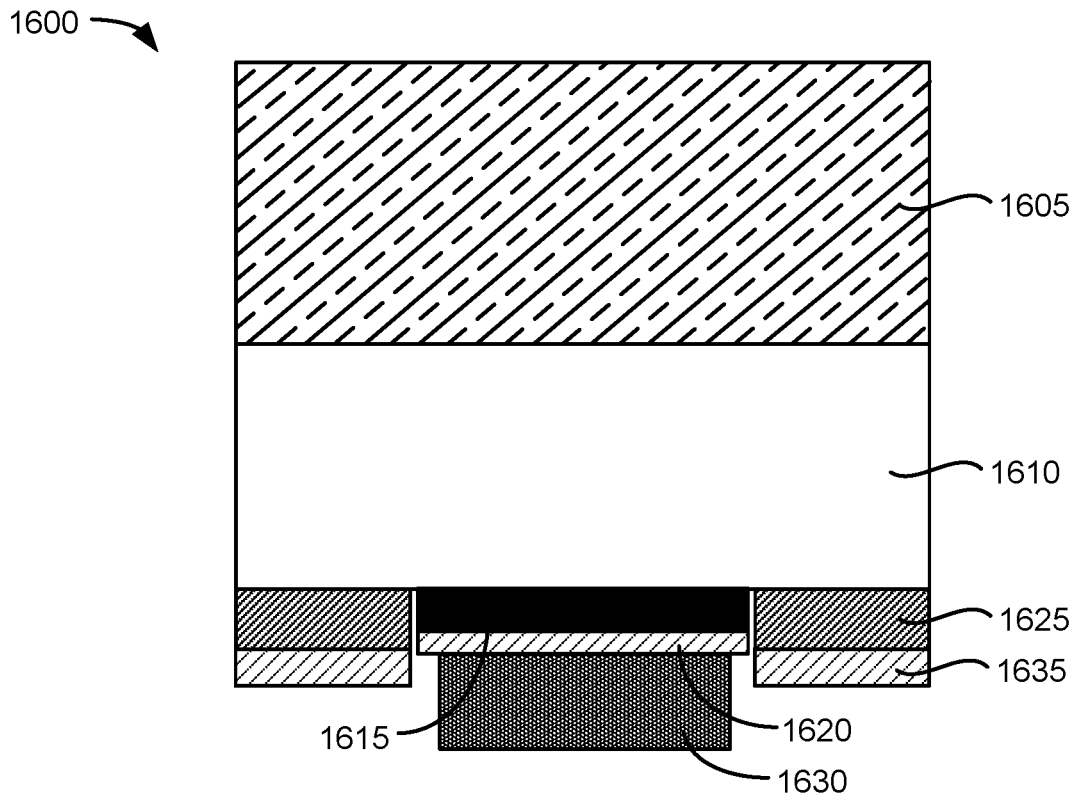
FIGS. 16A-16D show cross-sectional schematic views of various example devices including a display and incorporating a light-blocking layer, an electrical shielding layer, and an ultrasonic sensor system underlying the display.

In FIG. 16A, the display may include a porous black foam as a second light-blocking layer 1625 and a thick copper tape as a second electrical shielding layer 1635. At least a portion of the porous black foam and the thick copper tape may be removed to form a cut-out region to expose the back side of the display 1610. A first light-blocking layer 1615, such as a non-porous opaque plastic material, may be bonded to the back side of the display 1610. A first electrical shielding layer 1620, such as a thin metal layer or a metalized plastic, may be bonded to the back side of the first light-blocking layer 1615. An ultrasonic sensor system 1630 as described earlier herein in FIGS. 8B, 9B, 10A-10B, 11A-11F, 12A-12F, 13A-13B, and 14A-14B may be bonded to the back side of the first electrical shielding layer 1620.

Figure 16B:
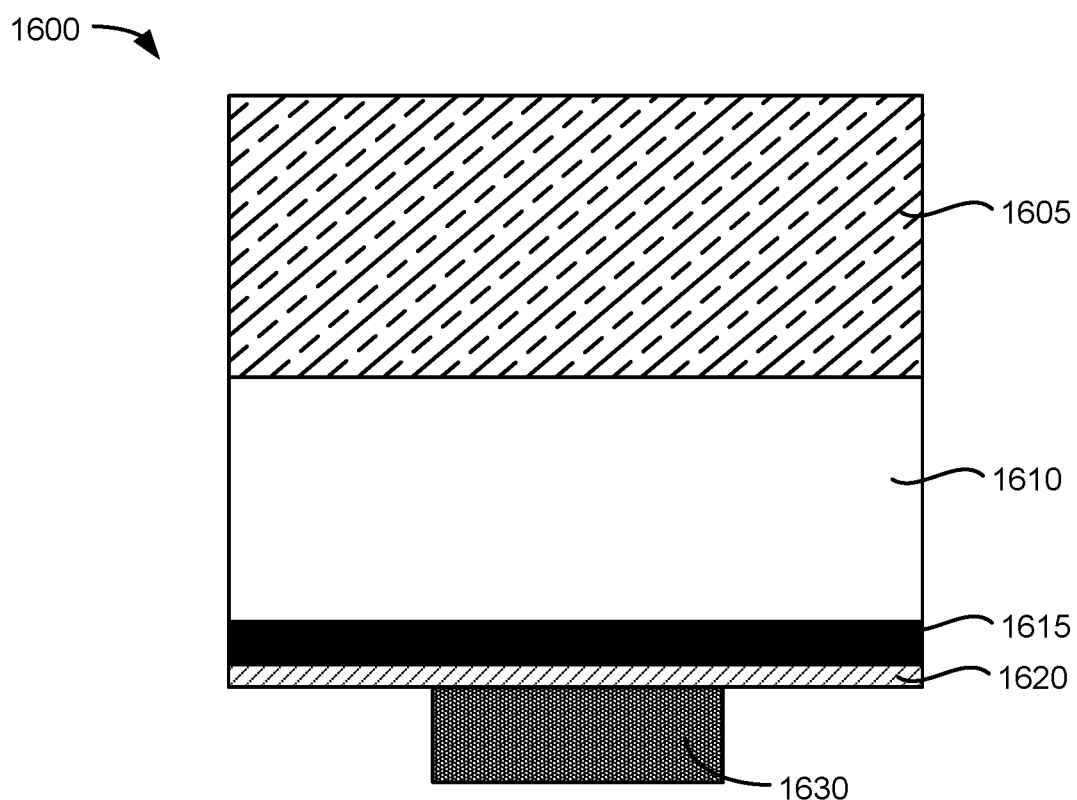

In FIG. 16B, the porous black foam as the second light-blocking layer 1625 and the thick copper tape as the second electrical shielding layer 1635 is entirely removed or never provided on the back side of the display 1610. In such implementations, the first light-blocking layer 1615, such as a non-porous opaque plastic material, may be bonded directly to the back side of the display 1610. A first electrical shielding layer 1620, such as a thin metal layer or a metalized plastic layer, may be bonded to the back side of the first light-blocking layer 1615. The first light-blocking layer 1615 and the first electrical shielding layer 1620 are not necessarily localized to a region in the display 1610, but may span across an entire active area of the display 1610. An ultrasonic sensor system 1630 as described earlier herein in FIGS. 8B, 9B, 10A-10B, 11A-11F, 12A-12F, 13A-13B, and 14A-14B may be bonded to the back side of the first electrical shielding layer 1620.

Figure 16C:
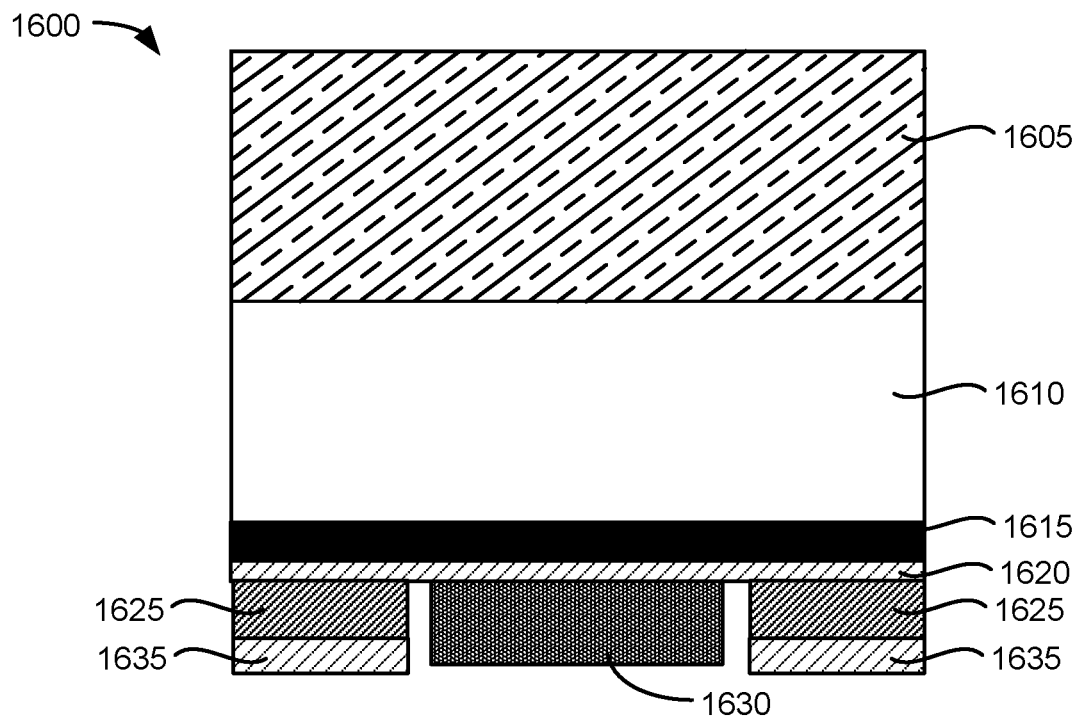

In FIG. 16C, a porous black foam and a thick copper tape may be provided with or subsequent to bonding the first light-blocking layer 1615 and the first electrical shielding layer 1620 to the back side of the display 1610. The porous black foam as a second light-blocking layer 1625 and the thick copper tape as a second electrical shielding layer 1635 may be provided on portions of the first electrical shielding layer 1620. An ultrasonic sensor system 1630 as described earlier herein in FIGS. 8B, 9B, 10A-10B, 11A-11F, 12A-12F, 13A-13B, and 14A-14B may be bonded to the back side of the first electrical shielding layer 1620. Such an arrangement in FIG. 16C may offer additional protection against light interference and electrical interference with the ultrasonic sensor system 1630.

Figure 16D:
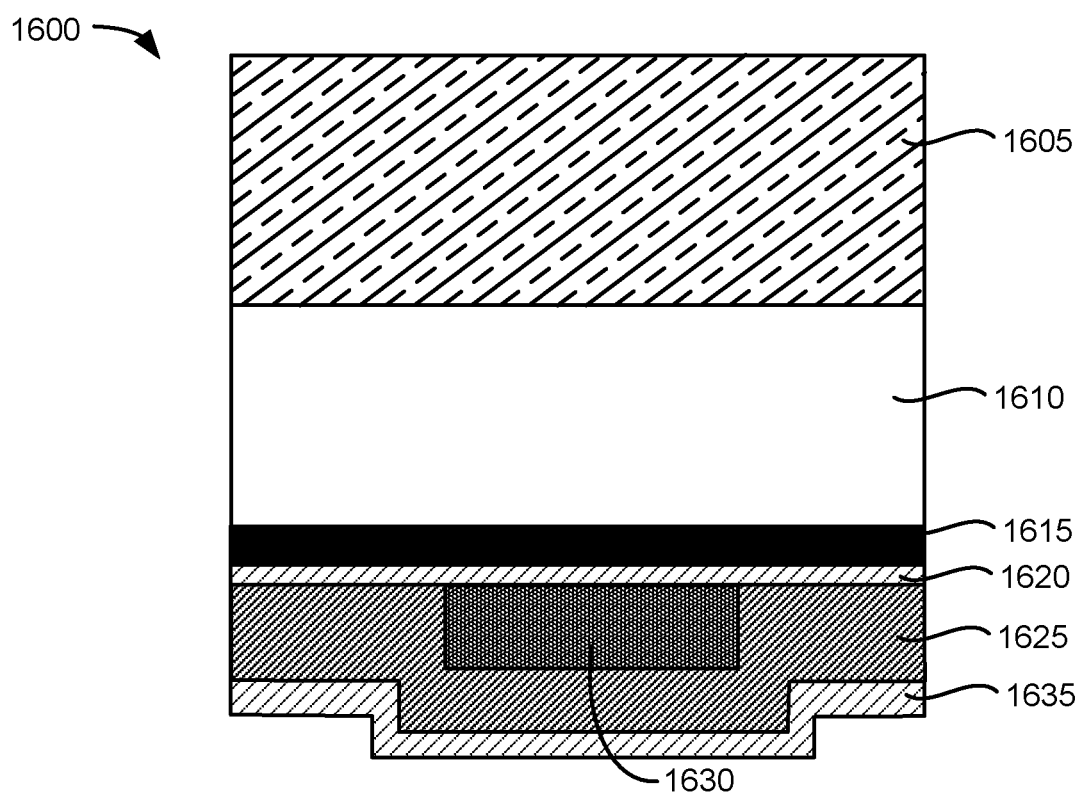

In FIG. 16D, a porous black foam and a thick copper tape may be provided with or subsequent to bonding the first light-blocking layer 1615 and the first electrical shielding layer 1620 to the back side of the display 1610. The porous black foam as a second light-blocking layer 1625 and the thick copper tape as a second electrical shielding layer 1635 may be disposed on the back side of the first electrical shielding layer 1620. Unlike in FIG. 16C, the porous black foam and the thick copper tape in FIG. 16D cover an ultrasonic sensor system 1630 at the back side. An ultrasonic sensor system 1630 as described earlier herein in FIGS. 8B, 9B, 10A-10B, 11A-11F, 12A-12F, 13A-13B, and 14A-14B may be bonded to the back side of the first electrical shielding layer 1620. Such an arrangement in FIG. 16D may offer additional protection against light interference and electrical interference with the ultrasonic sensor system 1630. Note that the dimensions of the features in FIGS. 16A-16D, as elsewhere in this disclosure, may not be drawn to scale. For example, the thickness of the ultrasonic fingerprint sensor system 1630 may be appreciably thinner than the porous black foam and thinner than the layers in the display stack.

In some implementations, a midframe that supports the display and other electronic components in a phone assembly may be modified to serve as a protective cap over the ultrasonic fingerprint sensor system. The protective cap region may be supported with a porous black foam layer and an adhesive layer that has cut-out regions for the ultrasonic fingerprint sensor system and may surround the ultrasonic fingerprint sensor system on each of the four sides and the back. A layer of selectively configured copper tape may be included between the porous black foam layer and the midframe. The midframe may serve as a sensor housing. The midframe may allow a cavity or an air backing layer to be formed between the ultrasonic fingerprint sensor system and an inner surface of the midframe. The midframe may be contoured, stamped or otherwise formed to provide a suitable cavity region between the display and the midframe for the ultrasonic fingerprint sensor to reside. In some implementations, a foam backing layer may be included in the cavity region with or without an air backing layer. In some implementations, an opening may be provided in the phone midframe to accommodate the ultrasonic fingerprint sensing system and associated layers. In some implementations, a portion of an FPC associated with the ultrasonic fingerprint sensing system may be positioned over the opening in the midframe to provide a cap for the sensing system.

One or more of the electrical shielding layer, the light-blocking layer and the mechanical stress isolation layer may serve a thermal function by providing for improved heat dissipation and better temperature uniformity at the back of the display. Heat may be non-uniformly generated, for example, from portions of the display or from nearby components such as batteries in a mobile device. In some implementations, a single layer or a composite layer of selected materials positioned between the display and the ultrasonic sensor system may serve the thermal function. For example, a single layer of copper may provide electrical shielding, light blocking and stress isolation capability, in addition to thermal heat spreading and heat dissipation functions for improved display performance. In another example, a layer of graphene with or without other electrical shielding layers, light-blocking layers or mechanical stress isolation layers may serve the thermal function.

One or more acoustic matching layers may be included in the ultrasonic fingerprint sensor system to minimize acoustic reflections within the sensor stack and between the sensor stack and the OLED display. For example, one or more acoustic matching layers may be inserted between any of the passivation layer, piezoelectric layer, electrode layer, substrate layer, light-blocking layer, electrical shielding layer, mechanical stress isolation layer, thermally conductive layer or adhesive layers to improve the acoustic performance of the sensor stack.

Figure 17:
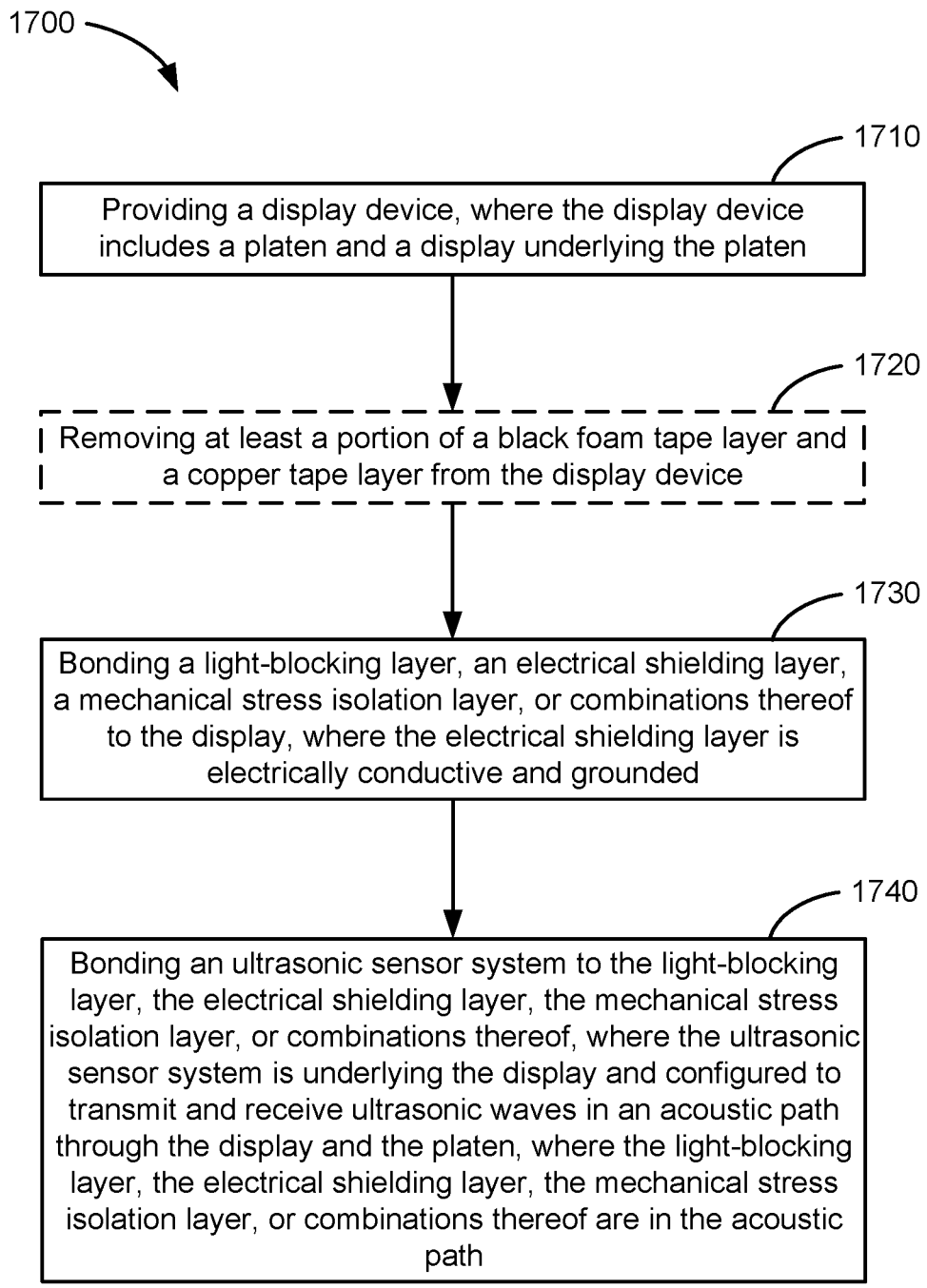
FIG. 17 shows an example method of manufacturing an apparatus including an ultrasonic sensor system underlying a display.

FIG. 17 shows an example method of manufacturing an apparatus including an ultrasonic sensor system underlying a display. The process 1700 may be performed in a different order or with different, fewer or additional operations.

At block 1710 of the process 1700, a display device is provided where the display device includes a platen and a display underlying the platen. In some implementations, the platen may include a cover glass, a cover lens, or an outer layer of the display or any associated touchscreen. In some implementations, the display may include an OLED display or an AMOLED display. In some implementations, the display may include a black foam tape layer and a copper tape layer on a back side of the display.

At block 1720 of the process 1700, at least a portion of the black foam tape layer and the copper tape layer is optionally removed from the display device. This can expose the back side of the display. In some implementations, the black foam tape layer is sufficiently porous to prevent effective transmission of ultrasonic waves and the copper tape layer is sufficiently thick to prevent effective transmission of ultrasonic waves.

At block 1730 of the process 1700, a light-blocking layer, an electrical shielding layer, a mechanical stress isolation layer, or combinations thereof may be bonded to the display, where the electrical shielding layer is electrically conductive and grounded. In some implementations, bonding the light-blocking layer, the electrical shielding layer, and/or the mechanical stress isolation layer includes laminating the light-blocking layer, the electrical shielding layer, and/or the mechanical stress isolation layer to the display. For example, the light-blocking layer, the electrical shielding layer, and/or the mechanical stress isolation layer may be laminated to a back side of the display using roll-to-roll lamination. In some implementations, the light-blocking layer is substantially non-transparent and substantially non-porous. In some implementations, the electrical shielding layer may include a metal or metalized plastic having a thickness between about 0.05 μm and about 10 μm, or between about 0.1 μm and about 6 μm. In some implementations, the mechanical stress isolation layer may include a plastic material. The mechanical stress isolation layer may underlie an adhesive to reduce stresses that may be imparted to one or both of the display and the ultrasonic sensor system.

At block 1740 of the process 1700, an ultrasonic sensor system is bonded to the light-blocking layer, the electrical shielding layer, the mechanical stress isolation layer, or combinations thereof, where the ultrasonic sensor system is underlying the display and configured to transmit and receive ultrasonic waves in an acoustic path through the display and the platen, and where the light-blocking layer, the electrical shielding layer, the mechanical stress isolation layer, or combinations thereof are in the acoustic path. In some implementations, bonding the ultrasonic sensor system includes laminating the ultrasonic sensor to the light-blocking layer, the electrical shielding layer, and/or the mechanical stress isolation layer. For example, the ultrasonic sensor system may be laminated using vacuum lamination.

The ultrasonic sensor system may include a sensor substrate, a piezoelectric transceiver layer coupled to the sensor substrate, a transceiver electrode layer, a passivation layer, and an FPC coupled to the sensor substrate. In some implementations, the ultrasonic sensor system may further include one or more backing layers on the back side of the ultrasonic sensor system, where the one or more backing layers may include an electrically conductive and/or substantially optically non-transparent material.

In some implementations, at least one of the light-blocking layer and the electrical shielding layer may be bonded to the back side of the display so that the ultrasonic sensor system is detachable (e.g., peelable) from the display. Detaching may occur without damaging the ultrasonic sensor system or the display. For example, at least one of the light-blocking layer and the electrical shielding layer may be bonded via an adhesive layer to the back side of the display, where the adhesive layer may include a pressure-sensitive adhesive or an epoxy-based adhesive. In some implementations, the ultrasonic sensor system may be bonded to at least one of the light-blocking layer and the electrical shielding layer so that the ultrasonic sensor system is detachable from the display. Detaching may occur without damaging the ultrasonic sensor system or the display. For example, the ultrasonic sensor system may be bonded via an adhesive layer to at least one of the light-blocking layer and the electrical shielding layer, where the adhesive layer may include a pressure-sensitive adhesive or an epoxy-based adhesive.

Figure 18:
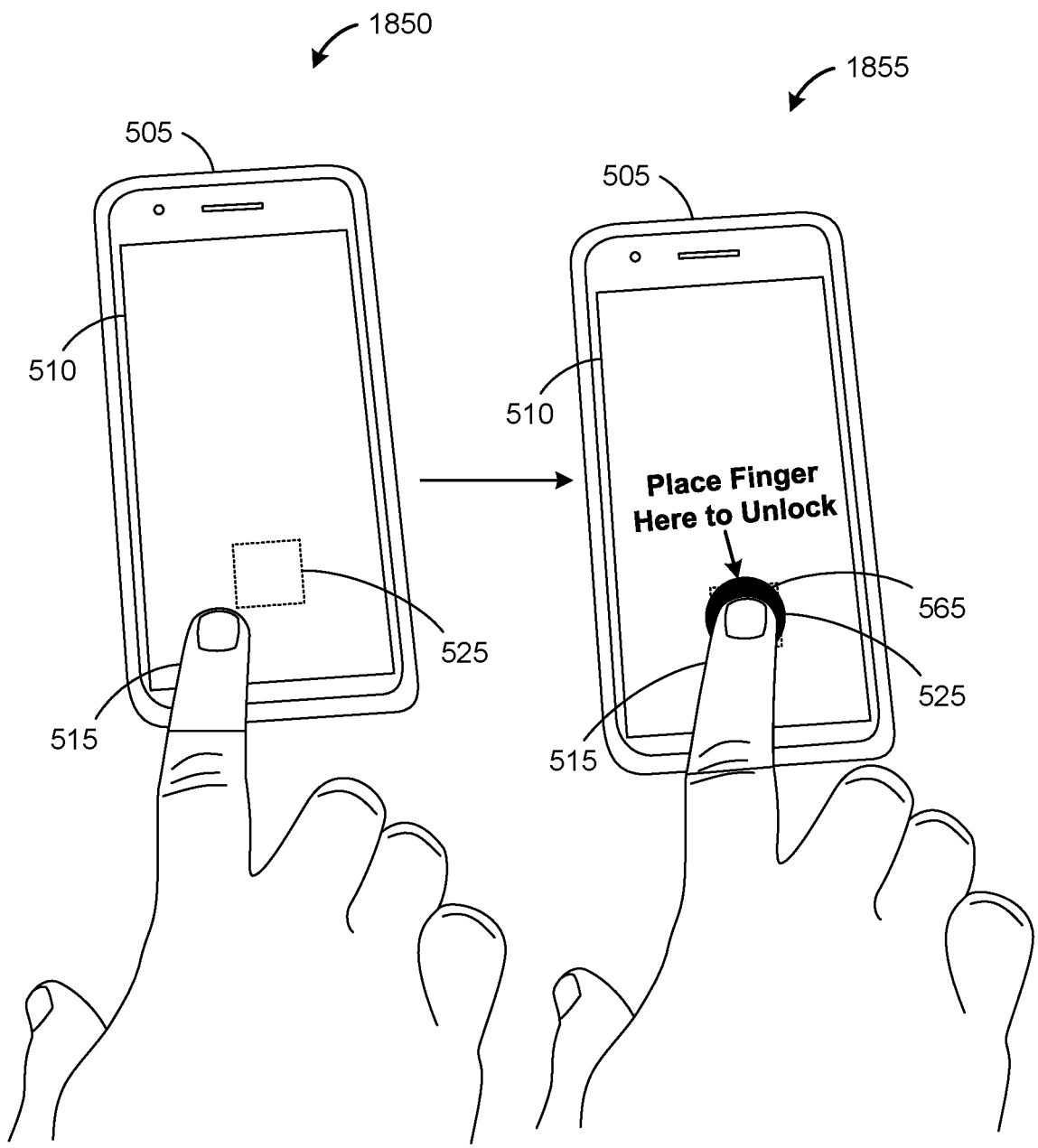
FIG. 18 shows an example of using a capacitive sensing mode and an ultrasonic sensing mode with an ultrasonic fingerprint sensor positioned behind a display of an electronic device to wake up the electronic device.

FIG. 18 shows an example of using a capacitive sensing mode and an ultrasonic sensing mode with a fingerprint sensor 525 positioned behind a display 510 of an electronic device 505 to wake up the electronic device 505. Electronic device 505 may include a controller 214 that may switch sensor 525 to operate between a capacitive sensing mode and an ultrasonic sensing mode. The electronic device 505 may initially be in a locked state in which a display 510 and an applications processor of the electronic device 505 are turned off or in a low-power sleep mode, as illustrated in FIG. 18 at time 1850. When an object such as a finger 515 is detected on or near the sensor 525 using the capacitive sensing mode and/or the ultrasonic sensing mode, a portion of display 510 may turn on to indicate and highlight the position where the fingerprint sensor is located as illustrated in FIG. 18 at time 1855. As depicted in FIG. 18, text indicating "Place Finger Here to Unlock" is shown along with a graphically generated circular icon 565, although many other icons and/or text provided as guidance to a user to indicate the position of the fingerprint sensor have been contemplated. The capacitive and/or ultrasonic sensing modes may continue to be used until the finger 515 is imaged, at which time the image data may be analyzed and the electronic device 505 unlocked if the authentication process is successfully performed. The sensor 525 may be positioned underneath a portion of the display 510, which may be an LCD display, an OLED display or other type of display. In some implementations, one or more electrodes of a touchscreen of electronic device 505 may serve as a sensing electrode for the fingerprint sensor 525 when operating in a capacitive sensing mode, allowing signals from non-active portions of the display 510 without the fingerprint sensor 525 to be ignored by the controller circuit 520 while allowing signals due to a finger touch from active portions of the display 510 with the fingerprint sensor 525 to be detected, further reducing inadvertent wakeup of the electronic device 505.

Figure 19:
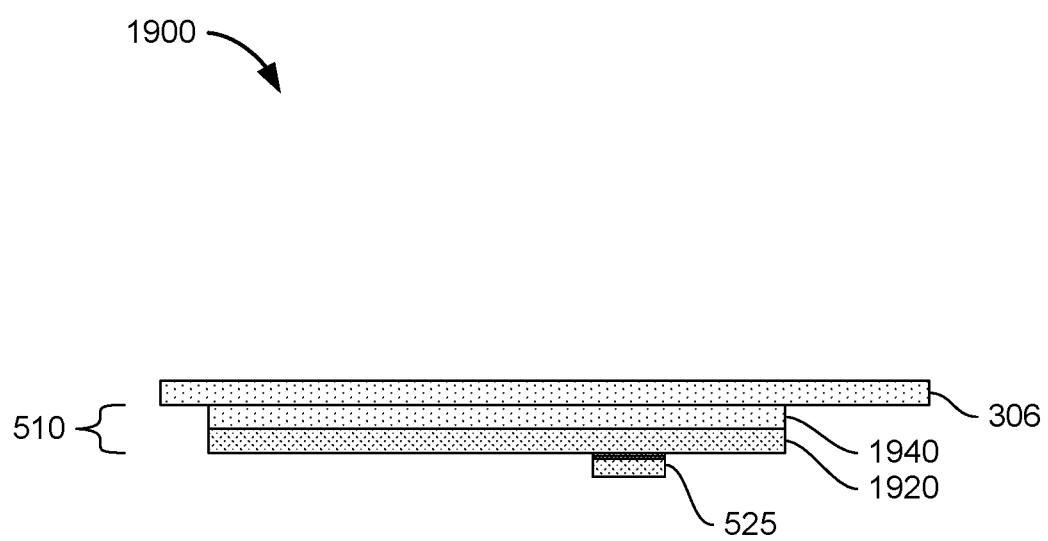
FIG. 19 shows a cross-sectional side view schematic of a configuration with an ultrasonic fingerprint sensor positioned behind a display of a mobile device.

FIG. 19 shows a side view of a configuration 1900 with a fingerprint sensor 525 positioned behind a portion of a display 510. The fingerprint sensor 525 is positioned beneath an LCD or OLED display 510 and a cover glass or touchscreen that serves as a platen 306 for the sensor 525. The sensor 525 and associated sensing electrodes may be configured to operate in a capacitive sensing mode or an ultrasonic sensing mode. In some implementations, the sensor 525 may be located near the top, bottom, edge or in somewhere in an interior portion of the display, which may include a TFT substrate layer 1920 and other layers 1940 of an LCD or OLED display. In other examples, the sensor 525 may be positioned beneath or behind all of display 510. In other examples, the sensor 525 may be integrated within the display TFT substrate layer 1920. The sensor 525 may be integrated with the display TFT substrate, sharing common TFT substrates with the active area of the sensor 525 covering some, none or all of the active area of the display.

Figure 20:
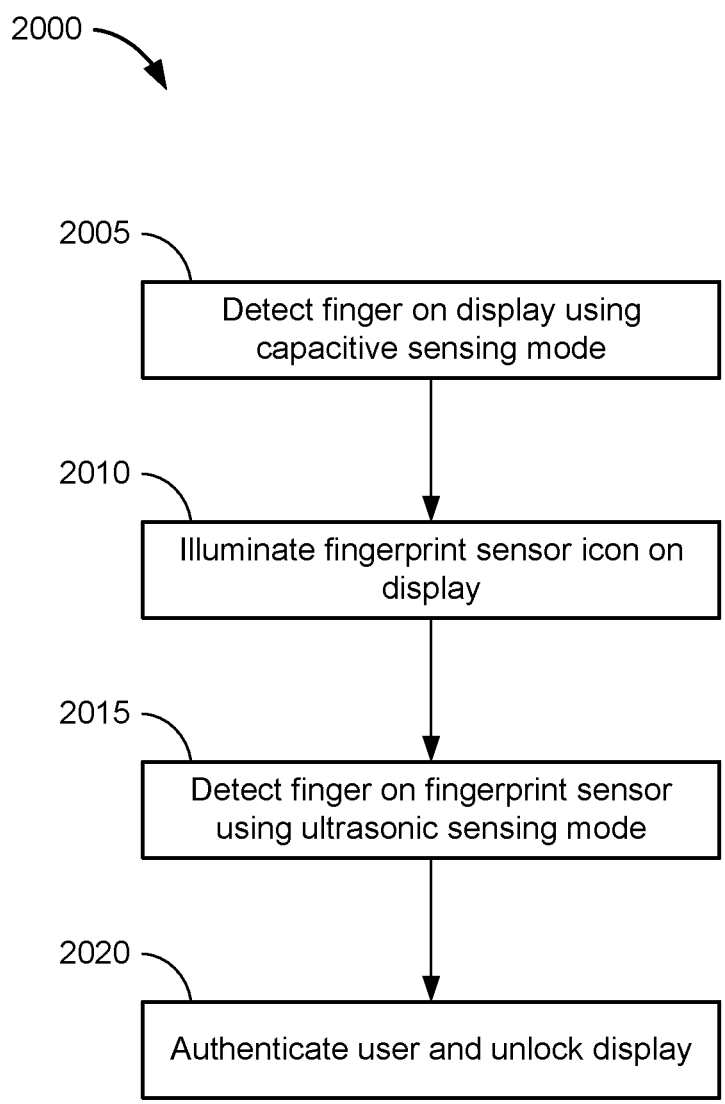
FIG. 20 shows an example of a flowchart for a method of guiding a user of an LCD or OLED display device to position a finger above an under-LCD or under-OLED fingerprint sensor.

FIG. 20 shows an example of a flowchart for a method 2000 of guiding a user of an LCD or OLED display device to position a finger above an under-LCD or under-OLED fingerprint sensor. Graphical display-based icons may be helpful for under-display configurations as use of colored inks or other permanent indicia to mark the position of the fingerprint sensor that may occlude the view of a user of the display device (e.g., a mobile device or an electronic device) can be avoided. In some implementations, the presence of a finger may be detected by capacitive sensing electrodes of a touchscreen overlying the display while the display is off. In some implementations, dedicated sensing electrodes as part of or near the ultrasonic fingerprint sensor may be used to detect the presence of a finger. In block 2005, a finger of a user positioned on a surface of the display may be detected using a capacitive sensing mode with, for example, the touchscreen or a dedicated sensing electrode. In block 2010, after detecting the presence of the finger, a fingerprint sensor icon may be illuminated on the display. In some implementations, the display may be partially unlocked to display only the fingerprint sensor icon or other selective information to guide the user. In some implementations, a portion of the display may be illuminated while in a low-power mode, and the icon may be enhanced or other selective information provided to the user when the finger is detected. In block 2015, a finger may be detected on the display above the fingerprint sensor using a capacitive sensing mode, an ultrasonic sensing mode, or both a capacitive and ultrasonic sensing mode. In block 2020, the user may be authenticated and the display unlocked. In alternative configurations such as use of an OLED screen, the display may continuously show the fingerprint sensor icon or other selective information using a subset of the display pixels to guide the user while the mobile device remains locked.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally in terms of functionality and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor or any conventional processor, controller, microcontroller or state machine. A processor may be implemented as a combination of computing devices, e.g., a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, the structures disclosed in this specification and their structural equivalents thereof, or in any combination thereof. Implementations of the subject matter described in this specification may be implemented as one or more computer programs, i.e., one or more modules of computer program instructions, encoded on a computer storage media for execution by, or to control the operation of, data processing apparatus.

If implemented in software, the functions may be stored on or transmitted over as one or more instructions or code on a computer-readable medium, such as a non-transitory medium. The processes of a method or algorithm disclosed herein may be implemented in a processor-executable software module that may reside on a computer-readable medium. Computer-readable media include both computer storage media and communication media including any medium that may be enabled to transfer a computer program from one place to another. Storage media may be any available media that may be accessed by a computer. By way of example and not limitation, non-transitory media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection may be properly termed a computer-readable medium. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those having ordinary skill in the art, and the generic principles defined herein may be applied to other implementations without departing from the spirit or scope of this disclosure. Thus, the disclosure is not intended to be limited to the implementations shown herein, but is to be accorded the widest scope consistent with the claims, the principles and the novel features disclosed herein. The word "exemplary" is used exclusively herein, if at all, to mean "serving as an example, instance or illustration." Any implementation described herein as "exemplary" is not necessarily to be construed as preferred or advantageous over other implementations.

Certain features that are described in this specification in the context of separate implementations may also be implemented in combination in a single implementation. Conversely, various features that are described in the context of a single implementation may also be implemented in multiple implementations separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems may generally be integrated together in a single software product or packaged into multiple software products. Additionally, other implementations are within the scope of the following claims. In some cases, the actions recited in the claims may be performed in a different order and still achieve desirable results.

It will be understood that unless features in any of the particular described implementations are expressly identified as incompatible with one another or the surrounding context implies that they are mutually exclusive and not readily combinable in a complementary and/or supportive sense, the totality of this disclosure contemplates and envisions that specific features of those complementary implementations may be selectively combined to provide one or more comprehensive, but slightly different, technical solutions. It will therefore be further appreciated that the above description has been given by way of example only and that modifications in detail may be made within the scope of this disclosure.

What is claimed is:

1. An apparatus comprising:
   a display;
   an ultrasonic sensor system underlying the display and configured to transmit and receiving ultrasonic waves in an acoustic path through the display;
   an electrical shielding layer between the ultrasonic sensor system and the display; and
   a light-blocking layer between the display and the electrical shielding layer, wherein the light-blocking layer comprises an opaque plastic material, wherein each of the electrical shielding layer and the light-blocking layer is non-porous or substantially non-porous.

2. The apparatus of claim 1, wherein the electrical shielding layer is electrically conductive and grounded, the electrical shielding layer positioned in the acoustic path.

3. The apparatus of claim 2, wherein the electrical shielding layer includes a metal or metalized plastic having a thickness between about 0.1 µm and about 9 µm.

4. The apparatus of claim 1, wherein the display is an organic light-emitting diode (OLED) display.

5. The apparatus of claim 4, wherein the display is a flexible OLED display formed on a plastic substrate.

6. The apparatus of claim 1, further comprising:
   an adhesive layer between the ultrasonic sensor system and the display, wherein the adhesive layer includes a pressure-sensitive adhesive.

7. The apparatus of claim 1, further comprising:
   an adhesive layer between the ultrasonic sensor system and the display, wherein the adhesive layer includes an epoxy-based adhesive, the epoxy-based adhesive including a thermoplastic ink.

8. The apparatus of claim 1, further comprising:
   a mechanical stress isolation layer between the ultrasonic sensor system and the display, wherein the mechanical stress isolation layer resides between the adhesive layer and the ultrasonic sensor system and includes a plastic material.

9. The apparatus of claim 1, wherein the ultrasonic sensor system includes:
   a sensor substrate having a plurality of sensor pixel circuits disposed thereon;
   a piezoelectric transceiver layer coupled to the sensor substrate and including a piezoelectric material configured to generate the ultrasonic waves; and
   the electrode layer coupled to the piezoelectric transceiver layer.

10. The apparatus of claim 9, wherein the piezoelectric transceiver layer is underlying the sensor substrate and the electrode layer is underlying the piezoelectric transceiver layer.

11. The apparatus of claim 9, wherein the piezoelectric transceiver layer is underlying the electrode layer and the sensor substrate is underlying the piezoelectric transceiver layer.

12. The apparatus of claim 9, wherein the piezoelectric transceiver layer includes polyvinylidene fluoride (PVDF), polyvinylidene fluoride trifluoroethylene (PVDF-TrFE) copolymer, lead zirconate titanate (PZT), aluminum nitride (AlN), or composites thereof.

13. The apparatus of claim 9, wherein the sensor substrate comprises a material selected from the group consisting of: glass, plastic, silicon, and stainless steel.

* * * * *